United States Patent
Shirakashi et al.

(10) Patent No.: US 7,655,118 B2
(45) Date of Patent: Feb. 2, 2010

(54) ELECTROLYTIC PROCESSING APPARATUS AND METHOD

(75) Inventors: Mitsuhiko Shirakashi, Tokyo (JP);
Masayuki Kumekawa, Tokyo (JP);
Hozumi Yasuda, Tokyo (JP); Itsuki Kobata, Tokyo (JP); Osamu Nabeya, Tokyo (JP)

(73) Assignee: Ebara Corporation, Tokyo (JP)

( * ) Notice: Subject to any disclaimer, the term of this patent is extended or adjusted under 35 U.S.C. 154(b) by 814 days.

(21) Appl. No.: 10/485,204

(22) PCT Filed: Jan. 31, 2003

(86) PCT No.: PCT/JP03/01011

§ 371 (c)(1),
(2), (4) Date: Nov. 8, 2004

(87) PCT Pub. No.: WO03/064734

PCT Pub. Date: Aug. 7, 2003

(65) Prior Publication Data

US 2005/0121328 A1      Jun. 9, 2005

(30) Foreign Application Priority Data

| Jan. 31, 2002 | (JP) | ............................. 2002-022734 |
| Apr. 15, 2002 | (JP) | ............................. 2002-112487 |
| May 17, 2002 | (JP) | ............................. 2002-142411 |
| Jun. 12, 2002 | (JP) | ............................. 2002-172092 |
| Jul. 2, 2002 | (JP) | ............................. 2002-193776 |

(51) Int. Cl.
*C25F 3/16* (2006.01)
*C25F 7/00* (2006.01)
(52) U.S. Cl. ...................... 204/230.2; 205/640; 205/96
(58) Field of Classification Search .................. 205/640, 205/96; 204/230.2
See application file for complete search history.

(56) References Cited

U.S. PATENT DOCUMENTS 6,368,493 B1 * 4/2002 Mori et al. .................. 205/672

(Continued)

FOREIGN PATENT DOCUMENTS

| EP | 1079003 | 2/2001 |
| EP | 1139400 | 10/2001 |
| JP | 10-58236 | 3/1998 |
| JP | 2000-167714 | 6/2000 |
| JP | 2001-64799 | 3/2001 |

(Continued)

OTHER PUBLICATIONS

Co-pending U.S. Appl. No. 10/669,468, entitled "*Electrolytic Processing Apparatus and Electrolytic Processing Method*".
European Office Action issued Dec. 8, 2008 in the corresponding European application.

*Primary Examiner*—Harry D. Wilkins, III
*Assistant Examiner*—Nicholas A. Smith
(74) *Attorney, Agent, or Firm*—Wenderoth, Lind & Ponack, L.L.P.

(57) ABSTRACT

This invention relates to an electrolytic processing apparatus and method useful for processing a conductive material formed in the surface of a substrate, or for removing impurities adhering to the surface of a substrate. An electrolytic processing apparatus, including, a processing electrode that can come close to a workpiece, a feeding electrode for feeding electricity to the workpiece, an ion exchanger disposed in the space between the workpiece and the processing and feeding electrodes, a fluid supply section for supplying a fluid between the workpiece and the ion exchanger, and a power source. The processing electrode and/or the feeding electrode is electrically divided into a plurality of parts, and the power source applies a voltage to each of the divided electrode parts and can control voltage and/or electric current independently for each of the divided electrode parts.

13 Claims, 40 Drawing Sheets

U.S. PATENT DOCUMENTS

| | | | |
|---|---|---|---|
| 6,391,166 B1 * | 5/2002 | Wang | 204/224 R |
| 6,440,295 B1 | 8/2002 | Wang | |
| 6,602,396 B2 * | 8/2003 | Mori et al. | 205/652 |
| 6,722,950 B1 | 4/2004 | Dabral et al. | |
| 6,743,349 B2 * | 6/2004 | Mori et al. | 205/652 |
| 6,875,335 B2 * | 4/2005 | Mori et al. | 205/652 |
| 7,101,465 B2 * | 9/2006 | Kobata et al. | 204/198 |
| 7,208,076 B2 * | 4/2007 | Kobata et al. | 205/652 |
| 7,255,778 B2 * | 8/2007 | Mori et al. | 204/224 M |
| 7,427,345 B2 * | 9/2008 | Saito et al. | 205/652 |
| 2001/0037943 A1 | 11/2001 | Park et al. | |
| 2003/0132103 A1 | 7/2003 | Kobata et al. | |
| 2003/0136668 A1 | 7/2003 | Kobata et al. | |

FOREIGN PATENT DOCUMENTS

| | | |
|---|---|---|
| JP | 2001-77117 | 3/2001 |
| WO | 96/20061 | 7/1996 |
| WO | 02/103771 | 12/2002 |
| WO | 03/054255 | 7/2003 |

* cited by examiner

F I G. 2
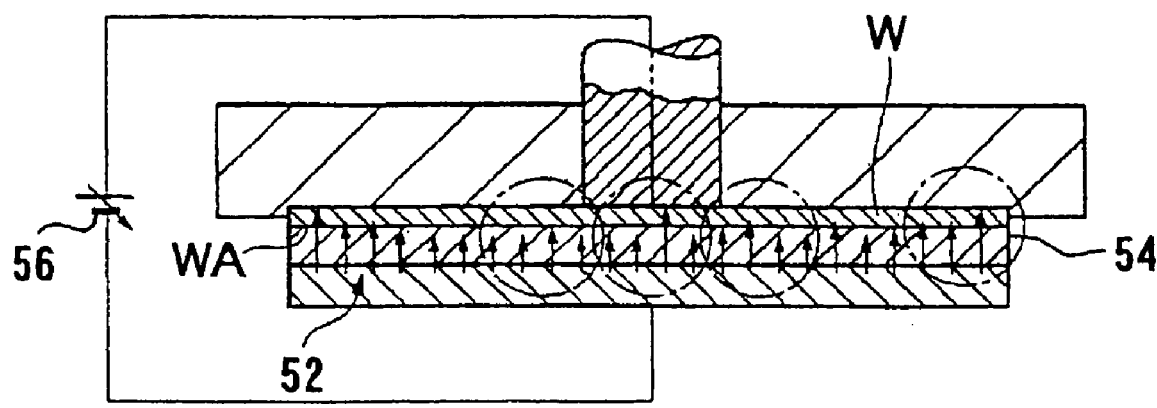

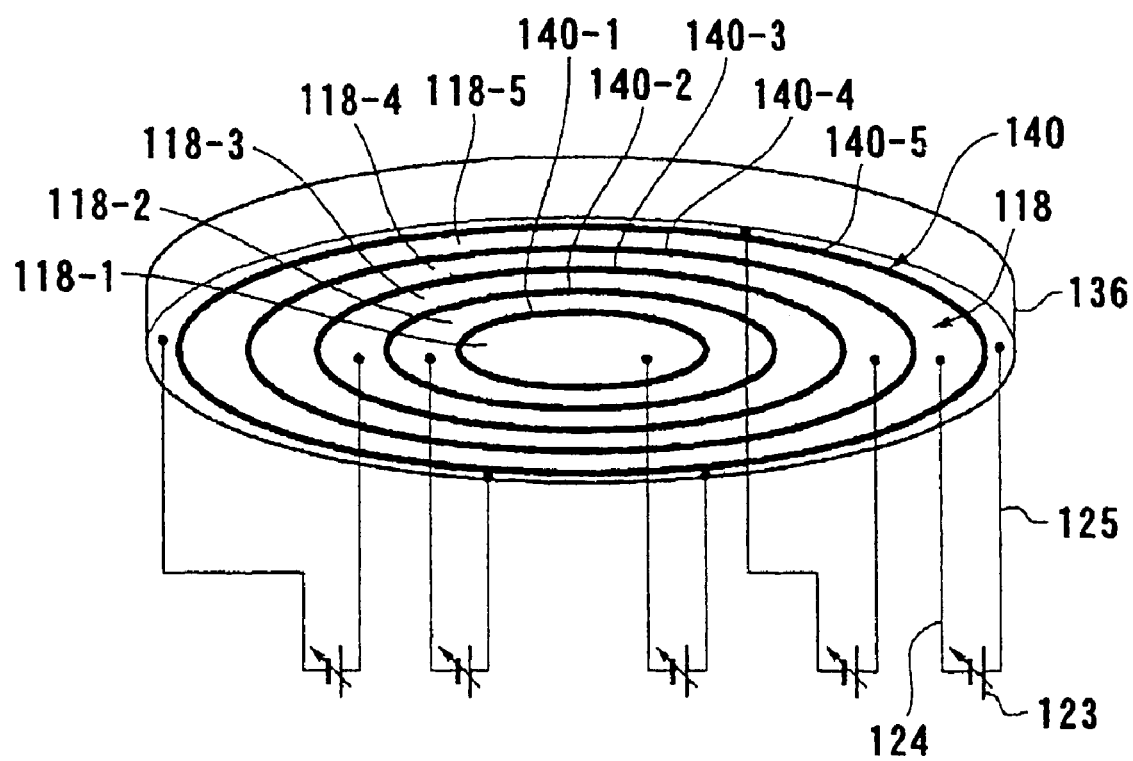
F I G. 1 2

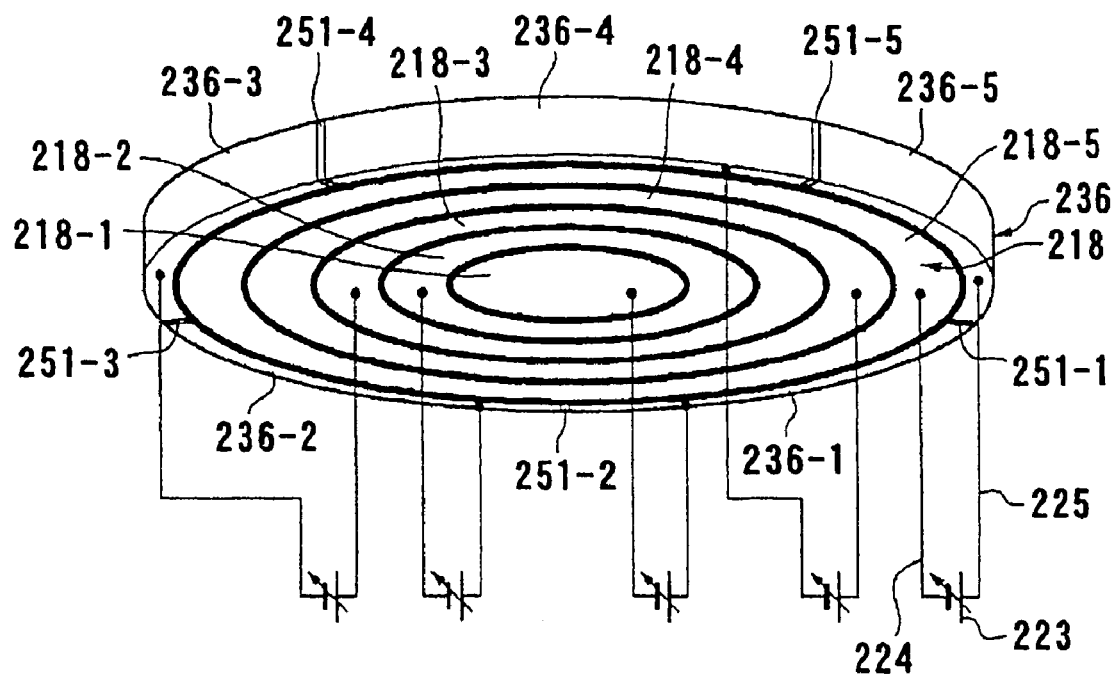
F I G. 14

F I G. 1 6
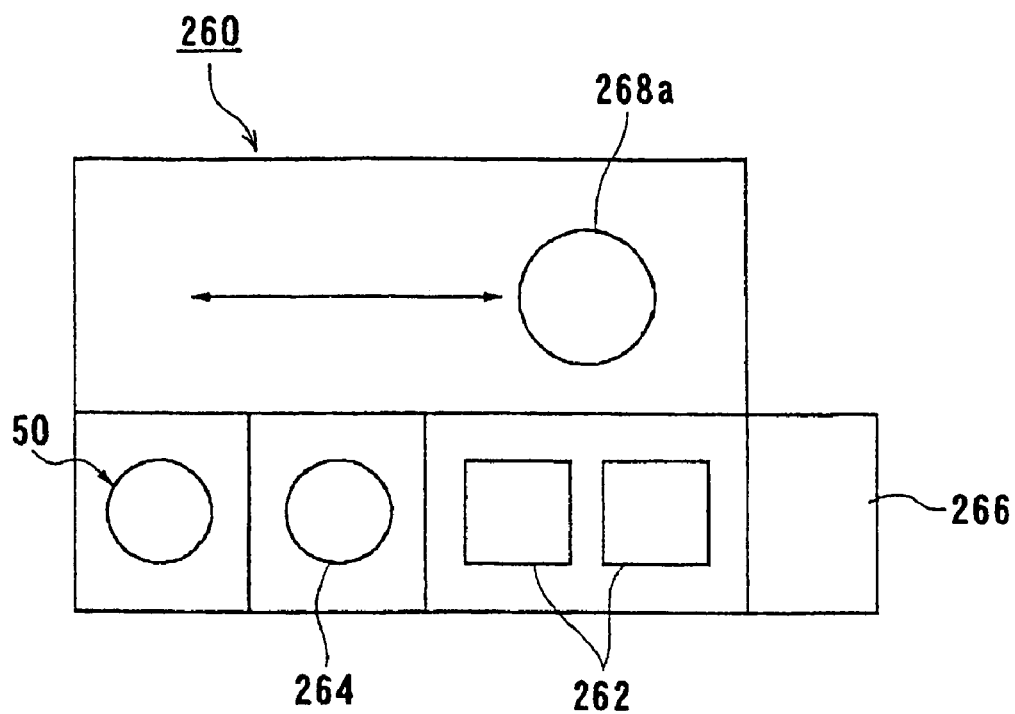

F I G. 21A
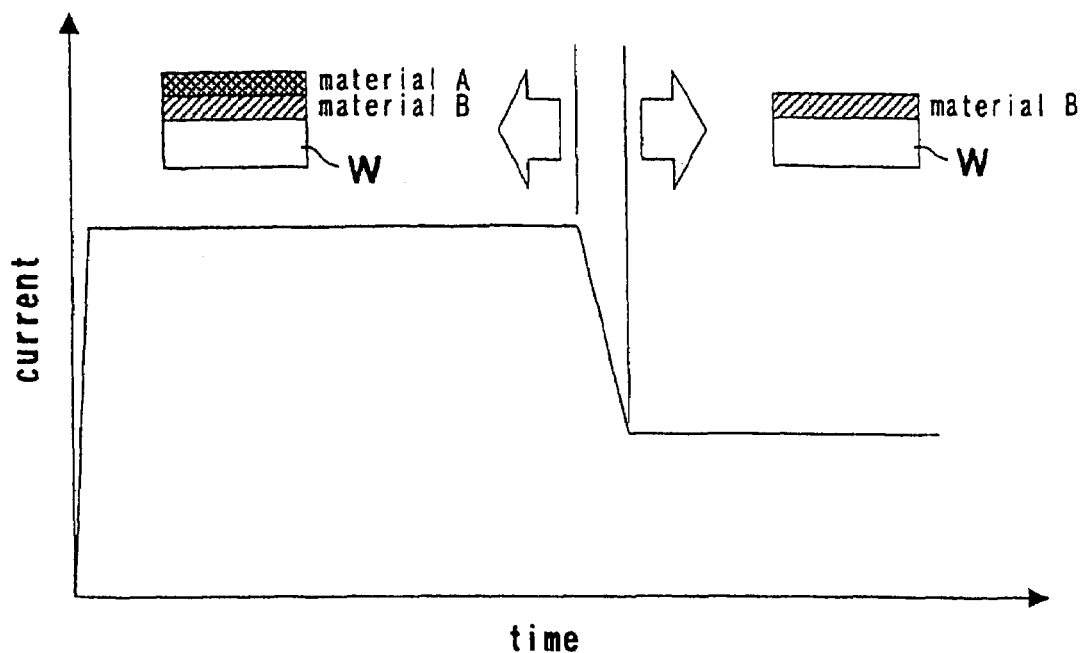
F I G. 21B
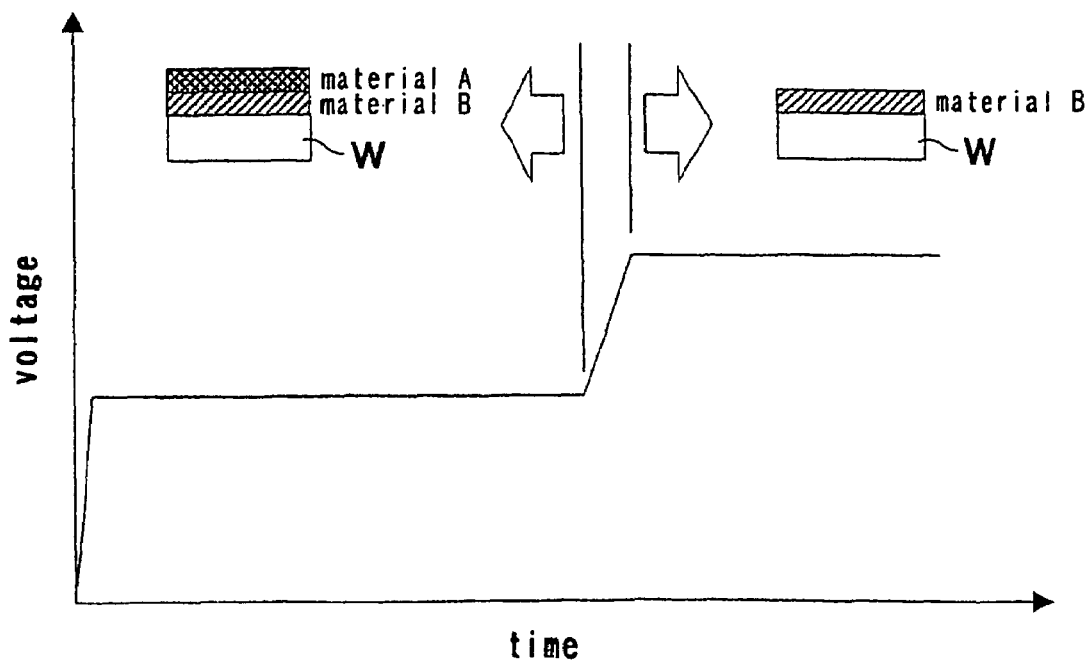

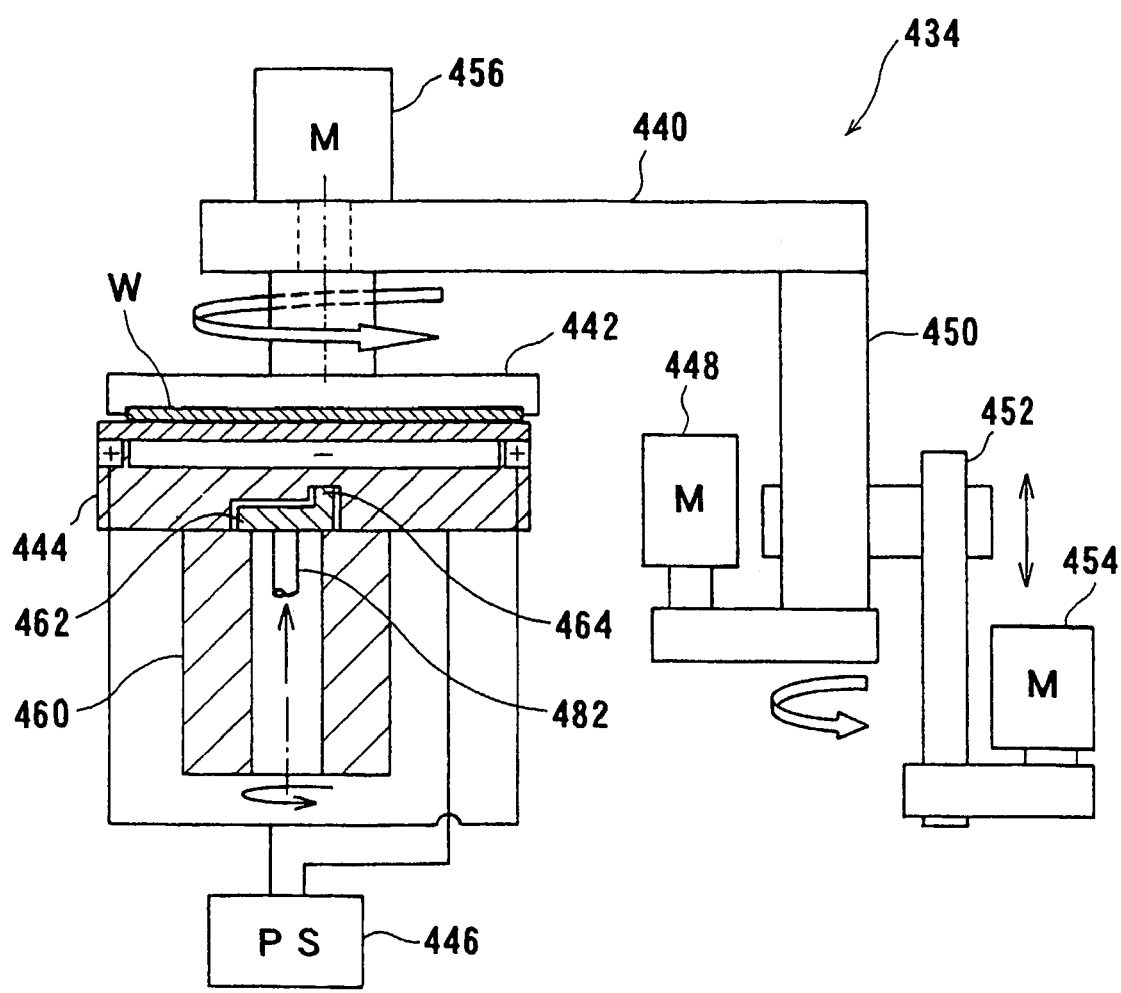
F I G. 24

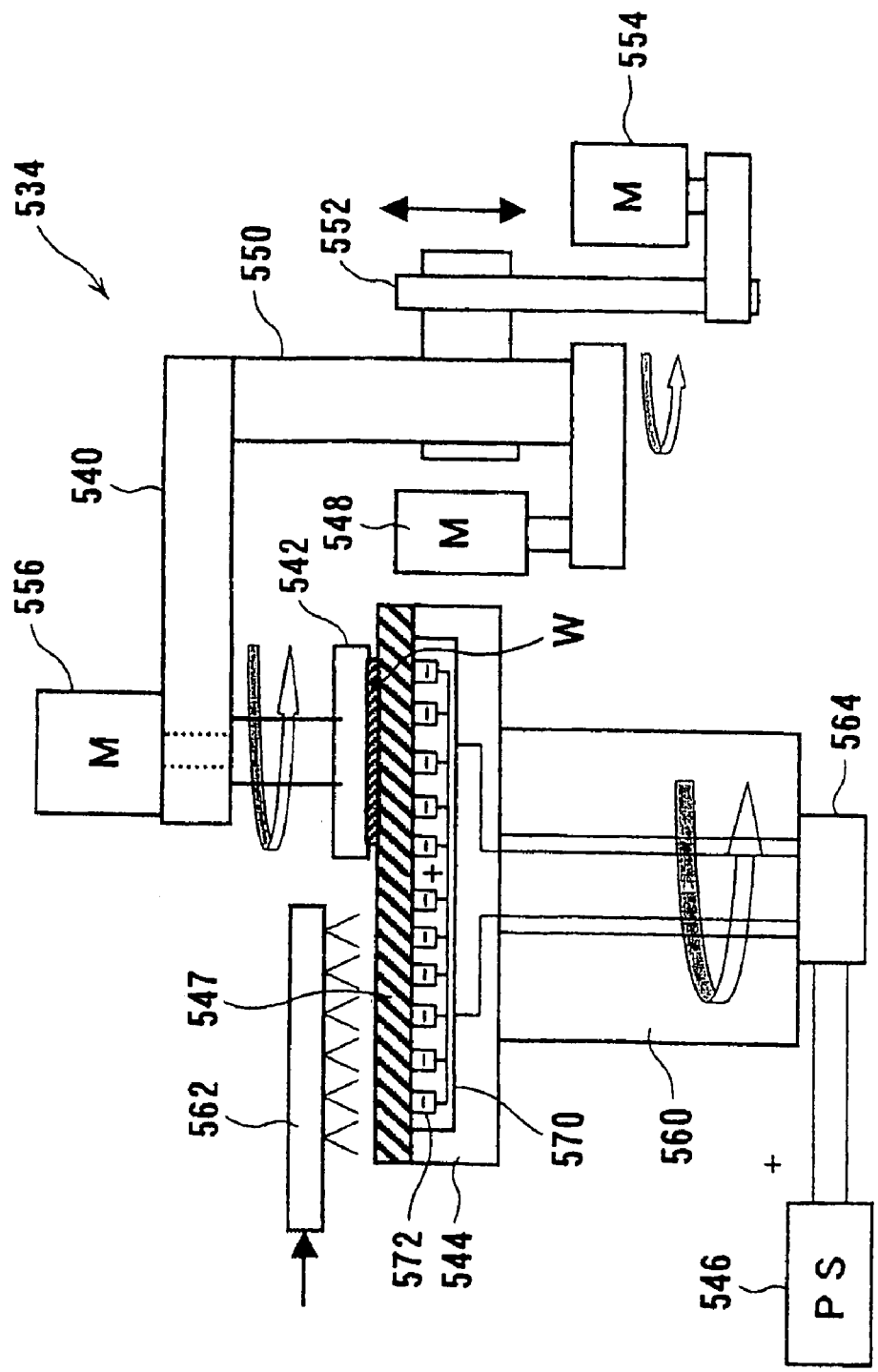

F I G. 3 2
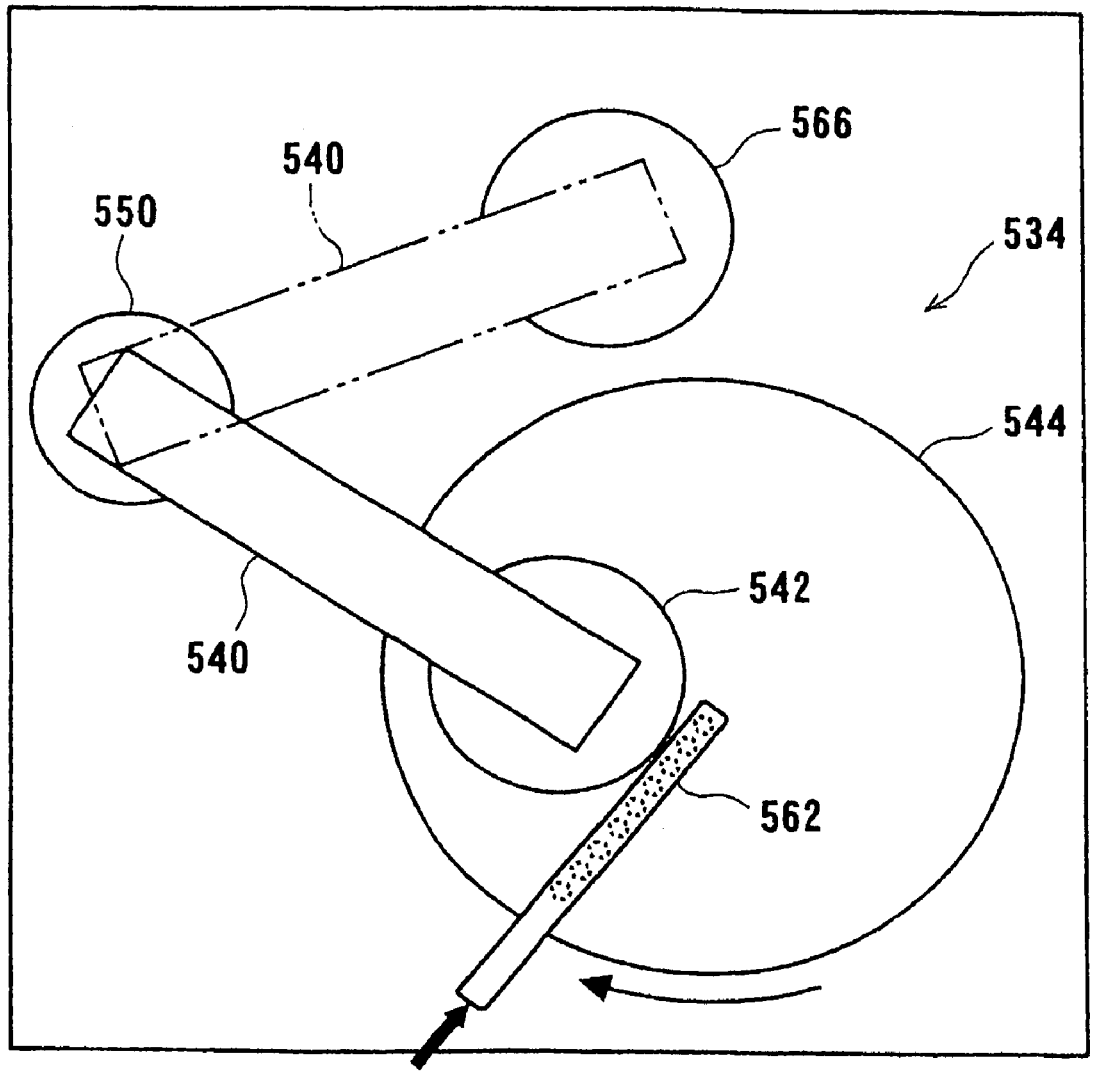

F I G. 33
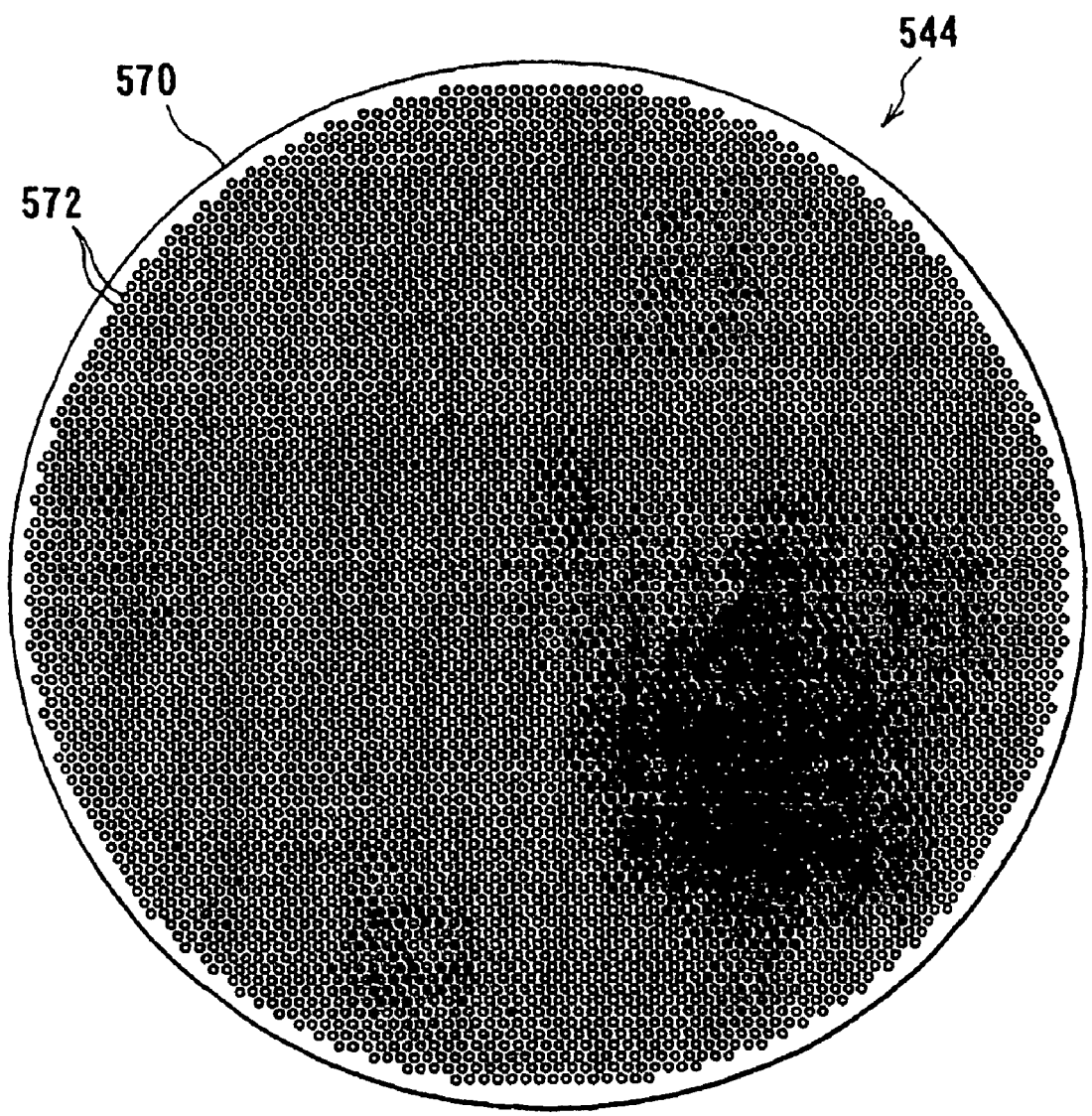

F I G. 3 5
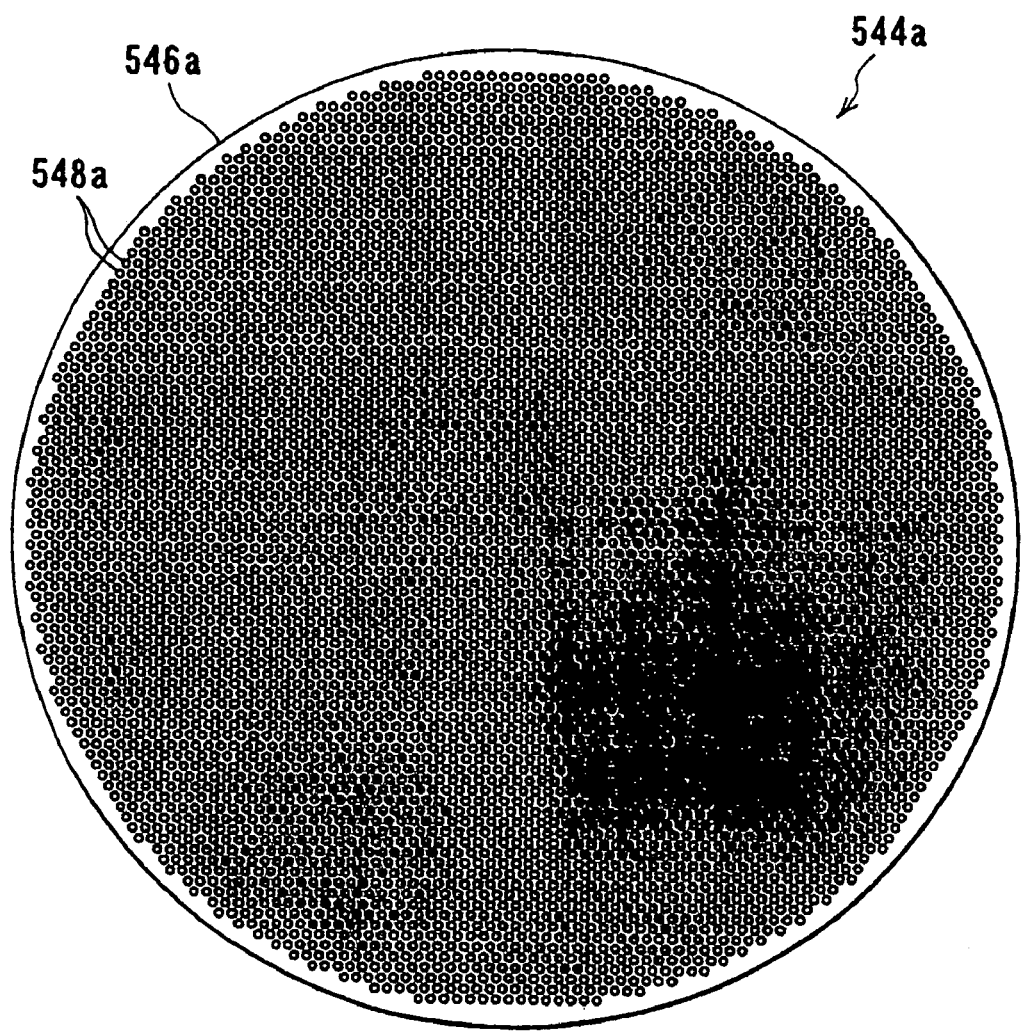

F I G. 37
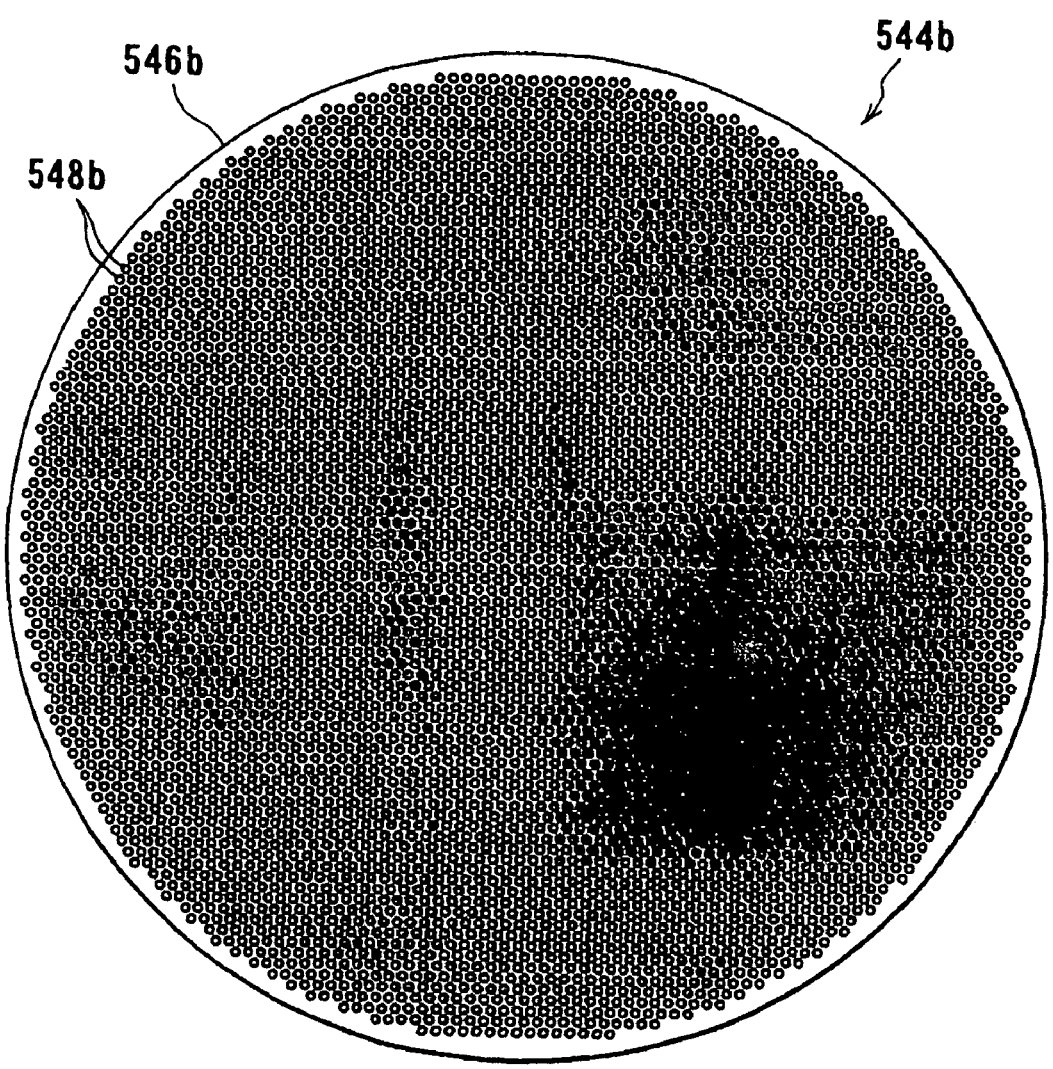

F I G. 3 8
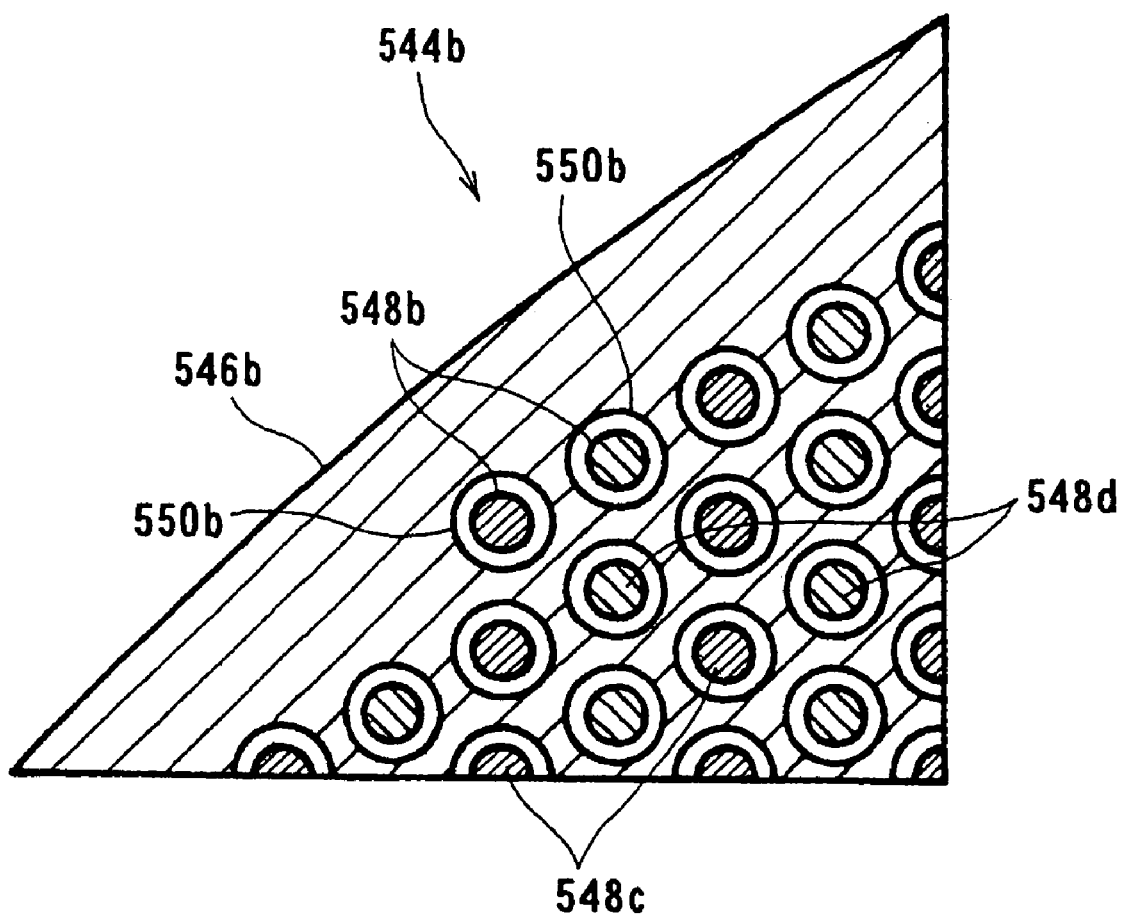

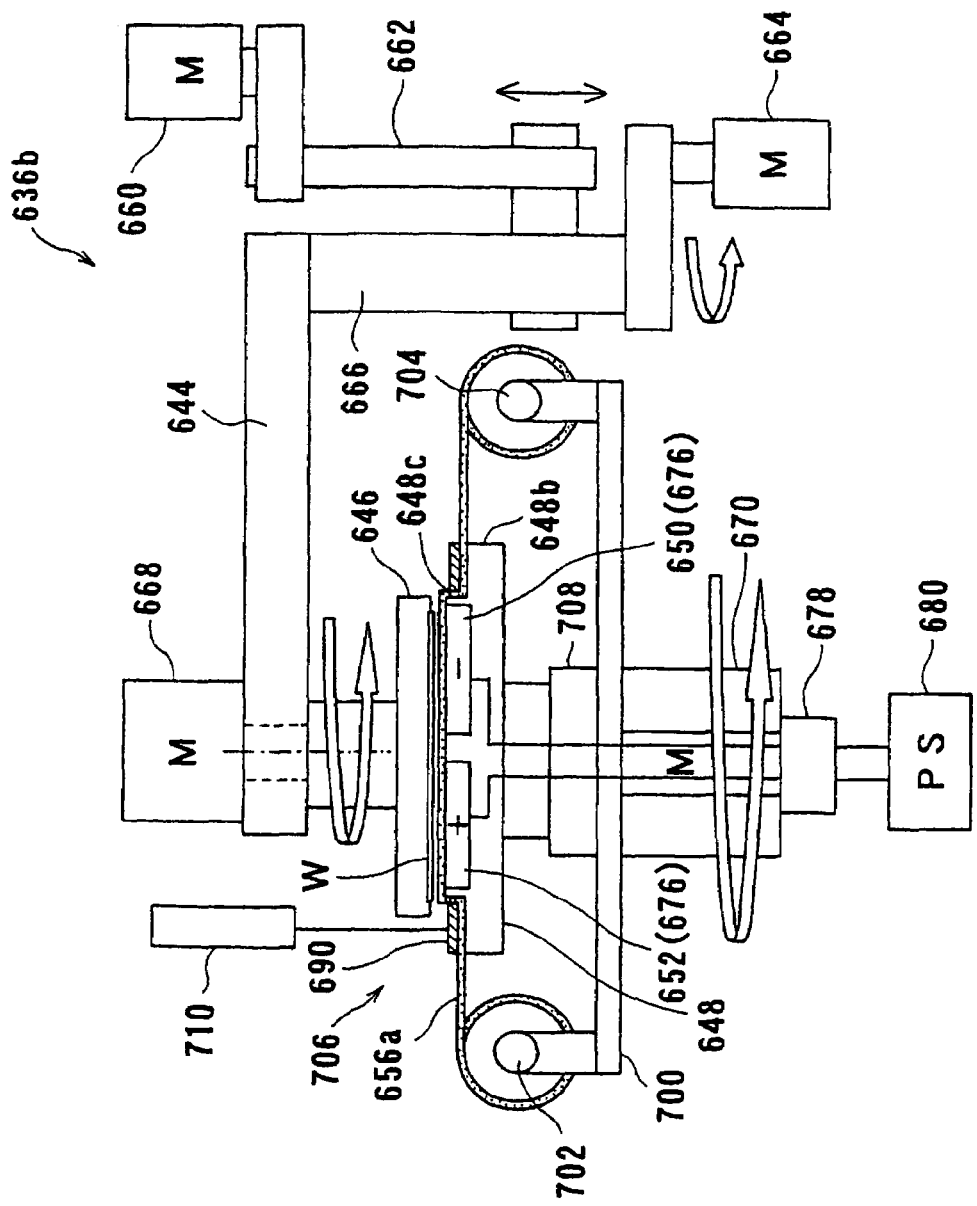

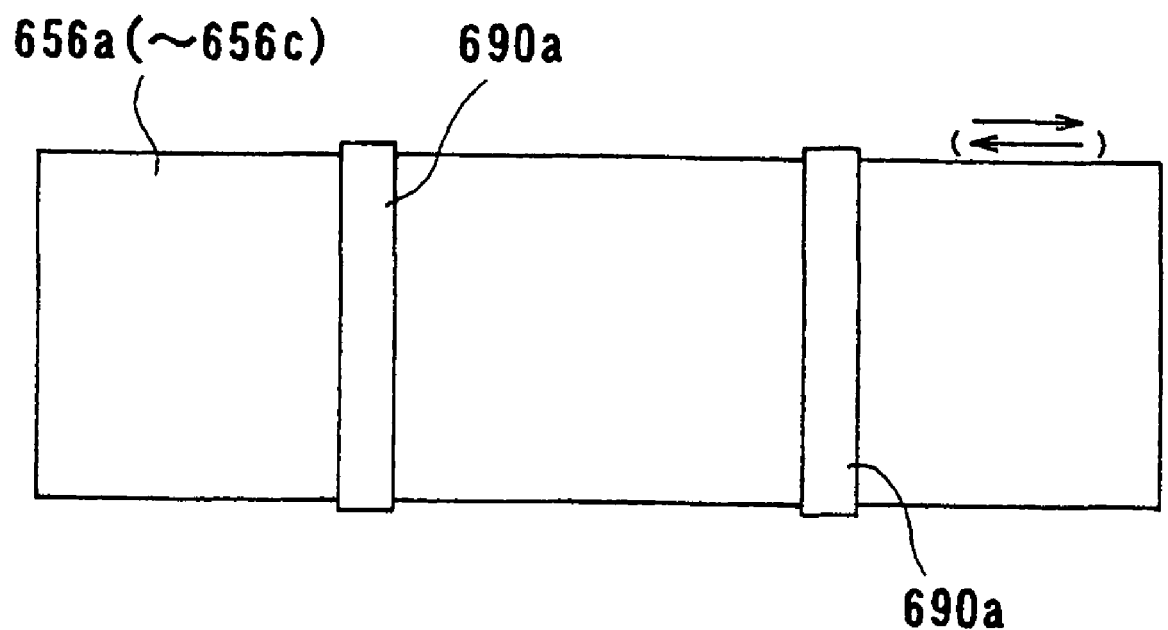
F I G. 49

ELECTROLYTIC PROCESSING APPARATUS AND METHOD

TECHNICAL FIELD

This invention relates to an electrolytic processing apparatus and method, and more particularly to an electrolytic processing apparatus and method useful for processing a conductive material formed in the surface of a substrate, especially a semiconductor wafer, or for removing impurities adhering to the surface of a substrate.

The present invention also relates to a fixing method and structure for an ion exchanger for use in electrolytic processing for processing a conductive material in the surface of a substrate, such as a semiconductor wafer, or removing impurities adhering to the surface of the substrate, and further relates to an electrolytic processing apparatus which is provided with the ion exchanger-fixing structure.

BACKGROUND ART

In recent years, instead of using aluminum or aluminum alloys as a material for forming interconnection circuits on a substrate such as a semiconductor wafer, there is an eminent movement towards using copper (Cu) which has a low electric resistivity and high electromigration resistance. Copper interconnects are generally formed by filling copper into fine recesses formed in the surface of a substrate. There are known various techniques for forming such copper interconnects, including CVD, sputtering, and plating. According to any such technique, a copper film is formed in the substantially entire surface of a substrate, followed by removal of unnecessary copper by chemical mechanical polishing (CMP).

FIGS. 1A through 1C illustrate, in sequence of process steps, an example of forming such a substrate W having copper interconnects. As shown in FIG. 1A, an insulating film 2, such as an oxide film of $SiO_2$ or a film of low-k material, is deposited on a conductive layer 1a in which semiconductor devices are formed, which is formed on a semiconductor base 1. Contact holes 3 and trenches 4 for interconnects are formed in the insulating film 2 by the lithography/etching technique. Thereafter, a barrier layer 5 of TaN or the like is formed on the entire surface, and a seed layer 7 as an electric supply layer for electroplating is formed on the barrier layer 5.

Then, as shown in FIG. 1B, copper plating is performed onto the surface of the substrate W to fill the contact holes 3 and the trenches 4 with copper and, at the same time, deposit a copper film 6 on the insulating film 2. Thereafter, the copper film 6 and the barrier layer 5 on the insulating film 2 are removed by chemical mechanical polishing (CMP) so as to make the surface of the copper film 6 filled in the contact holes 3 and the trenches 4 for interconnects and the surface of the insulating film 2 lie substantially on the same plane. An interconnection composed of the copper film 6 as shown in FIG. 1C is thus formed.

Components in various types of equipments have recently become finer and have required higher accuracy. As sub-micro manufacturing technology has commonly been used, the properties of materials are largely influenced by the processing method. Under these circumstances, in such a conventional machining method that a desired portion in a workpiece is physically destroyed and removed from the surface thereof by a tool, a large number of defects may be produced to deteriorate the properties of the workpiece. Therefore, it becomes important to perform processing without deteriorating the properties of the materials.

Some processing methods, such as chemical polishing, electrolytic processing, and electrolytic polishing, have been developed in order to solve this problem. In contrast with the conventional physical processing, these methods perform removal processing or the like through chemical dissolution reaction. Therefore, these methods do not suffer from defects, such as formation of an altered layer and dislocation, due to plastic deformation, so that processing can be performed without deteriorating the properties of the materials.

An electrolytic processing method that utilizes an ion exchanger has been developed. According to this method, an ion exchanger mounted on a processing electrode and an ion exchanger mounted on a feeding electrode are allowed to be close to or into contact with the surface of a workpiece. A voltage is applied from a power source to between the processing electrode and the feeding electrode while a liquid, such as ultrapure water, is supplied from a fluid supply section to between the processing and feeding electrodes and the workpiece, thereby carrying out removal processing of the surface layer of the workpiece.

FIG. 2 schematically shows a conventional electrolytic processing apparatus generally employed for such electrolytic processing. The electrolytic processing apparatus includes a processing electrode 52 and an ion exchanger 54 that is mounted on the processing electrode 52. Depending upon the material of a workpiece W, the processing electrode 52 is connected to the cathode or the anode of a power source 56, and the workpiece W is connected to the opposite pole, and the workpiece W is utilized as a feeding electrode. FIG. 2 shows the case where the processing electrode 52 is connected to the cathode of the power source 56 and the workpiece W is connected to the anode of the power source 56. The processing electrode 52 concentrates e.g. $OH^-$ ions, in an electrolytic solution capable of dissolving the atoms of the to-be-processed surface WA of the workpiece W, at the to-be-processed surface WA closed to the processing electrode 52 to cause a reaction between the atoms of the workpiece W and $OH^-$ ions, thereby processing the workpiece W. In the case of a semiconductor substrate W, a film of a conductive material formed in the substrate surface WA is removed by the processing electrode 52 in order to form semiconductor interconnects or contacts.

According to the conventional electrolytic processing apparatus, an ion exchanger for use in such electrolytic processing is tight on the exposed surface of a processing electrode or a feeding electrode, and is fixed on the electrode or at a peripheral portion of e.g. a support that supports the electrode, usually by screwing or using an adhesive tape or the like at a peripheral portion of the ion exchanger.

In recent years, as interconnects of the circuit to be formed in a semiconductor substrate has become finer with higher integrated density of the semiconductor device, it is desired to improve the flatness of the processed surface of the semiconductor substrate. Therefore, there is a demand for a technique that can improve the uniformity of the processing rate over the entire to-be processed surface.

Metals of the platinum group or their oxides have become candidates for an electrode material for use in forming a capacitor, which utilizes a high dielectric material, on a semiconductor substrate. Among them ruthenium, because of its good film-forming properties and good processibility for patterning, is being progressively studied as a feasible material.

A ruthenium film can be formed on a substrate generally by sputtering or CVD. In either method, deposition of the ruthenium film on the entire front surface of a substrate, including the peripheral region, is carried out. As a result, a ruthenium film is formed also in the peripheral region of the substrate and, in addition, the back surface of the substrate is unavoidably contaminated with ruthenium.

The ruthenium film formed on or adhering to the peripheral region or back surface of a substrate, i.e. the non-circuit region of the substrate, is not only unnecessary, but can also cause cross-contamination during later transfer, storage and various processing steps of the substrate whereby, for instance, the performance of a dielectric material can be lowered. Accordingly, during the process for forming a ruthenium film or after carrying out some treatments of the formed ruthenium film, it is necessary to completely remove the unnecessary ruthenium film. Further, in the case of using ruthenium as an electrode material for forming a capacitor, a step for removing part of a ruthenium film formed on the circuit region of a substrate is needed.

According to the conventional electrolytic processing apparatus as shown in FIG. 2, however, because of unevenness of the electric current value due to the shape of the processing electrode 52 or to the influence of the reaction products or gas bubbles generated during processing, the processing rate is likely to be uneven in the to-be-processed surface WA.

On the other hand, chemical mechanical polishing (CMP), for example, generally necessitates a complicated operation and control, and needs a considerably long processing time. In addition, a sufficient cleaning of a substrate must be conducted after the polishing treatment. This also imposes a considerable load on the slurry or cleaning liquid waste disposal. Accordingly, there is a strong demand for omitting CMP entirely or reducing a load upon CMP. Also in this connection, it is to be pointed out that though a low-k material, which has a low dielectric constant, is expected to be predominantly used in the future as a material for the insulating film of a semiconductor substrate, the low-k material has a low mechanical strength and therefore is hard to endure the stress applied during CMP processing. Thus, also from this standpoint, there is a demand for a technique that enables the flattening of a substrate without giving any stress thereto.

Further, a method has been reported which performs CMP processing simultaneously with plating, viz. chemical mechanical electrolytic polishing. According to this method, the mechanical processing is carried out to the growing surface of a plating film, causing the problem of denaturing of the resulting film.

Further, though it is desired that an ion exchange for use in electrolytic processing be tightly fixed on the exposed surface of a processing electrode or a feeding electrode, as described above, in order to ensure evenness of the processing accuracy, it has practically been difficult to keep the ion exchanger fixed tightly on the electrode.

Thus, when continuing electrolytic processing while an ion exchanger is fixed on an electrode by screwing or with an adhesive tape, the fixing of ion exchanger is likely to become incomplete, so that the ion exchanger can move easily, impairing evenness of the processing accuracy.

SUMMARY OF THE INVENTION

The present invention has been made in view of the above situation in the background art. It is therefore a first object of the present invention to provide an electrolytic processing apparatus and method that can control a processing rate distribution over the entire to-be-processed surface of a workpiece, thereby improving uniformity of the processing rate or improving evenness of the processed surface.

It is a second object of the present invention to provide an electrolytic processing apparatus and method which, while omitting a CMP treatment entirely or reducing a load upon a CMP treatment to the least possible extent, can process a conductive material formed in the surface of a substrate to flatten the material, or can remove (clean) extraneous matter adhering to the surface of a workpiece such as a substrate.

It is a third object of the present invention to provide a fixing method and structure for an ion exchanger that can easily and quickly fix an ion exchanger tightly on the surface of an electrode, and to provide an electrolytic processing apparatus provided with the ion exchanger-fixing structure.

In order to achieve the above object, the present invention provides an electrolytic processing apparatus, comprising: a processing electrode that can come close to or into contact with a workpiece; a feeding electrode for feeding electricity to the workpiece; an ion exchanger disposed in at least either between the workpiece and the processing electrode, or between the workpiece and the feeding electrode; a fluid supply section for supplying a fluid between the workpiece and the ion exchanger; and a plurality of power sources, each for applying a voltage between the processing electrode and the feeding electrode. At least one of the processing electrode and the feeding electrode is electrically divided into a plurality of parts, and the power sources apply each voltage to each of the divided electrode parts and can control at least one of voltage and electric current independently for each of the divided electrode parts.

With the provision of the processing electrode and the feeding electrode, the electrical division of at least one of the processing electrode and the feeding into a plurality of parts, and the independent control of at least one of the voltage and the electric current for each of the divided electrode parts, the electrolytic processing apparatus can improve uniformity of the electric field intensity over the entire surface of the to-be-processed surface of a workpiece, thereby improving uniformity of the processing rate, or can control a processing rate distribution to improve evenness of the processed surface.

To "control at least one of voltage and electric current independently for each of the divided electrode parts" herein includes the cases of (1) controlling at least one of the voltage and the electric current between each of divided processing electrode parts and an undivided feeding electrode, (2) controlling at least one of the voltage and the electric current between an undivided processing electrode and each of divided feeding electrode parts, and (3) controlling at least one of the voltage and the electric current between each of divided processing electrode parts (N parts) and each of divided feeding electrode parts (N parts) in a plurality of circuits (N circuits) formed by the processing electrode parts and the feeding electrode parts.

The fluid may be ultrapure water, pure water, or a liquid having an electric conductivity of not more than 500 µS/cm. The use as the fluid of ultrapure water, pure water, a liquid having an electric conductivity of not more than 500 µS/cm or an electrolytic solution makes it possible to carry out a clean processing without leaving impurities on the surface of a workpiece, thereby simplifying a cleaning step after electrolytic processing. The electric conductivity value herein refers to the corresponding value at 1 atm, 25° C.

It is preferred that respectively different constant voltages be applied at least one time to each of the divided electrode parts. This facilitates control of the end point of processing.

It is possible to apply respectively different constant voltages at least one time to at least two of the divided electrode parts. This enables a more flexible control. The term "constant voltage" herein refers to a substantially constant voltage that can be regarded as being practically constant.

It is also preferred that an electric current or a voltage, which changes with time, be supplied to each of the divided electrode parts. This facilitates control of the end point of processing.

It is possible to supply an electric current or a voltage, which changes with time, to at least two of the divided electrode parts. This enables a more flexible control.

The present invention provides an electrolytic processing method, comprising: providing a processing electrode and a feeding electrode, at least one of which is electrically divided into a plurality of parts; allowing a workpiece to be close to or in contact with the processing electrode; feeding electricity from the feeding electrode to the workpiece; disposing an ion exchanger between at least either between the workpiece and the processing electrode, or between the workpiece and the feeding electrode; supplying a fluid between the workpiece and the ion exchanger; applying a voltage to each of the divided electrode parts; and controlling at least one of voltage and electric current independently for each of the divided electrode parts.

The present invention also provides an electrolytic processing apparatus, comprising: a processing electrode; a feeding electrode for feeding electricity to the workpiece; a holder for holding the workpiece that can come close to or into contact with the processing electrode; an ion exchanger disposed in at least either between the workpiece and the processing electrode, or between the workpiece and the feeding electrode; a power source for applying a voltage between the processing electrode and the feeding electrode; a fluid supply section for supplying a fluid between the workpiece and at least one of the processing electrode and the feeding electrode, in which the ion exchanger is disposed; and a drive section for allowing the workpiece held by the holder and the processing electrode to make a relative movement. A dummy member, at least the surface of which has an electric conductivity, is disposed outside of the periphery of the workpiece. It is preferred that the dummy member make the area of the portion of the workpiece facing the processing electrode constant during the relative movement of the workpiece and the processing electrode.

FIGS. 3 and 4 illustrate the principle of the electrolytic processing that utilizes an ion exchanger. FIG. 3 shows the ionic state when an ion exchanger 62a mounted on a processing electrode 64 and an ion exchanger 62b mounted on a feeding electrode 66 are brought into contact with or close to a surface of a workpiece 60, while a voltage is applied via a power source 67 between the processing electrode 64 and the feeding electrode 66, and a liquid 68, e.g. ultrapure water, is supplied from a liquid supply section 69 between the processing electrode 64, the feeding electrode 66 and the workpiece 60. FIG. 4 shows the ionic state when the ion exchanger 62a mounted on the processing electrode 64 is brought into contact with or close to the surface of the workpiece 60 and the feeding electrode 66 is directly contacted with the workpiece 60, while a voltage is applied via the power source 67 between the processing electrode 64 and the feeding electrode 66, and the liquid 68, such as ultrapure water, is supplied from the liquid supply section 69 between the processing electrode 64 and the workpiece 60.

When a liquid like ultrapure water that in itself has a large resistivity is used, it is preferred to bring the ion exchanger 62a into contact with the surface of the workpiece 60. This can lower the electric resistance, lower the requisite voltage and reduce the power consumption. The "contact" in the present electrolytic processing does not imply "press" for giving a physical energy (stress) to a workpiece as in CMP.

Water molecules 70 in the liquid 68 such as ultrapure water are dissociated efficiently by using the ion exchangers 62a, 62b into hydroxide ions 73 and hydrogen ions 74. The hydroxide ions 73 thus produced, for example, are carried, by the electric field between the workpiece 60 and the processing electrode 64 and by the flow of the liquid 68, to the surface of the workpiece 60 opposite to the processing electrode 64 whereby the density of the hydroxide ions 73 in the vicinity of the workpiece 60 is enhanced, and the hydroxide ions 73 are reacted with the atoms 60a of the workpiece 60. The reaction product 76 produced by this reaction is dissolved in the liquid 68, and removed from the workpiece 60 by the flow of the liquid 68 along the surface of the workpiece 60. Removal processing of the surface of the workpiece 60 is thus effected.

As will be appreciated from the above, the removal processing according to this processing method is effected purely by the electrochemical interaction between the reactant ions and the workpiece. This electrolytic processing thus clearly differs in the processing principle from CMP according to which processing is effected by the combination of the physical interaction between an abrasive and a workpiece, and the chemical interaction between a chemical species in a polishing liquid and the workpiece. According to the above-described method, the portion of the workpiece 60 facing the processing electrode 64 is processed. Therefore, by moving the processing electrode 64, the workpiece 60 can be processed into a desired surface configuration.

As described above, the removal processing of the electrolytic processing is effected solely by the dissolution reaction due to the electrochemical interaction, and is clearly distinct in the processing principle from CMP in which processing is effected by the combination of the physical interaction between an abrasive and a workpiece, and the chemical interaction between a chemical species in a polishing liquid and the workpiece. Accordingly, the electrolytic processing can conduct removal processing of the surface of a workpiece without impairing the properties of the material of the workpiece. Even when the material of a workpiece is of a low mechanical strength, such as the above-described Low-k material, removal processing of the surface of the workpiece can be effected without any physical damage to the workpiece. Further, compared to the conventional electrolytic processing which use electrolytic solution as a processing liquid, by using a liquid having an electric conductivity of not more than 500 μS/cm, preferably pure water, more preferably ultrapure water, as a processing liquid, it is possible to reduce remarkably contamination of the surface of a workpiece, and dispose easily of waste liquid after the processing.

According to the present invention, as described above, the workpiece 60 and the processing electrode 64 are moved relatively so as to move the portion of the workpiece 60 facing the processing electrode 64, so that processing of the entire surface of the workpiece 60 can be carried out. Depending upon the shapes of the workpiece 60 and the processing electrode 64, however, the area of the portion of the workpiece 60 facing the processing electrode 64, i.e. the face-to-face area, may change with the relative movement of the workpiece 60 and the processing electrode 64. For example, in the case of FIG. 5A, as the processing electrode 64 moves relative to the workpiece 60, the area of the portion of the workpiece 60 facing the processing electrode 64 changes from $S_1$ to $S_2$. The processing rate is proportional to the current density (=current value/face-to-face area). When processing is carried out at a constant current value, the processing rate is fast in a small face-to-face area and is slow in a large face-to-face area. Consequently, the processing rate cannot be made equal over the entire surface of the workpiece 60, failing to effect a uniform processing of the workpiece 60. In such a case, it may be considered to properly control the current value according to the face-to-face area so as to equalize the processing rate over the entire surface of the workpiece 60. It is, however, difficult to properly control the current value according to the face-to-face area that varies during processing.

According to the present invention, the provision of a dummy member outside of the periphery of a workpiece can make the face-to-face area constant, thereby realizing a uniform processing. More specifically, as shown in FIG. 5B, by the provision of a dummy member 78 outside of the workpiece 60, the area of the processing electrode 64 facing the workpiece 60 and the dummy member 78, i.e. the face-to-face area, is always constant ($S_3$) irrespective of the relative movement of the workpiece 60 and the processing electrode 64. Accordingly, the current density can be made always constant even with a constant current value, making it possible to equalize the processing rate over the entire surface of the workpiece 60 and carry out a uniform processing stably.

In electrochemical processing, reactant ions are moved to the surface of the workpiece 60 by the electric field between the processing electrode 64 and the workpiece 60 (feeding electrode 66), and the surface of the workpiece 60 is processed by the ions. Accordingly, in order to carry out a uniform processing of the workpiece 60, it is necessary to make the intensity of the electric field between the processing electrode 64 and the workpiece 60 uniform over the entire surface of the workpiece 60. However, uniformity of the electric field intensity can be impaired by the shapes of the electrode and the workpiece 60. For example, in the case of FIG. 6A, processing progresses between the processing electrode 64 (cathode) and the workpiece 60 (anode), and the electric flux lines (arrows) and the isoelectric lines (solid lines) are dense at the end portion of the workpiece 60 compared to the other portion, that is, the electric field concentration occurs at the end portion of the workpiece 60. Accordingly, the amount of reactant ions increases at the end portion of the workpiece 60 whereby the processing rate at the end portion becomes significantly higher than the other portion. As a result, as shown in FIG. 6B, the processing amount is large locally at the end portion A of the workpiece 60. Thus, the workpiece 60 cannot be processed uniformly.

According to the present invention, as shown in FIG. 6C, since the dummy member 78 is provided outside of the periphery of the workpiece 60, the above-described electric field intensity concentration occurs in the dummy member 78. This makes it possible to make the electric field intensity at the end portion of the workpiece 60 the same as the other portion, thereby equalizing the processing rate over the entire surface of the workpiece 60. The present invention thus makes it possible to equalize the processing rate over the entire surface of the workpiece 60 and carry out a uniform processing stably.

It is preferred that the conductive portion of the dummy member be formed of an electrochemically inactive material. By forming at least the surface of the dummy member of an electrochemically inactive material, the dummy member can be prevented from being processed, together with the workpiece, during electrolytic processing.

It is preferred that the conductive portion of the dummy member be formed of the same material as the workpiece. By forming at least the surface of the dummy member of the same material as the workpiece, the reaction at the dummy member can be made the same as the reaction at the workpiece, whereby uniformity of the processing can be further improved.

It is preferred that a buffering member be disposed between the workpiece and the dummy member. The buffering member can absorb a shock to the workpiece. The buffering member is preferably formed of a material having a lower hardness than the dummy member.

The present invention also provides an electrolytic processing apparatus, comprising: a processing electrode having a larger diameter than a workpiece; a feeding electrode for feeding electricity to the workpiece; a holder for holding the workpiece that can come close to or into contact with the processing electrode; an ion exchanger disposed in at least one of either a position between the workpiece and the processing electrode, or a position between the workpiece and the feeding electrode; a power source for applying a voltage between the processing electrode and the feeding electrode; a fluid supply section for supplying a fluid to the space between the workpiece and at least one of the processing electrode and the feeding electrode, in which the ion exchanger is disposed; and a drive section for allowing the workpiece held by the holder and the processing electrode to make a relative movement in such a state that the center of movement of the processing electrode lies within the range of the workpiece.

In electrolytic processing, the processing amount is determined by the frequency of presence of a processing electrode over a workpiece and the applied voltage. Accordingly, when it is intended to process the whole surface of a workpiece into a uniform flat surface, it is necessary to make the presence frequency of a processing electrode equal over the entire surface of the workpiece. For example, when the workpiece has a disk shape, like a semiconductor substrate, and the processing electrode also has a disk shape and its diameter is smaller than the diameter of the workpiece, the workpiece and the processing electrode may be allowed to make a relative movement so that the processing electrode can be present over the entire surface of the workpiece, thereby processing the entire surface of the workpiece. Even with such a method, however, the presence frequency of processing electrode can vary at some points of the workpiece, leading to unevenness of the processing amount. Evenness of the presence frequency of processing electrode may be increased when the diameter of the processing electrode is larger than the diameter of a workpiece. However, the processing electrode, which is a metal, should necessarily be larger, and thus the weight increase becomes a problem. Further, depending upon the state of contact between an ion exchanger and a workpiece, the processing amount is likely to vary at the contact end.

According to the electrolytic processing apparatus of the present invention, since the processing electrode has a larger diameter than a workpiece, a high processing rate can be obtained. In addition, since the center of movement of the processing electrode lies within the range of the workpiece during electrolytic processing, the presence frequency of the processing electrode over the surface of the workpiece can be best equalized. Furthermore, it becomes possible to use a considerably smaller processing electrode, leading to a remarkable downsizing and weight saving of the whole apparatus. The center of movement of the processing electrode is the center of scroll movement when the processing electrode makes a scroll movement, and is the center of rotation when the processing electrode makes a rotational movement.

The present invention also provides an electrolytic processing apparatus, comprising: a processing electrode having a larger diameter than a workpiece; a feeding electrode for feeding electricity to the workpiece; a holder for holding the workpiece that can come close to or into contact with the processing electrode and the feeding electrode; a power source for applying a voltage between the processing electrode and the feeding electrode; a fluid supply section for supplying a fluid between the workpiece and the processing and feeding electrodes; and a drive section for allowing the workpiece held by the holder and the processing and feeding electrodes to make a relative movement in such a state that the center of movement of the processing electrode lies within the range of the workpiece.

The present invention also provides an electrolytic processing apparatus, comprising: a processing electrode having a larger diameter than a workpiece; a plurality of feeding electrodes disposed in a peripheral portion of the processing electrode; a holder for holding the workpiece that can come close to or into contact with the processing electrode; an ion exchanger disposed in at least either between the workpiece and the processing electrode or between the workpiece and the feeding electrodes; a power source for applying a voltage between the processing electrode and the feeding electrodes; a fluid supply section for supplying a fluid to the space between the workpiece and at least one of the processing electrode and the feeding electrodes, in which the ion exchanger is disposed; and a drive section for allowing the workpiece held by the holder and the processing electrode to make a relative movement in such a state that at least one of the feeding electrodes always feeds electricity to the workpiece.

Since a workpiece cannot be processed with the region where a feeding electrode is present, the processing rate is low with the region in which the feeding electrode is present, compared to the other region. It is therefore preferable to make the area (region) occupied by a feeding electrode smaller in order to reduce the influence of the feeding electrode upon the processing rate. From this viewpoint, according to the electrolytic processing apparatus of the present invention, a plurality of feeding electrodes having a small area are disposed in a peripheral portion of the processing electrode, and at least one of the feeding electrodes is allowed to come close to or into contact with a workpiece during the relative movement. This makes it possible to reduce an unprocessible region as compared to the case of disposing a ring-shaped feeding electrode in the peripheral portion of the processing electrode, thereby preventing a peripheral portion of the workpiece from remaining unprocessed.

The processing electrode preferably comprises an outer processing electrode defined by the peripheral portion in which the feeding electrodes are disposed, and an inner processing electrode positioned on the inner side of the outer processing electrode. Further, it is preferred that the power source control independently the respective voltages or electric currents applied to the outer processing electrode and to the inner processing electrode. By thus dividing the processing electrode into the two parts respectively positioned in the region where the feeding electrodes have an influence on the processing rate and in the region where the feeding electrodes have no influence on the processing rate, and controlling the respective processing rates at the two processing electrode parts independently, a lowering of the processing rate in the region where the feeding electrodes are present can be prevented. Thus, by making the processing rate at the outer processing electrode relatively higher than the processing rate at the inner processing electrode, it becomes possible to suppress the influence by the presence of the feeding electrodes and realize a uniform processing rate over the entire surface of the processing electrode.

The present invention also provides an electrolytic processing apparatus, comprising: a processing electrode having a larger diameter than a workpiece; a plurality of feeding electrodes disposed in a peripheral portion of the processing electrode; a holder for holding the workpiece that can come close to or into contact with the processing electrode and the feeding electrodes; a power source for applying a voltage between the processing electrode and the feeding electrodes; a fluid supply section for supplying a fluid between the workpiece and the processing and feeding electrodes; and a drive section for allowing the workpiece held by the holder and the processing and feeding electrodes to make a relative movement in such a state that at least one of the feeding electrodes always feeds electricity to the workpiece.

The present invention also provides an electrolytic processing method, comprising: providing a processing electrode having a larger diameter than a workpiece and a feeding electrode for feeding electricity to the workpiece; disposing an ion exchanger between the workpiece and at least one of the processing electrode and the feeding electrode; applying a voltage between the processing electrode and the feeding electrode; allowing the workpiece to be close to or into contact with the processing electrode; supplying a fluid between the workpiece and at least one of the processing electrode and the feeding electrode, in which the ion exchanger is disposed; and allowing the workpiece and the processing electrode to make a relative movement in such a state that the center of movement of the processing electrode always lies within the range of the workpiece, thereby processing the surface of the workpiece.

The present invention also provides an electrolytic processing method, comprising: providing a processing electrode having a larger diameter than a workpiece and a feeding electrode for feeding electricity to the workpiece; applying a voltage between the processing electrode and the feeding electrode; allowing the workpiece to be close to or into contact with the processing electrode and the feeding electrode; supplying a fluid between the workpiece and the processing electrode and feeding electrode; and allowing the workpiece and the processing and feeding electrodes to make a relative movement in such a state that the center of movement of the processing electrode always lies within the range of the workpiece, thereby processing the surface of the workpiece.

The present invention also provides an electrolytic processing method, comprising: providing a processing electrode having a larger diameter than a workpiece and a plurality of feeding electrodes disposed in a peripheral portion of the processing electrode; disposing an ion exchanger between the workpiece and at least one of the processing electrode and the feeding electrodes; applying a voltage between the processing electrode and the feeding electrodes; allowing the workpiece to be close to or into contact with the processing electrode; supplying a fluid between the workpiece and at least one of the processing electrode and the feeding electrodes, in which the ion exchanger is disposed; and allowing the workpiece and the processing electrode to make a relative movement in such a state that at least one of the feeding electrodes always feeds electricity to the workpiece, thereby processing the surface of the workpiece.

The present invention also provides an electrolytic processing method, comprising: providing a processing electrode having a larger diameter than a workpiece and a plurality of feeding electrodes disposed in a peripheral portion of the processing electrode; applying a voltage between the processing electrode and the feeding electrodes; allowing the workpiece to be close to or into contact with the processing electrode and the feeding electrodes; supplying a fluid between the workpiece and the processing and feeding electrodes; and allowing the workpiece and the processing and feeding electrodes to make a relative movement in such a state that at least one of the feeding electrodes always feeds electricity to the workpiece, thereby processing the surface of the workpiece.

The present invention also provides an electrolytic processing method, comprising: allowing a workpiece to be close to or into contact with a plurality of processing electrodes; applying a voltage between the processing electrodes and a feeding electrode for feeding electricity to the workpiece; supplying a fluid between the workpiece and at least one of the processing electrodes and the feeding electrode; and allowing the processing electrodes and the workpiece to make a relative movement so that a plurality of processing electrodes, which are uneven in the processing amount per unit time, pass every point in the to-be-processed surface of the workpiece, thereby processing the surface of the workpiece.

Electrochemical processing is effected through an electrochemical interaction between reactant ions and a workpiece, and the processing rates at various points in the surface of the workpiece basically depend, except the physical properties of the workpiece, on the current density and the frequency of presence of a processing electrode over the workpiece. In practice, reaction products produced at the surface of the workpiece by the electrochemical reaction between the workpiece and the reactant ions during processing, and gas bubbles generated by a side reaction at the surfaces of the workpiece and the electrode impede movement of the reactant ions to the surface of the workpiece. Further, because of the electrochemical interaction, the reaction rate changes with a change in temperature, etc. Due to these factors, the processing rate can vary within the same processing electrode when a single processing electrode is employed. Even when a plurality of processing electrodes are employed, the processing rate can vary between the processing electrodes.

Accordingly, when it is intended to process the surface of a workpiece at a uniform processing rate with the use of a plurality of processing electrodes, in view of the above facts, removal of the reaction products and gas bubbles and equalization of the presence frequency of processing electrodes may be carried out. However, variation of the processing rate between the respective processing electrodes can nevertheless occur, making equalization of the processing rate on an nm/min order difficult. According to the electrolytic processing method of the present invention, the processing electrodes and a workpiece are allowed to make a relative movement so that a plurality of processing electrode pass every point in the to-be-processed surface of the workpiece, thereby eliminating variation of the processing rate between the processing electrodes and equating the processing rate. This enables an nm/min order of equalization of the processing rate over the entire surface of the workpiece.

Preferably, the plurality of processing electrodes are disposed such that the presence frequencies of processing electrodes at every points in the to-be-processed surface of the workpiece become substantially equal during the relative movement. The plurality of processing electrodes are preferably of the same shape.

It is preferred that the feeding electrode comprise a plurality of electrodes. The plurality of feeding electrodes are preferably disposed such that the presence frequencies of feeding electrodes at every points in the to-be-processed surface of the workpiece become substantial equal during the relative movement.

The relative movement is preferably one of a rotational movement, a reciprocating movement, an eccentric rotational movement and a scroll movement, or a combination thereof.

It is preferred that an ion exchanger be disposed between the workpiece and at least one of the processing electrodes and the feeding electrodes.

The fluid is preferably ultrapure water, pure water, a liquid having an electric conductivity of not more than 500 µS/cm, or an electrolytic solution.

The present invention also provides an electrolytic processing method, comprising: allowing a workpiece to be close to or into contact with a processing electrode; applying a voltage between the processing electrode and a feeding electrode for feeding electricity to the workpiece; supplying a fluid between the workpiece and at least one of the processing electrode and the feeding electrode; and allowing the processing electrode and the workpiece to make a relative movement so that a plurality of points in the processing electrode, which are uneven in the processing amount per unit time, pass every point in the to-be-processed surface of the workpiece, thereby processing the surface of the workpiece.

The present invention also provides an electrolytic processing apparatus, comprising: a plurality of processing electrodes; a feeding electrode for feeding electricity to the workpiece; a holder for holding the workpiece that can come close to or into contact with the processing electrodes; a power source for applying a voltage between the processing electrodes and the feeding electrode; a fluid supply section for supplying a fluid between the workpiece and one of the processing electrodes and the feeding electrode; and a drive section for allowing the processing electrodes and the workpiece to make a relative movement so that a plurality of processing electrodes, which are uneven in the processing amount per unit time, pass every point in the to-be-processed surface of the workpiece held by the holder.

The present invention also provides an electrolytic processing apparatus comprising: a processing electrode; a feeding electrode for feeding electricity to a workpiece; a holder for holding the workpiece that can come close to or into contact with the processing electrodes; a power source for applying a voltage between the processing electrode and the feeding electrode; a fluid supply section for supplying a fluid between the workpiece and at least one of the processing electrode and the feeding electrode; and a drive section for allowing the processing electrode and the workpiece to make a relative movement so that a plurality of points in the processing electrode, which are uneven in the processing amount per unit time, pass every point in the to-be-processed surface of the workpiece held by the holder.

The present invention provides a fixing method for fixing an ion changer for use in electrolytic processing on an electrode, comprising: positioning an ion exchanger between an electrode support, which supports an electrode with its surface exposed, and a fixing jig engageable with the periphery of the electrode support; and engaging the fixing jig with the electrode support, thereby fixing the ion exchanger with its peripheral portion sandwiched in between the fixing jig and the electrode support.

According to the fixing method, an ion exchanger is evenly stretched outwardly due to frictional force between the fixing jig, the ion exchanger and the electrode support produced when simply pressing the fixing jig into engagement with the electrode support, and the ion exchanger is thus evenly stretched into a tense state, whereby the ion exchanger can be automatically fixed tightly on the exposed surface of the electrode.

Preferably, the fixing jig consists of a pair of divided jigs, and the pair of divided jigs, with the ion exchanger at its peripheral portion sandwiched in therebetween, is pressed into engagement with the electrode support.

By thus provisionally fixing the ion exchanger in the divided fixing jigs by sandwiching the ion exchanger at its peripheral portion in between the divided jigs before pressing the divided jigs into engagement with the electrode support, slipping between the ion exchanger and the fixing jig upon the press-in is prevented, whereby the ion exchanger can be fixed always in a tense state.

The present invention also provides a method for fixing an ion exchanger for use in electrolytic processing on an electrode, comprising: disposing an ion exchanger-fixing jig outside of an electrode; holding the ion exchanger by the ion exchanger-fixing jig; and attaching the ion exchanger-fixing jig to the electrode while allowing the ion exchanger to be supported in a tense state on the electrode.

The present invention provides a fixing structure for fixing an ion exchanger for use in electrolytic processing on an electrode, comprising: an electrode support that supports an electrode with its surface exposed; and a fixing jig engageable with the periphery of the electrode support. The electrode support and the fixing jig fix an ion exchanger by sandwiching therebetween a peripheral portion of the ion exchanger and stretching the ion exchanger over the surface of the electrode.

It is preferred that the fixing jig consist of a pair of divided jigs, and an outer peripheral portion of the ion exchanger, outside of the portion covering the electrode support, is sandwiched in between the fixing jigs.

The present invention also provides an electrolytic processing apparatus comprising an ion exchanger-fixing device, the ion exchanger-fixing device including; an electrode support that supports an electrode with its surface exposed; and a fixing jig engageable with the periphery of the electrode support. The ion exchanger-fixing device fixes an ion exchanger by sandwiching a peripheral portion of the ion exchanger in between the electrode support and the fixing jig.

It is preferred that the electrode support and the fixing jig be allowed to move relatively to fix the ion exchanger by sandwiching the peripheral portion of the ion exchanger in between the electrode support and the fixing jig.

This enables an exchange of an ion exchanger for a new one. Thus, when an ion exchanger is stained, for example, at least one of the fixing jig and the electrode support is moved in a direction away from each other to release the fixing of the ion exchanger and, after allowing the ion exchanger to travel a necessary distance, the at least one of the fixing jig and the electrode support is moved in a direction closer to each other to fix the ion exchanger, thereby carrying out exchanges of ion exchangers in a successive manner.

It is preferred that the ion exchanger, disposed between the electrode support and the fixing jig, be capable of traveling.

In a preferred embodiment, the ion exchanger has an endless form and is capable of traveling in one direction, and a regeneration section for regenerating the ion exchanger is provided in a traveling route of the ion exchanger.

This makes it possible to fix part of the endless ion exchanger and use that part for processing while regenerating another part of the ion exchanger, not in use for processing, in the regeneration section, and after allowing the ion exchanger to travel in one direction, fix the regenerated part of ion exchanger for use in processing. A repetition of this operation enables circulation and repeated uses of the endless ion exchanger.

In another preferred embodiment, the ion exchanger is capable of traveling in two directions, and two regeneration sections for regenerating the ion exchanger are provided on both sides of the electrode support in the traveling direction of the ion exchanger.

This makes it possible to fix part of the ion exchanger and use that part for processing while regenerating other part of the ion exchanger, not in use for processing, in one of the regeneration sections, and exchange the part of the ion exchanger that has been used in processing for the regenerated part of ion exchanger. A repetition of this operation enables repeated uses of the long ion exchanger.

The above and other objects, features, and advantages of the present invention will be apparent from the following description when taken in conjunction with the accompanying drawings which illustrates preferred embodiments of the present invention by way of example.

BRIEF DESCRIPTION OF DRAWINGS

FIG. 2 is a cross-sectional view schematically showing a conventional electrolytic processing apparatus;

FIG. 12 is a diagram showing the connection between the processing electrode and the wiring, and the connection between the substrate and the wiring in the electrolytic processing apparatus of FIG. 10;

FIG. 14 is a diagram showing the connection between the processing electrode and the wiring, and the connection between the substrate and the wiring in the electrolytic processing apparatus of FIG. 13;

FIG. 16 is a plan view of a substrate processing apparatus provided with an electrolytic processing apparatus according to the present invention;

FIG. 21A is a graph showing the relationship between the electric current and time in electrolytic processing of the surface of a substrate, the substrate having in the surface a laminated film composed of two different materials, and FIG. 21B is a graph showing the relationship between the voltage and time in electrolytic processing of the surface of a substrate, the substrate having in the surface a laminated film composed of two different materials;

FIG. 24 is a cross-sectional view schematically showing an electrolytic processing apparatus according to a sixth embodiment of the present invention;

FIG. 31 is a cross-sectional view schematically showing an electrolytic processing apparatus according to a seventh embodiment of the present invention;

FIG. 32 is a plan view of the electrolytic processing apparatus of FIG. 31;

FIG. 33 is a plan view showing the electrode section of the electrolytic processing apparatus of FIG. 31;

FIG. 35 is a plan view showing an electrode section according to an eighth embodiment of the present invention;

FIG. 37 is a plan view showing an electrode section according to a ninth embodiment of the present invention;

FIG. 38 is an enlarged view of a portion of the electrode section of FIG. 37;

FIG. 43 is a cross-sectional view schematically showing an electrolytic processing apparatus according to eleventh embodiment of the present invention;

FIG. 49 is a plan view schematically showing a variation of the ion exchanger-fixing device.

DETAILED DESCRIPTION OF THE INVENTION

Preferred embodiments of the present invention will now be described with reference to the drawings. Though the below-described embodiments refer to application to electrolytic processing apparatuses which use a substrate as a workpiece to be processed and remove (polish) copper or the like formed on the surface of the substrate, the present invention is of course applicable to other workpiece.

Figure 7:
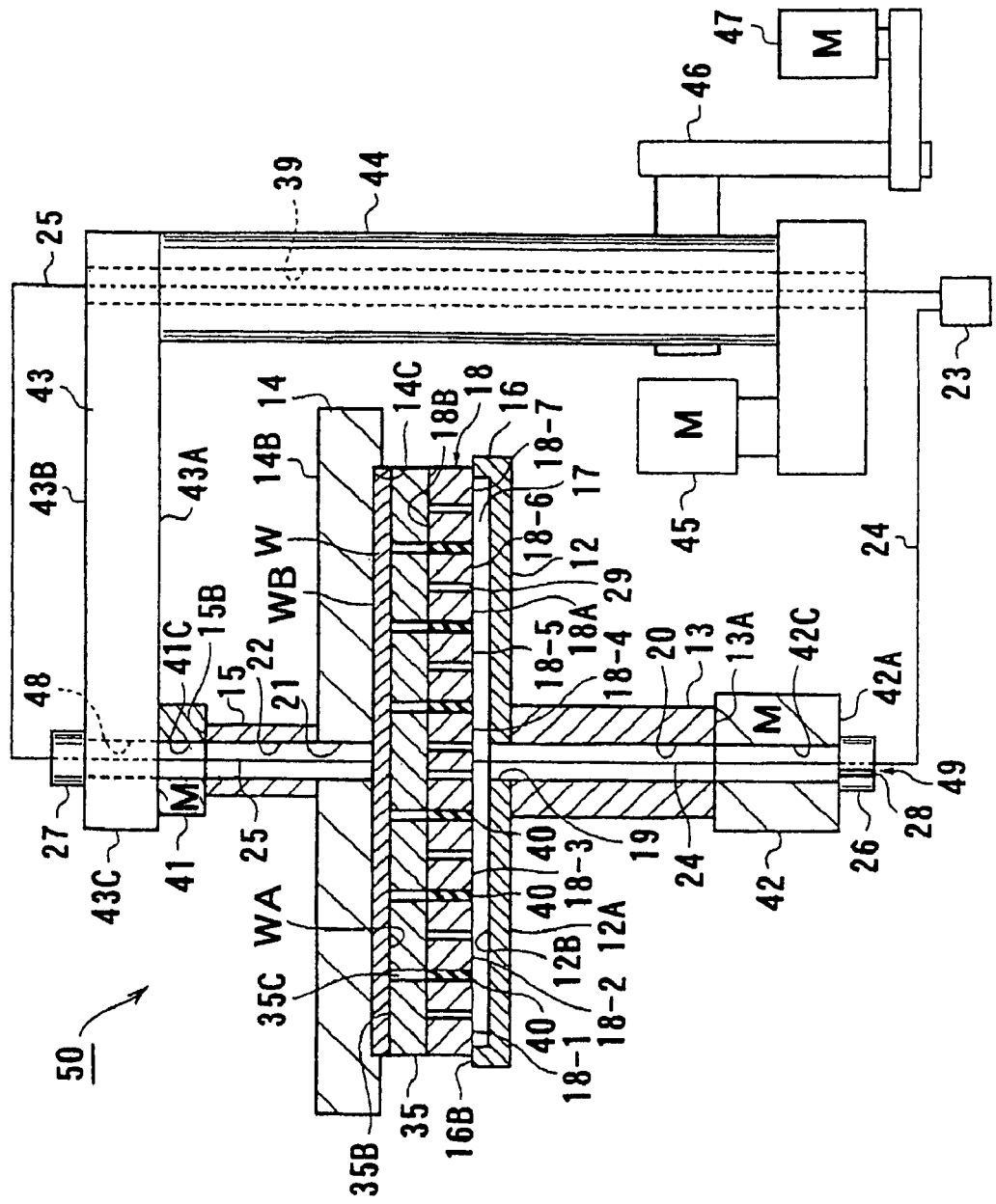
FIG. 7 is a cross-sectional view schematically showing an electrolytic processing apparatus according to a first embodiment of the present invention.

FIG. 7 is a partly sectional block diagram schematically showing an electrolytic processing apparatus 50 according to a first embodiment of the present invention. The electrolytic processing apparatus 50 comprises an electrode holder 12 for holding a processing electrode 18 as an electrode, an electrode-rotating shaft 13 mounted to the electrode holder 12, a substrate holder 14, provided above the electrode holder 12, for attracting and holding a substrate W as a workpiece or as a feeding electrode, and a substrate-rotating shaft 15 mounted to the substrate holder 14. According to this embodiment, the substrate W functions as a feeding electrode. The electrolytic processing apparatus 50 further includes a power source 23 for applying a voltage or an electric current between the processing electrode 18 and the substrate W, as will be described hereinbelow.

The electrolytic processing apparatus 50 is also provided with a hollow motor 41 as a substrate-rotating means for rotating the substrate holder 14 via the substrate-rotating shaft 15 (rotation about the central axis of the substrate-rotating shaft 15), a hollow motor 42 as an electrode-rotating means for rotating the electrode holder 12 via the electrode-rotating shaft 13 (rotation about the central axis of the electrode-rotating shaft 13), a pivot arm 43, a pivot shaft 44 and a pivoting motor 45 as substrate-pivoting means for pivoting the substrate holder 14 to a position right above the electrode holder 12 or pivoting the substrate holder 14 horizontally from the position right above the electrode holder 12, a ball screw 46 and a vertical movement motor 47 as vertical movement means for raising the substrate holder 14 away from the electrode holder 12 or lowering it near to the electrode holder 12, and a not-shown electrolytic solution supply means as a fluid supply means for supplying an electrolytic solution 49 as a fluid or as a liquid. The pivot arm 43 is driven by the pivoting motor 45, and pivots the substrate holder 14 about the pivot shaft 44. The ball screw 46 is driven by the vertical movement motor 47, and raises and lowers the pivot shaft 44, the pivot arm 43 and the substrate holder 14.

The electrode holder 12 has a generally discoid shape, and is disposed horizontally. A circumferential wall 16 is formed at the periphery of the upper surface 12B of the electrode holder 12. A depression 17 as a fluid supply section is formed inside the circumferential wall 16. The disk-shaped processing electrode 18 is mounted horizontally on the upper surface 16B of the circumferential wall 16. A through-hole 19 as a fluid supply section is formed in the center of the electrode holder 12. The processing electrode 18 is divided into seven parts by insulators 40. FIG. 7 does not show the actual sectional view of the processing electrode 18, but illustrates a pattern of the seven divisions. In the entirely of the divided parts (hereinafter referred to as processing electrode parts 18-1 through 18-7), there are formed a number of through-holes 29 as a fluid supply section for supplying the electrolytic solution 49 to the substrate W (only one through-hole 29 for each of the processing electrode parts 18-1 through 18-7 is depicted in FIG. 7 for illustration purpose).

An ion exchanger 35 is mounted on the upper surface of the processing electrode 18. The ion exchanger 35 is divided into seven parts in accordance with the processing electrode parts 18-1 through 18-7, and the respective parts are spaced from one another with interstices 35C. The ion exchanger 35 is divided into the same plan shapes as the processing electrode parts 18-1 through 18-7. It is possible to interpose insulators between the divided ion exchangers 35 by inserting the insulators in the interstices 35C, as in the case of the processing electrode 18. In this case, the insulators should not protrude from the processing surface of the ion exchanger 35. FIG. 7 does not show the actual sectional view of the ion exchanger 35, but illustrates a pattern of the seven divisions.

A circular film-like ion exchanger 35 (non-divided form) may be mounted on the upper surface 18B of the processing electrode 18 such that it covers the entire upper surface 18B. The outermost radius of the ion exchanger 35 and the processing electrode 18 is designed to be almost the same as the radius of the substrate W respectively.

The ion exchanger 35 may have at least one of cation-exchange groups and anion-exchange groups. In a preferred embodiment, the ion exchange 35 have both of cation-exchange group and anion-exchange group that may be alternately disposed concentrically or radially in a plane, or alternately disposed in layers in the thickness direction.

The electrode-rotating shaft 13 of a hollow columnar shape is mounted vertically to the lower surface 12A of the electrode holder 12. A hollow passage 20 as a fluid supply section is formed in the electrode-rotating shaft 13. The hollow passage 20 communicates with the through-hole 19 of the electrode holder 12. The hollow motor 42 is connected to the lower end 13A of the electrode-rotating shaft 13. A hollow portion 42C of the hollow motor 42, as a fluid supply section, communicates with the hollow passage 20. A wire 24, connected to the lower surface 18A of the processing electrode 18, passes through the depression 17, the through-hole 19, the hollow passage 20 and the hollow portion 42C, and through a slip ring 26 provided at the lower end 42A of the hollow motor 42, and is connected to the power source 23. An electrolytic solution supply inlet 28 as a fluid supply section is formed in the slip ring 26, and the electrolytic solution supply inlet 28 communicates with the hollow portion 42C. The not-shown electrolytic solution supply means supplies the electrolytic solution 49 to the electrolytic solution supply inlet 28 of the slip ring 26.

The substrate holder 14 has a disk shape, and is disposed horizontally. The substrate holder 14 attracts and holds the substrate W as a workpiece in an attraction portion 14C. A through-hole 21 is formed in the center of the substrate holder 14. The substrate holder 14 has, in the portion to be contacted with the substrate W, a number of not-shown suction holes that are connected to a not-shown vacuum source.

The substrate-rotating shaft 15 has a hollow columnar shape, and is mounted vertically to the upper surface 14B of the substrate holder 14. A hollow passage 22 is formed in the substrate-rotating shaft 15, and the hollow passage 22 communicates with the through-hole 21 of the substrate holder 14. The hollow motor 41 is connected to the upper end 15B of the substrate-rotating shaft 15. A hollow portion 41C of the hollow motor 41 communicates with the hollow passage 22. The hollow motor 41 is connected to the lower surface 43A of the pivot arm 43 in the vicinity of its free end 43C. A hollow portion 48 (shown with the broken lines) is formed in the pivot arm 43 extending from the connection with the hollow motor 41, and the hollow portion 48 communicates with the hollow portion 41C.

A wire 25, connected to the upper surface WB of the substrate W, passes through the through-hole 21, the hollow passage 22, the hollow portion 41C and the hollow portion 48, and through a slip ring 27 mounted to the upper surface 43B of the pivot arm 43 in the vicinity of its free end 43C, and further through the pivot arm 43 and a hollow portion 39 (shown with the broken lines) formed in the pivot shaft 44, and is connected to the power source 23. The electrolytic processing apparatus 50 of this embodiment is of the direct feeding type that feeds electricity directly to the substrate W. The substrate W is disposed in parallel with the processing electrode 18.

Figure 8:
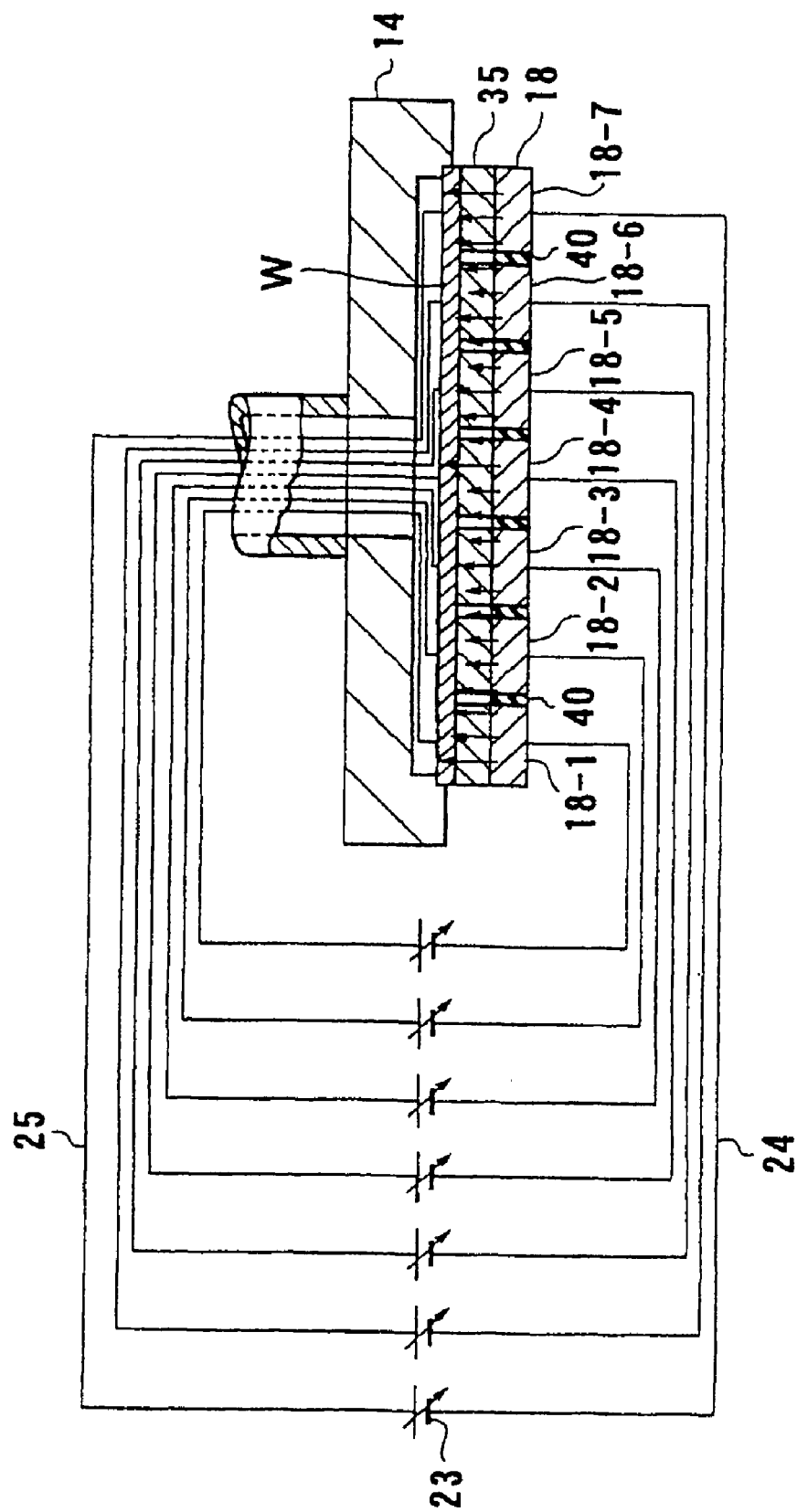
FIG. 8 is a diagram showing the connection between the processing electrode and the wiring, and the connection between the substrate and the wiring in the electrolytic processing apparatus of FIG. 7.

The details of the wires 24, 25 will now be described with reference to FIG. 8 in the case where the processing electrode 18 is divided into seven parts. In FIG. 8, the portion of the substrate holder 14 in contact with the substrate W is partly cut off in order to illustrate the state of wiring of the wire 25 to the substrate W. In FIG. 7, the wires 24, 25 are respectively drawn as a single wire and a single power source 23 is drawn such that they form a single circuit. In fact, however, each of the processing electrode parts 18-1 through 18-7 is connected to one wire 24, and is further connected at the point right above the processing electrode parts 18-1 through 18-7 to one wire 25. Further, the respective wires 24, 25 are connected to separate power sources 23 to form separate circuits. The respective circuits are so designed that at least one of the voltage and the electric current between each of the processing electrode parts 18-1 through 18-7 and a feeding electrode can be controlled independently by means of a not-shown controller. The respective circuits may be so designed that respectively different constant voltages and constant electric currents are applied alternately at least one time and are controlled independently by means of the not-shown controller. In FIG. 8, a depiction of the through-hole 29 is omitted. The term "constant voltage" or "constant electric current" herein includes substantially constant voltage or electric current that can be regarded as practically constant.

The operation of the electrolytic processing apparatus 50 of this embodiment will now be described with reference to FIG. 7.

The substrate W is placed on the attraction portion 14C of the substrate holder 14, and attracted and held thereon. The pivoting motor 45 pivots, via the pivot shaft 44, the pivot arm 43 about the pivot shaft 44 whereby the substrate holder 14 is pivoted horizontally to a position right above the electrode holder 12. Thereafter, the vertical movement motor 47 rotates the ball screw 46 to lower the pivot shaft 44. The pivot shaft 44 lowers the substrate holder 14 via the pivot arm 43 towards the electrode holder 12 so as to bring the lower surface WA of the substrate W into contact with the upper surface 18B of the processing electrode 18.

The electrolytic solution 49 is supplied by the not-shown electrolytic solution supply means to the electrolytic solution supply inlet 28. The electrolytic solution 49 passes through the hollow portion 42C, the hollow passage 20, the through-hole 19, the depression 17 and the through-holes 29, and is supplied from the entire surface 18B, facing the substrate W, of the processing electrode 18 to the ion exchanger 35. The electrolytic solution 49 is then supplied from the upper surface 35B of the ion exchanger 35 to the entire lower surface WA of the substrate W. Next, a voltage is applied from each of the power sources 23 to between each of the processing electrode parts 18-1 through 18-7 and the substrate W, respectively.

The electrode holder 12 is rotated at a given angular speed via the electrode-rotating shaft 13 by the actuation of the hollow motor 42, and the substrate holder 14 is rotated at a given angular speed via the substrate-rotating shaft 15 by the actuation of the hollow motor 41, while electrolytic processing of the substrate surface WA is carried out.

The processing electrode 18 is disposed opposite to the lower surface WA of the substrate W. Further, the ion exchanger 35 is disposed between the processing electrode 18 and the substrate W. Accordingly, when water having an electric conductivity of not more than 500 µS/cm, pure water or ultrapure water, for example, is used as the electrolytic solution 49, water molecules dissociate into hydroxide ions ($OH^-$) and hydrogen ions ($H^+$). The density of hydroxide ions at the lower surface WA of the substrate W is increased by the flow of the electrolytic solution 49 and by the electric field between the substrate W and the processing electrode 18, whereby a reaction occurs between e.g. the atoms of a plated film (not shown) and hydroxide ions. The reaction products are dissolved in the electrolytic solution 49, and are removed from the substrate W by the flow of electrolytic solution 49 along the lower surface WA of the substrate W. Electrolytic processing of the lower surface WA of the substrate W is thus effected.

It is desirable to use as the electrolytic solution 49 a liquid obtained by adding an additive, such as a surfactant, to water, pure water or ultrapure water, having an electric conductivity of not more than 500 µS/cm, preferably not more than 50 µS/cm, more preferably not more than 10 µS/cm, especially preferably not more than 0.1 µS/cm. The use of such a liquid makes it possible to carry out a clean processing without leaving impurities on the substrate surface WA, whereby a step of cleaning the substrate W after the electrolytic processing can be simplified. The electrolytic conductivity of the liquid herein refers to the corresponding value at 25° C., 1 atm.

A description will now be made of control of the voltage supplied between the processing electrode 18 and the substrate W. As described above, at least one of the voltage and the electric current applied between each of the processing electrode parts 18-1 through 18-7 and the substrate W is controlled independently, making it possible to equalize the electric field intensity over the entire surface of the processing electrode 18, and apply respectively different voltages to the respective processing electrode parts 18-1 through 18-7 so that the same intensity of electric current can flow over the entire surface of the processing electrode 18. This can equalize the supply of hydroxide ions to the lower surface WA of the substrate W to equalize the hydroxide ion concentration over the entire lower surface WA, thereby equalizing the processing rate over the lower surface WA of the substrate W. Further, by effecting such control that a processing rate distribution suited for the configuration (thickness distribution) of the to-be-processed surface before processing is obtained, evenness of the processed surface can be improved over the entire lower surface WA of the substrate W.

Further, unevenness of the substrate surface after processing, which would be caused by unevenness of current value due to the shape of the processing electrode 18 or to the influence of gas bubbles generated during processing, can be reduced.

When the to-be-processed material of the substrate W is copper, molybdenum or iron, for example, a voltage is applied so that the processing electrode 18 becomes a cathode and the substrate W becomes an anode. When the to-be-processed material is aluminum or silicon, on the other hand, a voltage is applied so that the processing electrode 18 becomes an anode and the substrate W becomes a cathode.

Figure 9:
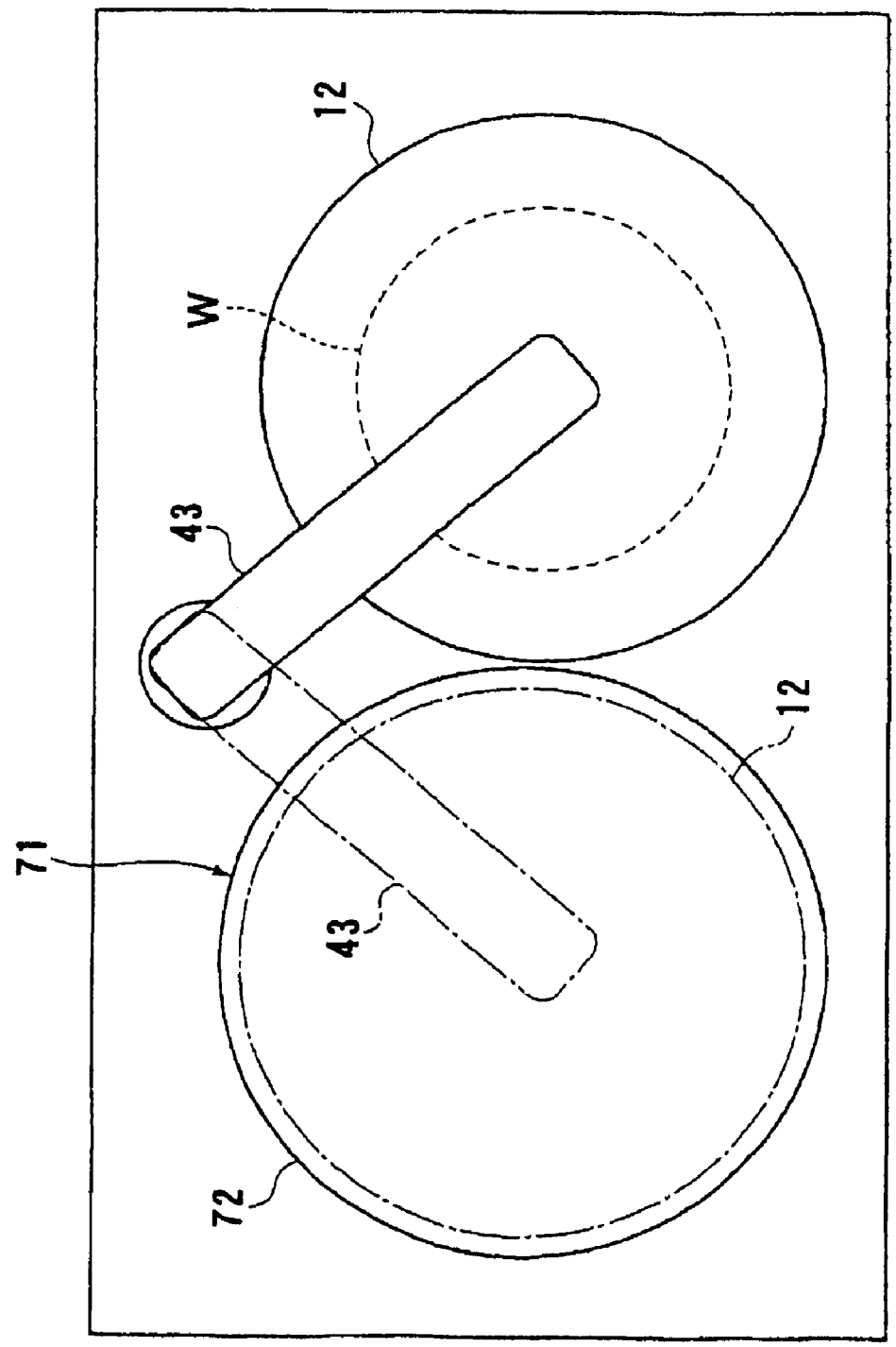
FIG. 9 is a plan view of the electrolytic processing apparatus of FIG. 7.

As shown in FIG. 9, the electrolytic processing apparatus 50 may be provided with a regeneration section 71 for regenerating the ion exchanger 35 (see FIG. 7), disposed beside the substrate holder 12 for holding the substrate W (shown with the broken line). The regeneration section 71 includes a regeneration tank 72 provided with a not-shown ion exchanger for regeneration. The regeneration tank 72 is connected to a not-shown electrode. Further, the regeneration tank 72 is so designed that the electrolytic solution 49 (see FIG. 7) can be supplied to the upper surface of the ion exchanger upwardly from under the ion exchanger. In operation, the pivot arm 43 is pivoted to move the electrode holder 12 to right above the regeneration tank 72, and is then lowered to bring the ion exchanger 35 close to or into contact with the ion exchanger for regeneration. In FIG. 9, the pivot arm 43 and the substrate holder 12 in the regeneration position are shown with the chain lines.

A positive potential, for example, is applied to the processing electrode 18 (see FIG. 7) and a negative potential is applied to the ion exchanger 35 to be regenerated so as to promote detachment of extraneous matter, such as copper, molybdenum or ion, adhering to the ion exchanger 35, thereby regenerating the ion exchanger 35. The regenerated ion exchanger 35 may be rinsed e.g. with pure water.

Figure 10:
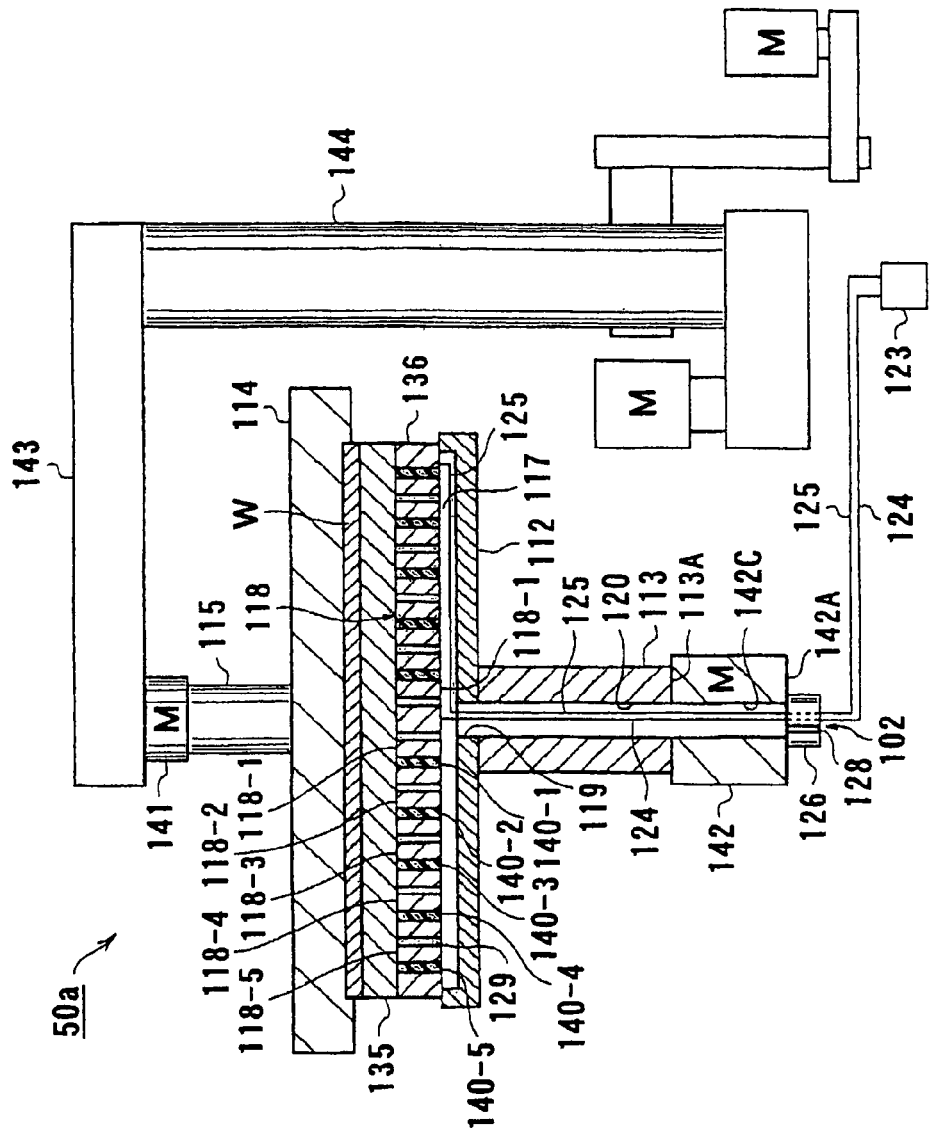
FIG. 10 is a cross-sectional view schematically showing an electrolytic processing apparatus according to a second embodiment of the present invention.

FIG. 10 is a partly sectional block diagram schematically showing an electrolytic processing apparatus 50a according to a second embodiment of the present invention.

According to the electrolytic processing apparatus 50a, a processing electrode 118 and a feeding electrode 136 are held by an electrode holder 112. The processing electrode 118 is divided into five processing electrode parts 118-1 through 118-5 by four ring-shaped insulators 140-1 through 140-4, and is peripherally surrounded by a ring-shaped insulator 140-5. In the processing electrode parts 118-1 through 118-5, a number of through-holes 129 are formed as a fluid supply section for supplying an electrolytic solution 102 to the substrate W (one through-hole 129 for each of the processing electrode parts 118-1 through 118-5 is depicted in FIG. 10).

Figure 11:
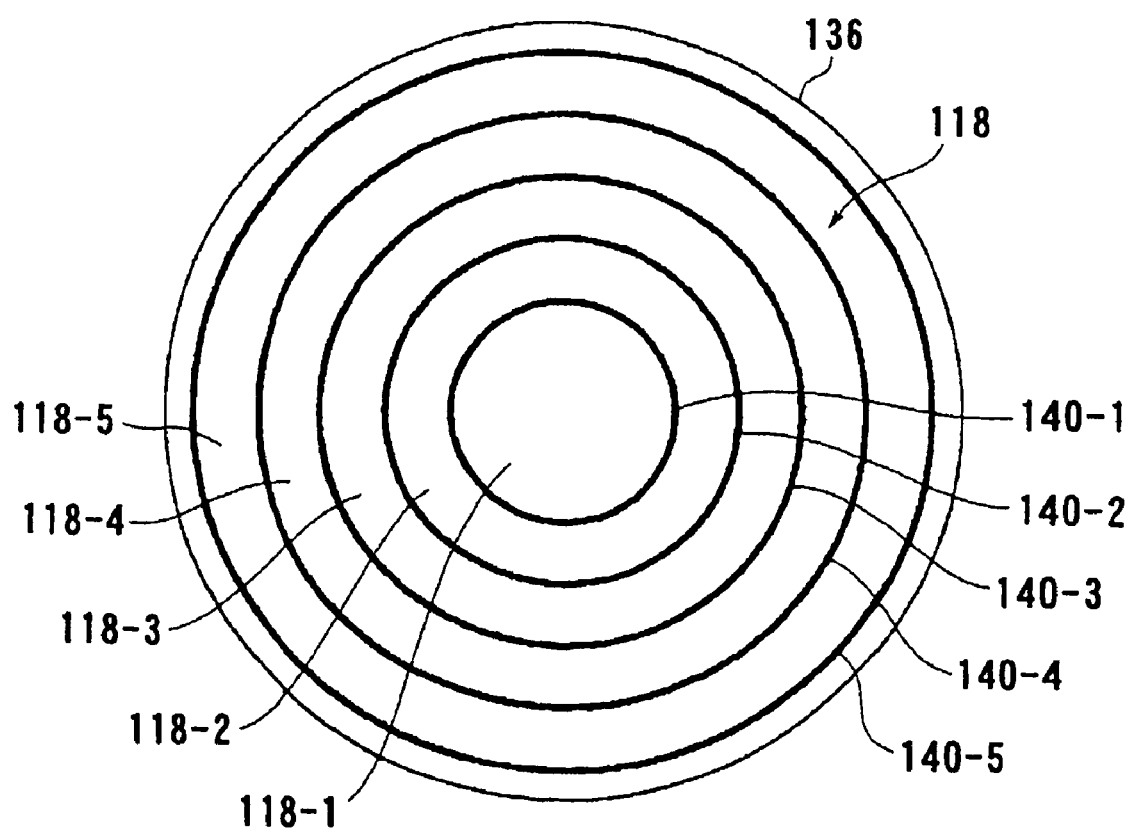
FIG. 11 is a plan view of the electrode holder of the electrolytic processing apparatus of FIG. 10.

The outermost insulator 140-5 is surrounded by a ring-shaped feeding electrode 136. The whole processing electrode parts 118-1 through 118-5, the whole insulators 140-1 through 140-5 and the feeding electrode 136 are formed integrally in a disk shape (see FIG. 11).

According to the electrolytic processing apparatus 50a of this embodiment, a wire 124 connected to the processing electrode 118 and a wire 125 connected to the feeding electrode 136 both pass through a depression 117 formed in the electrode holder 112, a through-hole 119, a hollow passage 120 as a fluid supply section, formed in an electrode-rotating shaft 113 mounted to the electrode holder 112, a hollow portion 142C of a hollow motor 142 mounted to the lower end 113A of the electrode-rotating shaft 113, and through a slip ring 126 mounted to the lower end 142A of the hollow motor 142, and are connected to a power source 123. The slip ring 126 has an electrolytic solution supply inlet 128 to which the electrolytic solution 102 is supplied by a not-shown electrolytic solution supply means.

In FIG. 10, the wire 124 connected to the processing electrode 118 and the wire 125 connected to the feeding electrode 136 are respectively drawn as a single wire, and a single power source 123 is drawn. As shown in FIG. 12, however, the wire 124 is in fact composed of five wires, and each wire 124 is connected to a respective one of the processing electrode parts 118-1 through 118-5. The wire 125 is also composed of five wires, and the respective wires 125 are connected to the feeding electrode 136, the connections being distant from each other. Further, a pair of the wires 124, 125 is connected to separate (five) power sources 123 to form separate circuits.

In a substrate holder 114, there is not formed a depression that forms an interspace between the substrate holder and the substrate W nor a through-hole. A substrate-rotating shaft 115 does not have a hollow passage, and a pivot arm 143 and a pivot shaft 144 each do not have a hollow portion. Further, no slip ring is attached to the pivot arm 143. Further, according to this embodiment, since one feeding electrode 136 is employed, it is sufficient for an ion exchanger 135 to be in contact with at least part of the ring-shaped feeding electrode 136.

Though the electrolytic processing apparatus 50a of this embodiment differs from the electrolytic processing apparatus 50 of the first embodiment in the above-described respects, the other construction is the same.

The operation of the electrolytic processing apparatus 50a of this embodiment is the same as the electrolytic processing apparatus 50 of the first embodiment, except that the substrate W does not function as a feeding electrode and, in addition, the provision of the ring-shaped feeding electrode 136 outside of the processing electrode 118 and the division of the processing electrode 118 by the ring-shaped insulators 140-1 through 140-5 operate differently.

According to the electrolytic processing apparatus 50a of this embodiment, the processing electrode 118 is composed of the processing electrode parts 118-1 through 118-5 that are divided by the ring-shaped insulators 140-1 through 140-5, each of the processing electrode parts 118-1 through 118-5 and the feeding electrode 136 forms a separate circuit, and at least one of the voltage and the electric current supplied between each of the processing electrode parts 118-1 through 118-5 and the feeding electrode 136 is controlled separately. Accordingly, voltages can be applied between the processing electrodes 118-1 through 118-5 and the feeding electrode 136 in such a state that the same intensity of electric current can flow over the entire surface of the processing electrode 118. This can equalize the supply of hydroxide ions to the lower surface WA of the substrate W to equalize the hydroxide ion concentration over the entire lower surface WA, thereby equalizing the processing rate over the entire lower surface WA of the substrate W. Since the substrate W is not utilized as a feeding electrode and the feeding electrode 136 is provided according to this embodiment, electrolytic processing of a conductive material in the surface of the substrate W can be carried out not only when the surface of the substrate W is formed of a conductive material, but when the substrate W is formed of a non-conductive material.

Figure 13:
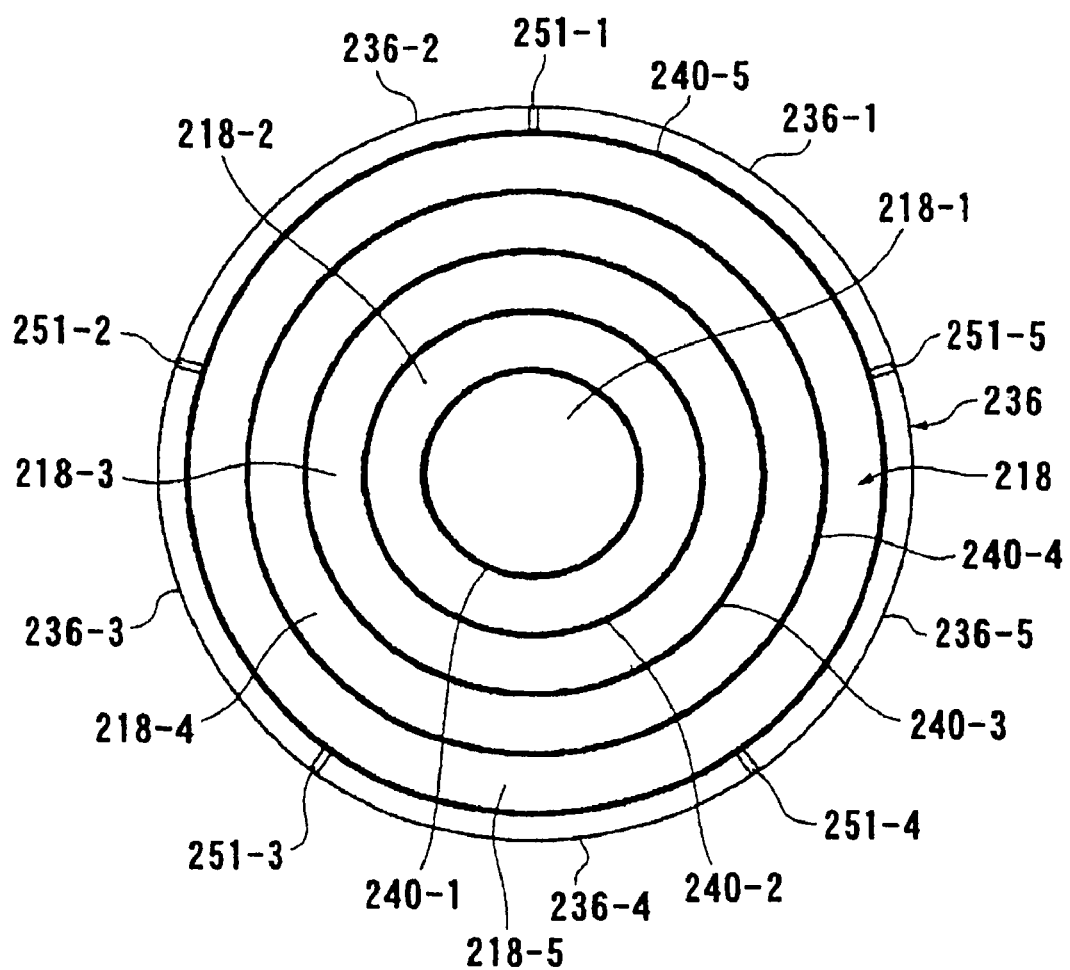
FIG. 13 is a plan view showing the processing electrode and the feeding electrode of an electrolytic processing apparatus according to a third embodiment of the present invention.

In the electrolytic processing apparatus 50a of this embodiment, instead of the feeding electrode 136, the following feeding electrode 236 may be employed:

As shown in FIG. 13, the feeding electrode 236 is provided with five insulators 251-1 through 251-5, so that it is divided into five feeding electrode parts 236-1 through 236-5. The feeding electrode parts 236-1 through 236-5 are each connected to a wire 225 (see FIG. 14), respectively.

As shown in FIG. 14, the respective wires 224 connected to the respective processing electrode parts 218-1 through 218-5 and the respective wires 225 connected to the respective feeding electrode parts 236-1 through 236-5 are connected to separate power sources 223 to form separate circuits.

In the case of this embodiment, since the feeding electrode 236 are separated by the insulators 251-1 through 251-5, it is necessary for the substrate W (not shown in FIG. 14) to be in contact with the entire surface of the processing electrode 218 and of the feeding electrode 236.

In the above-described first to third embodiments, the center of the substrate meets the center of the processing electrode, and the substrate and the processing electrode, having the same size, are rotated in opposite directions. This facilitates zone control. On the other hand, however, the shape of the electrode or of the ion exchanger can be transferred to the to-be-processed surface of the substrate, resulting in formation of a rut-like pattern on the substrate surface. It is therefore preferred to carry out, in addition to rotation, a certain degree of other movement such as a scroll movement (orbital movement without self-rotation) or a small-distance reciprocating movement. The term "zone" herein refers to a partial region of the surface of a substrate, and the term "zone control" refers to control of the processing rates at various zones effected by independent control of at least one of the voltage and the electric current supplied between each of the processing electrode parts and the feeding electrode (or feeding electrode parts) to obtain a desired processing rate distribution.

Figure 15:
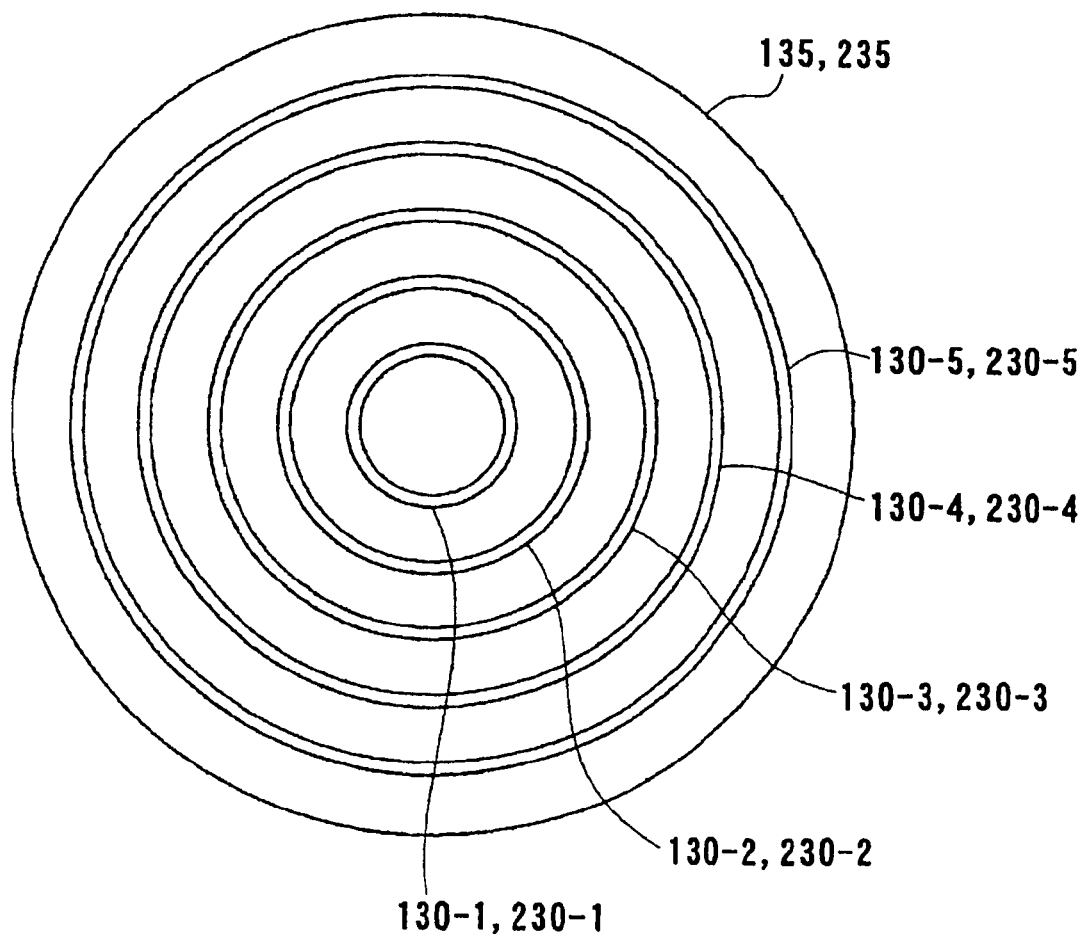
FIG. 15 is a plan view illustrating a case of division of an ion exchanger.

In the above-described second and third embodiments, as in the cases of the processing electrodes 118 (see FIG. 11), 218 (see FIG. 13), the ion exchangers 135, 235 may be divided by ring-shaped insulators 130-1 through 130-5, 230-1 through 230-5, having the same plan shape as the insulators 140-1 through 140-5 (see FIG. 13), 240-1 through 240-5 (see FIG. 13), into a central circular part and outer ring-shaped parts, as shown in FIG. 15. Some of the five insulators 130-1 through 130-5, 230-1 through 230-5 may be omitted, thereby reducing the number of divided parts of the ion exchangers 135, 235 from 6 to 1-5. It is of course possible to divide the ion exchangers 135, 235 into 7 or more parts.

In FIGS. 11 through 14, a depiction of a through-hole formed in the ion exchanger is omitted.

A substrate processing apparatus 260, which is provided with the above-described electrolytic processing apparatus 50, will now be described with reference to FIG. 16, taking the electrolytic processing apparatus 50 as an example and referring to FIG. 7 as necessary. As shown in FIG. 16, the substrate processing apparatus 260 includes a pair of loading/unloading sections 262 as a carry-in-and-out section for carrying in and out a substrate W, a reversing machine 264 for reversing the substrate W, and the electrolytic processing apparatus 50, which are disposed in series. A transfer robot 268a as a transfer device moves parallel with these equipments for transfer and delivery of the substrate W.

The substrate processing apparatus 260 is also provided with a controller 266 which, when carrying out electrolytic processing by the electrolytic processing apparatus 50, monitors the voltage applied between the processing electrode 18 (see FIG. 7) and the substrate (feeding electrode) W (see FIG. 7) or the electric current flowing therebetween, and controls at least one of the voltage and the electric current between each of the processing electrode parts 18-1 through 18-7 (see FIG. 7) and the substrate (feeding electrode) w independently. The substrate processing apparatus 260, with the provision of the above-described electrolytic processing apparatus 50, can equalize the processing rate in electrolytic processing of the substrate W over the entire lower surface WA (see FIG. 7) and produce a processed substrate W with a highly flat (within substrate uniformity) surface WA.

According to the embodiments, as described hereinabove, a processing electrode and a feeding electrode are provided, at least one of the processing electrode and the feeding electrode is electrically divided into a plurality of parts, and, for each of the divided electrode parts, at least one of the voltage and the electric current can be controlled independently. Accordingly, the present invention makes it possible to improve evenness of the electric field intensity over the entire to-be-processed surface of a workpiece, thereby improving evenness of the processing rate, or control the processing rate at an optimum processing rate distribution for the configuration of the to-be-processed surface before processing, thereby improving evenness of the surface after processing.

Figure 17:
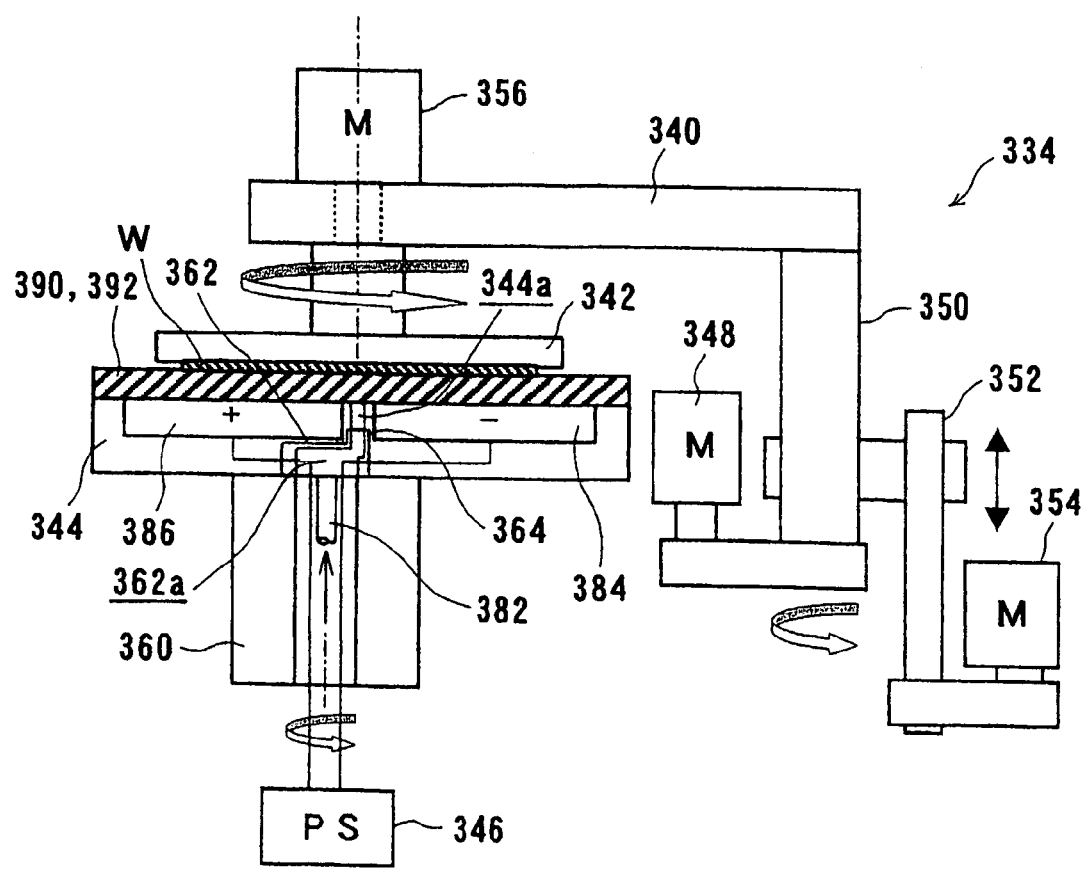
FIG. 17 is a cross-sectional view schematically showing an electrolytic processing apparatus according to a fourth embodiment of the present invention.

FIG. 17 is a vertical sectional view schematically showing the electrolytic processing apparatus 334 according to a fourth embodiment of the present invention. As shown in FIG. 17, the electrolytic processing apparatus 334 includes a pivot arm 340 that can pivot horizontally and move vertically, a substrate holder 342, supported at the free end of the pivot arm 340, for attracting and holding the substrate W with its front surface facing downward (face-down), a disk-shaped electrode section 344 positioned beneath the substrate holder 342, and a power source 346 connected to the electrode section 344. In this embodiment, the size of the electrode section 344 is designed to have a slightly larger diameter than the diameter of the substrate W to be held by the substrate holder 342.

The pivot arm 340, which pivots horizontally by the actuation of a motor 348 for pivoting, is connected to the upper end of a pivot shaft 350. The pivot shaft 350, which moves up and down integrated with the pivot arm 340 via a ball screw 352 by the actuation of a motor 354 for vertical movement, is engaged with the ball screw 352 that extends vertically.

The substrate holder 342 is connected to a rotating motor 356 as a first drive element that is allowed to move the substrate W held by a substrate holder 342 and the electrode section 344 relatively to each other. The substrate holder 342 is rotated by the actuation of the rotating motor 356. The pivot arm 340 can pivot horizontally and move vertically, as described above, the substrate holder 342 can pivot horizontally and move vertically integrated with the pivot arm 340.

The hollow motor 360 as a second drive element that is allowed to move the substrate W and the electrode section 344 relatively to each other is disposed below the electrode section 344. A drive end 364 is formed at the upper end portion of the main shaft 362 and arranged eccentrically position to the center of the main shaft 362. The electrode section 344 is rotatably coupled to the drive end 364 via a bearing (not shown) at the center portion thereof. Three or more of rotation-prevention mechanisms are provided in the circumferential direction between the electrode section 344 and the hollow motor 360.

Figure 18A:
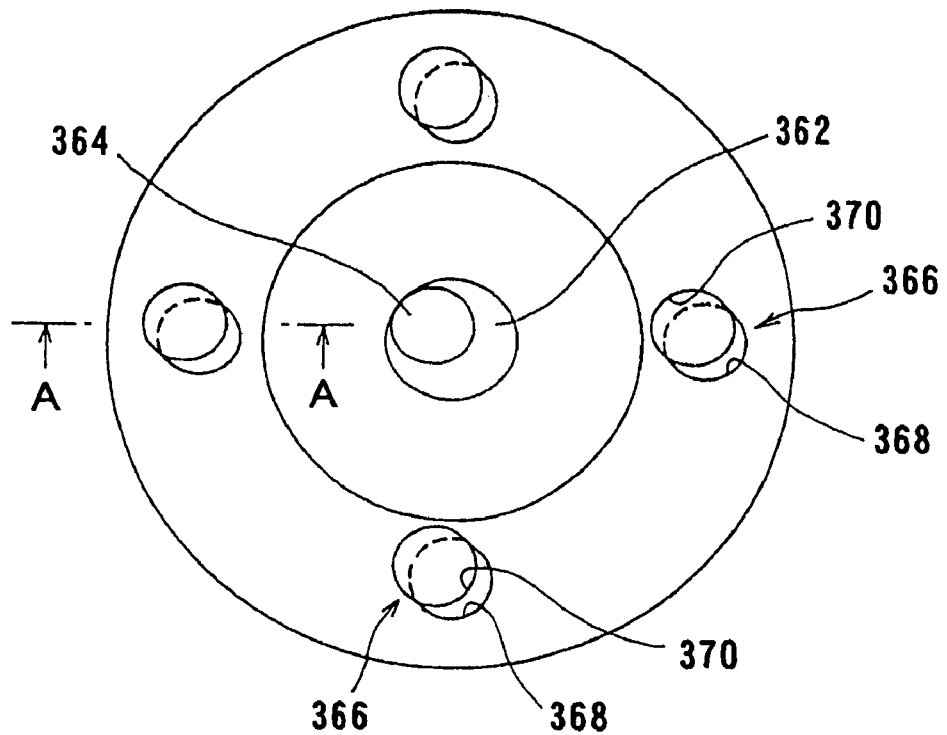
FIG. 18A is a plan view showing the rotation-preventing mechanism of the electrolytic processing apparatus of FIG. 17.
Figure 18B:
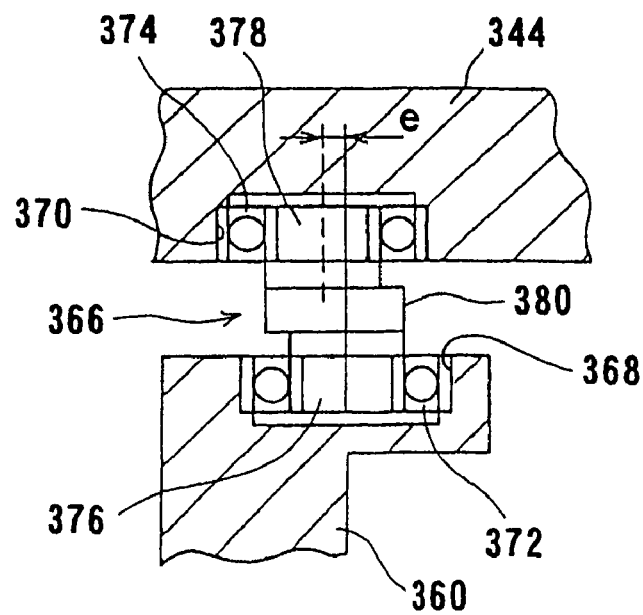
FIG. 18B is a sectional view taken along the line A-A of FIG. 18A.

FIG. 18A is a plan view showing the rotation-prevention mechanisms of this embodiment, and FIG. 18B is a cross-sectional view taken along the line A-A of FIG. 18A. As shown in FIGS. 18A and 18B, three or more (four in FIG. 18A) of rotation-prevention mechanisms 366 are provided in the circumferential direction between the electrode section 344 and the hollow motor 360. As shown in FIG. 18B, a plurality of depressions 368, 370 are formed at equal intervals in the circumferential direction at the corresponding positions in the upper surface of the hollow motor 360 and in the lower surface of the electrode section 344. Bearings 372, 374 are fixed in each depression 368, 370, respectively. A connecting member 380, which has two shafts 376, 378 that are eccentric to each other by eccentricity "e", is coupled to each pair of the bearings 372, 374 by inserting the respective ends of the shafts 376, 378 into the bearings 372, 374. The eccentricity of the drive end 364 against to the center of the main shaft 362 is also "e". Accordingly, the electrode section 344 is allowed to make a revolutionary movement with the distance between the center of the main shaft 362 and the drive end 364 as radius "e", without rotation about its own axis, i.e. the so-called scroll movement (translational rotation movement) by the actuation of the hollow motor 360.

As shown in FIG. 17, a through-hole 344a as a pure water supply section for supplying pure water, preferably ultrapure water, is formed in the central portion of the electrode section 344. The through-hole 344a is connected to a pure water supply pipe 382 that vertically extends inside the hollow motor 360, via a through hole 362a formed in the main shaft 362. Thus, pure water or ultrapure water is supplied to the upper surface of the electrode section 344.

Figure 19:
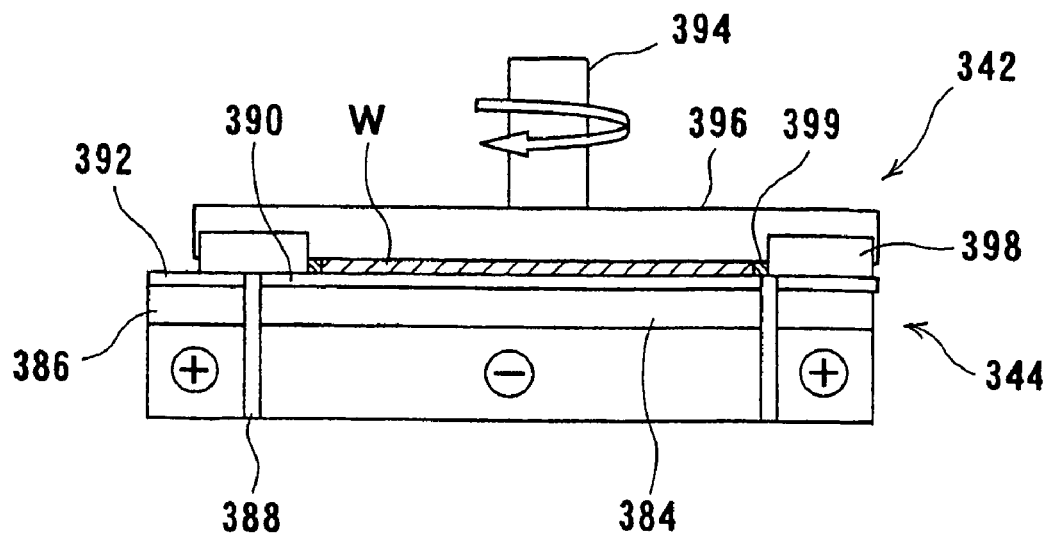
FIG. 19 is a cross-sectional view schematically showing the substrate holder and the electrode section of the electrolytic processing apparatus of FIG. 17.
Figure 20:
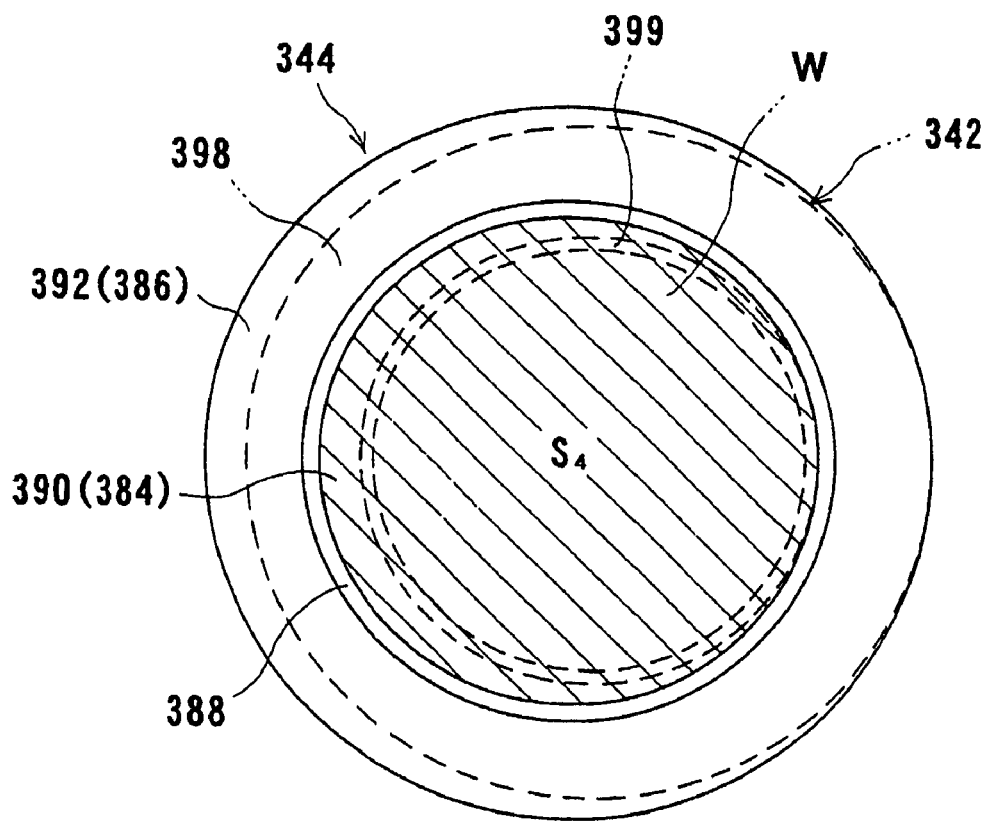
FIG. 20 is a plan view showing the relationship between the substrate holder and the electrode section of FIG. 17.

FIG. 19 is a vertical sectional view schematically showing the substrate holder 342 and the electrode section 344, and FIG. 20 is a plan view showing the relationship between the substrate holder 342 and the electrode section 344. In FIG. 20, the substrate holder 342 is shown with the broken lines. As shown in FIGS. 19 and 20, the electrode section 344 includes a disk-shaped processing electrode 384, a ring-shaped feeding electrode 386 that surrounds the processing electrode 384, and a ring-shaped insulator 388 that separates the processing electrode 384 from the feeding electrode 386. The upper surface of the processing electrode 384 is covered with an ion exchanger 390 and the upper surface of the feeding electrode 386 is covered with an ion exchanger 392, respectively. The ion exchangers 390, 392 are separated from each other by the insulator 388.

According to this embodiment, the processing electrode 384 is connected to the cathode of the power source 346, and the feeding electrode 386 is connected to the anode of the power source 346. Depending upon a material to be processed, the electrode connected to the cathode of the power source 346 can be a feeding electrode and the electrode connected to the anode of the power source 346 can be a processing electrode. More specifically, when the material to be processed is copper, molybdenum, iron or the like, electrolytic processing proceeds on the cathode side, and therefore the electrode connected to the cathode of the power source 346 should be the processing electrode and the electrode connected to the anode of the power source 346 should be the feeding electrode. In the case of aluminum, silicon or the like, on the other hand, electrolytic processing proceeds on the anode side. Accordingly, the electrode connected to the anode of the power source 346 should be the processing electrode and the electrode connected to the cathode of the power source 346 should be the feeding electrode.

As shown in FIG. 19, the substrate holder 342 includes a shaft 394 connected to a rotating motor 356, a body 396 coupled to the shaft 394, an annular dummy member 398 disposed outside of the periphery of the substrate W, and an annular buffering member (cushioning material) 399 disposed between the dummy member 398 and the substrate W. At least the front surface of the dummy member 398 is formed of an electrically conductive material. The apparatus is so designed that when the substrate W is rotated and, at the same time, the electrode section 386 is allowed to make a scroll movement while the substrate W is closed to or in contact with the ion exchangers 390, 392, part of the dummy member 398 is always positioned above the feeding electrode 386 and the processing electrode 384.

As a material for the conductive portion of the dummy member 398, it is possible to use, besides the conventional metals and metal compounds, carbon, relatively inactive noble metals, conductive oxides or conductive ceramics. Electrochemically inactive materials are preferred. When an electrochemically inactive material is employed for the dummy member 398, the dummy member 398 is not processed, and therefore the life of the dummy member 398 can be prolonged. It is also possible to use as the dummy member 398 an insulating substrate, e.g. of a resin, coated with a conductive material, for example, a substrate whose surface is covered with a hardly oxidative material such as platinum or with a conductive oxide such as iridium oxide. Such a dummy member can be produced by attaching platinum or iridium to the surface of e.g. a titanium substrate by coating or plating, and then carrying out sintering at a high temperature to stabilize and strengthen the product. Ceramics products, in general, are obtained by heat treatment of an inorganic starting material, and ceramics products with a variety of properties are now commercially produced using various materials including oxides, carbides and nitrides of metals and nonmetals, among which are ceramics having an electric conductivity.

The buffering member 399, disposed between the dummy member 398 and the substrate W, is formed of a material having a lower hardness than the dummy member 398, and can absorb a shock to the substrate W. Though the buffering member 399 may be an insulator, it is preferably an electric conductor.

Figure 1A:
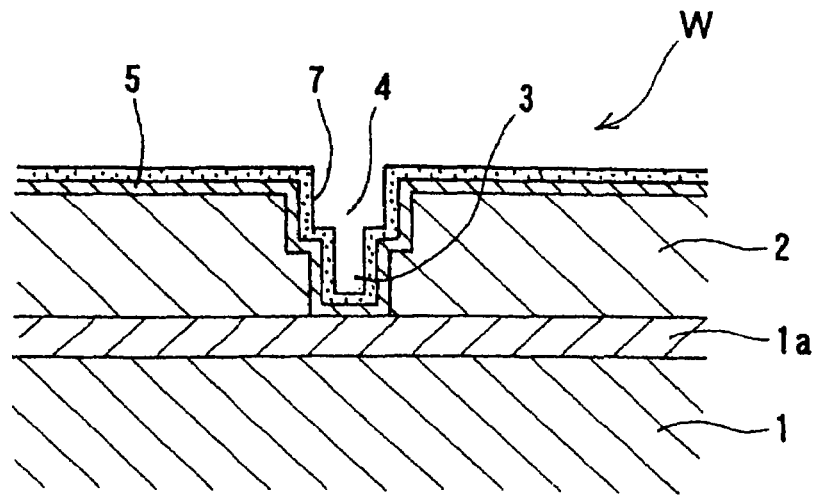
FIGS. 1A through 1C are diagrams illustrating, in sequence of process steps, an example of the formation of copper interconnects.
Figure 1B:
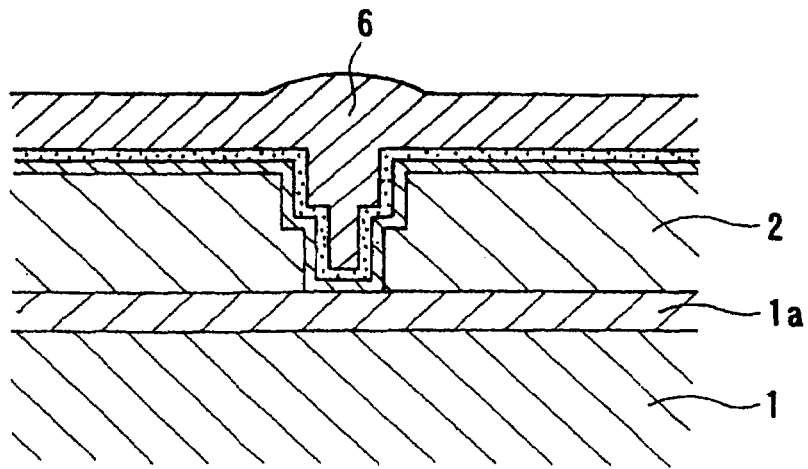
Figure 1C:
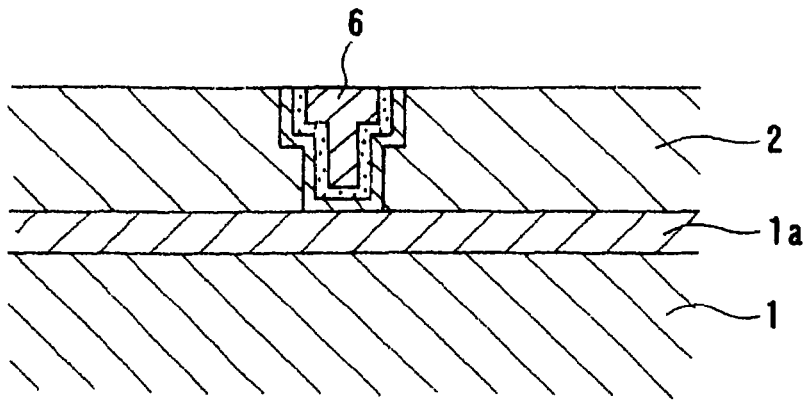
Figure 3:
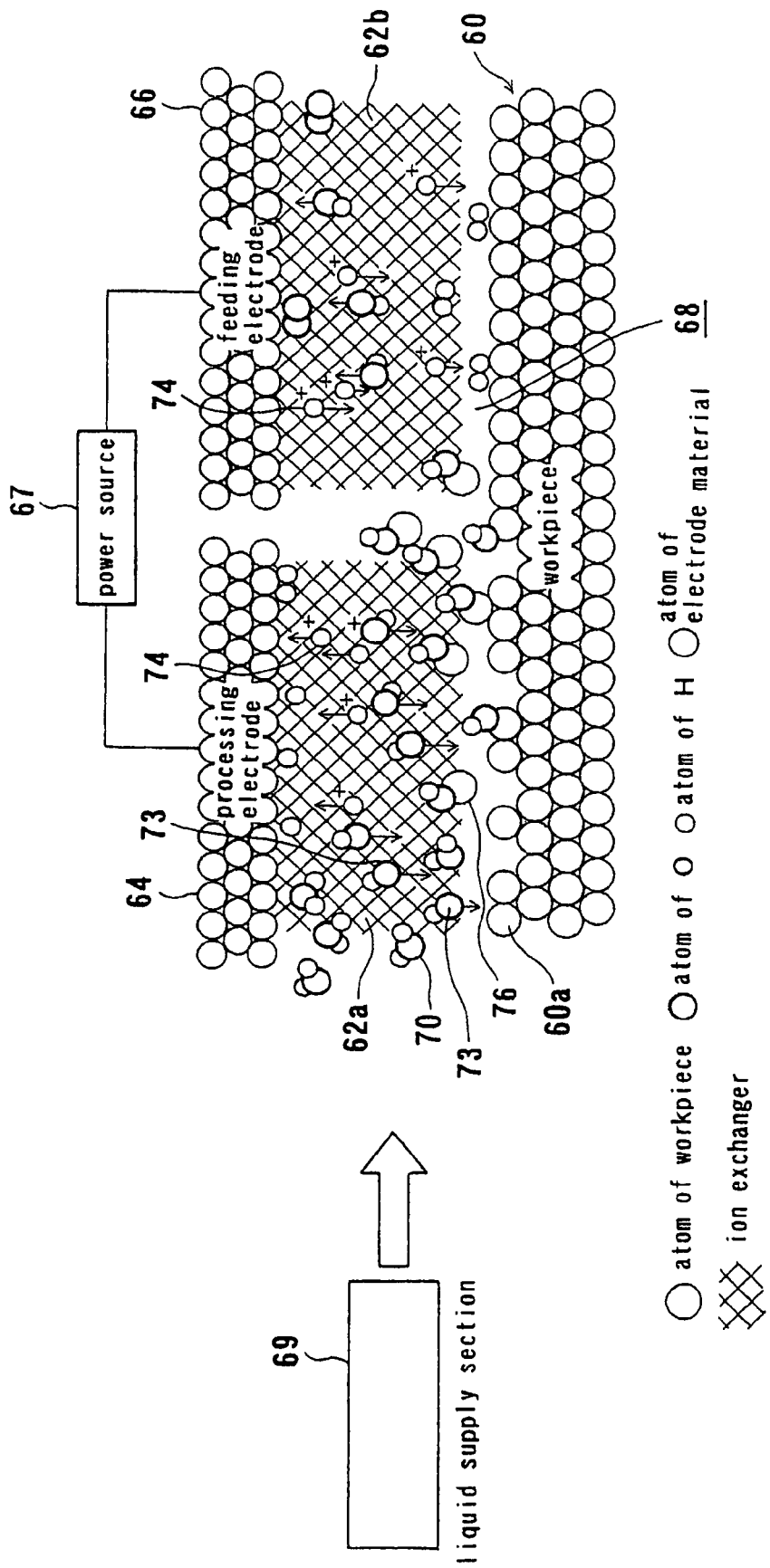
FIG. 3 is a diagram illustrating the principle of electrolytic processing according to the present invention as carried out by allowing a processing electrode and a feeding electrode, both having an ion exchanger mounted thereon, to be close to or into contact with a substrate (workpiece), and supplying a liquid between the processing and feeding electrodes and the substrate (workpiece)
Figure 4:
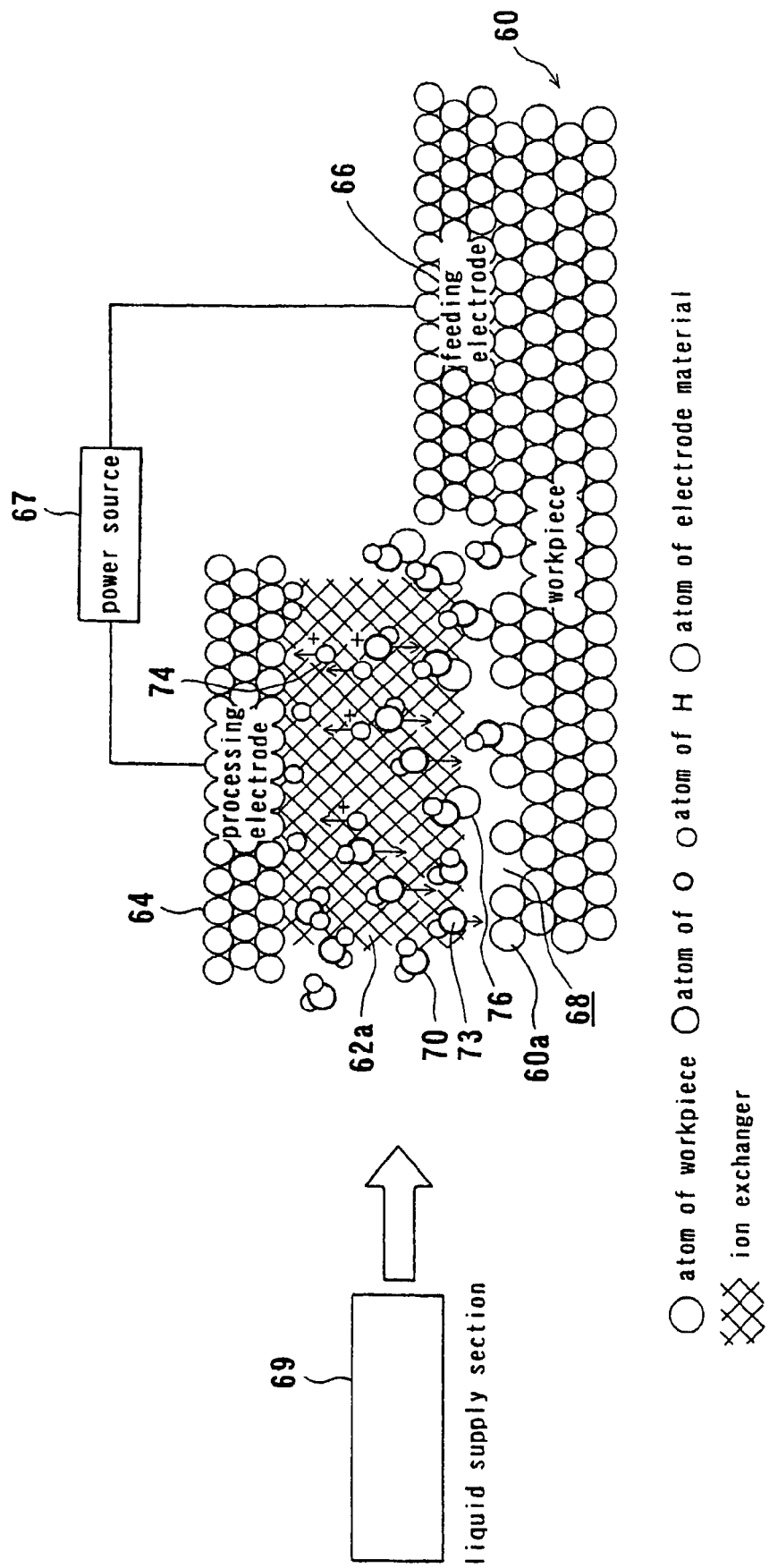
FIG. 4 is a diagram illustrating the principle of electrolytic processing according to the present invention as carried by mounting an ion exchanger only on the processing electrode and supplying a liquid between the processing electrode and the substrate (workpiece)
Figure 5A:
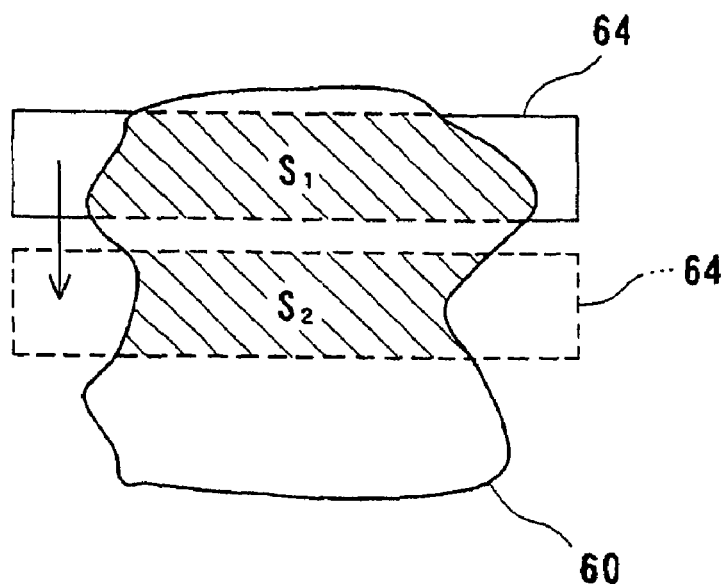
FIG. 5A is a diagram illustrating "face-to-face" area in the case of not providing a dummy member.
Figure 5B:
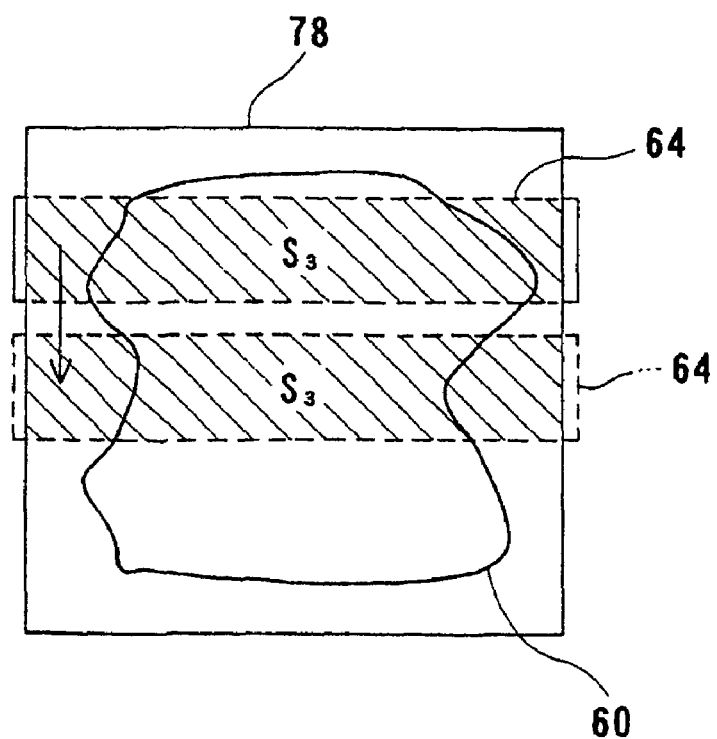
FIG. 5B is a diagram illustrating "face-to-face" area in the case of providing a dummy member.

Next, substrate processing (electrolytic processing) by using the electrolytic processing apparatus 334 of this embodiment instead of the electrolytic processing apparatus 50 of the substrate processing apparatus 260 shown in FIG. 16 will be described. First, a substrate W, e.g. a substrate W as shown in FIG. 1B which has in its surface a copper film 6 as a conductor film (portion to be processed), is taken by the transfer robot 268a out of the cassette housing substrates and set in the loading/unloading unit 262. If necessary, the substrate W is transferred to the reversing machine 264 by the transfer robot 268a to reverse the substrate so that the front surface of the substrate W having the conductor film (copper film 6) faces downward.

The transfer robot 268a receives the reversed substrate W, and transfers it to the electrolytic processing apparatus 334. The substrate W is then attracted and held by the substrate holder 342. The substrate holder 342, which holds the substrate W, is moved by pivoting of the pivot arm 340 to a processing position right above the electrode section 344. The substrate holder 342 is then lowered by the actuation of the motor 354 for vertical movement, so that the substrate W held by the substrate holder 342 and the dummy member 398 contacts or gets close to the surfaces of the ion exchangers 390, 392 of the electrode section 344. Then, the rotating motor (first drive element) 356 is actuated to rotate the substrate W, at the same time, the hollow motor (second drive element) 360 is actuated to make a scroll movement of the electrode section 344, while supplying pure water or ultrapure water to between the substrate W and ion exchangers 390, 392, through the through-hole 344a of the electrode section 344.

Figure 6A:
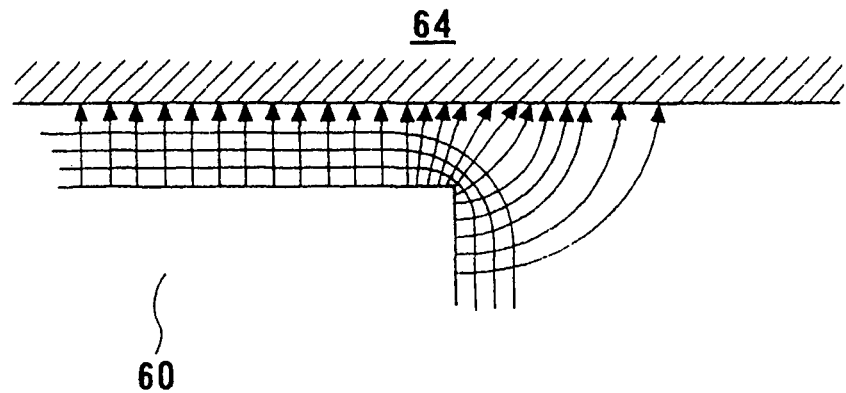
FIG. 6A is a diagram illustrating the electric field intensity in the case of not providing a dummy member.
Figure 6B:
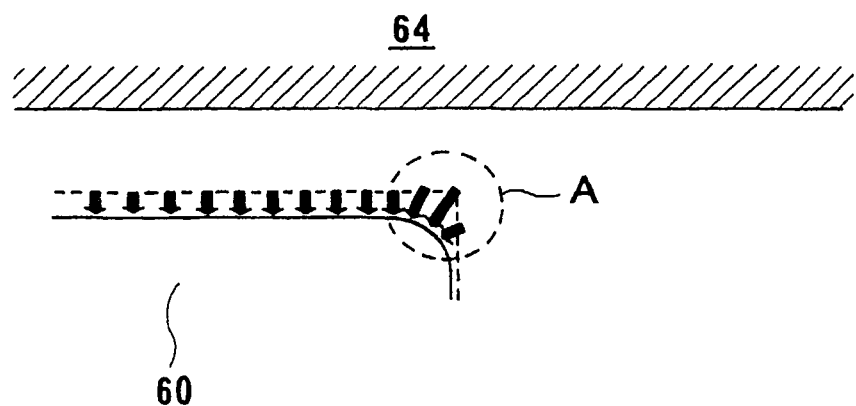
FIG. 6B is a diagram illustrating a workpiece after processing in the case of FIG. 6A.
Figure 6C:
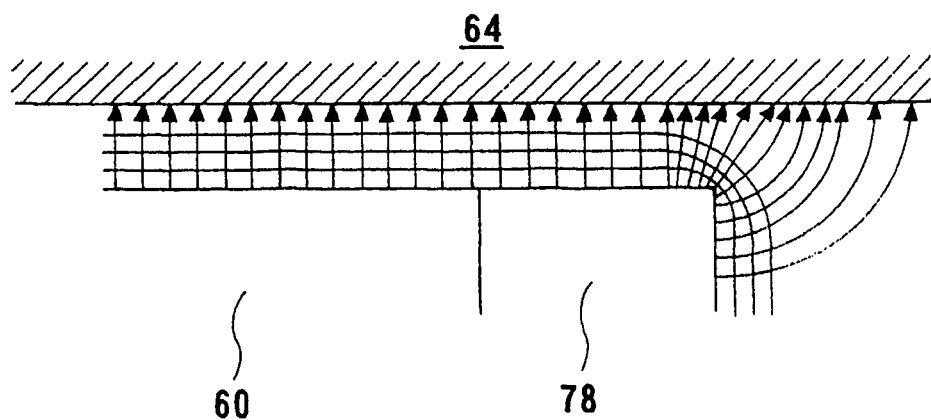
FIG. 6C is a diagram illustrating the electric field intensity in the case of providing a dummy member.

A given voltage is applied from the power source 346 to between the processing electrode 384 and the feeding electrode 386 to carry out electrolytic processing of the conductive film (copper film 6) in the surface of the substrate W at the processing electrode (cathode) 384 through the action of hydrogen ions or hydroxide ions generated with the aid of the ion exchangers 390, 392. The processing progresses at the portion of the substrate facing the processing electrode 384. However, by allowing the substrate W and the processing electrode 384 to make a relative movement as described above, the entire surface of the substrate W can be processed. According to this embodiment, with the provision of the conductive dummy member 398 outside of the periphery of the substrate W, as shown in FIG. 20, the area of the processing electrode 384 facing the substrate W and the dummy member 398, i.e. the face-to-face area, is always constant (shaded area $S_4$) regardless of the relative movement of the substrate W and the processing electrode 384. Accordingly, the current density can be made always constant even with a constant current value, making it possible to equalize the processing rate over the entire surface of the substrate W and carry out a uniform processing stably. Further, since concentration of the electric field intensity occurs at the dummy member 398, the electric field intensity at the end portion of the substrate W can be made the same as in the other portion. Accordingly, as shown in FIG. 6C, the electric field intensity can be made even over the entire surface of the workpiece 60, making it possible to equalize the processing rate over the entire surface of the workpiece 60 and carry out a uniform processing stably. By forming the dummy member 398 by an electrochemically inactive material, the dummy member 398 can be prevented from being processed, together with the substrate W, during electrolytic processing.

The controller 266 (see FIG. 16) monitors the voltage applied between the processing electrode and the feeding electrode or the electric current flowing therebetween to detect the end point (terminal of processing). It is noted in this connection that in electrolytic processing an electric current (applied voltage) varies, depending upon the material to be processed, even with the same voltage (electric current). For example, as shown in FIG. 21A, when an electric current is monitored in electrolytic processing of the surface of a substrate W to which a film of material B and a film of material A are laminated in this order, a constant electric current is observed during the processing of material A, but it changes upon the shift to the processing of the different material B. Likewise, as shown in FIG. 21B, though a constant voltage is applied between the processing electrode and the feeding electrode during the processing of material A, the voltage applied changes upon the shift to the processing of the different material B. FIG. 21A illustrates, by way of example, a case in which an electric current is harder to flow in electrolytic processing of material B compared to electrolytic processing of material A, and FIG. 21B illustrates a case in which the applied voltage becomes higher in electrolytic processing of material B compared to electrolytic processing of material A. As will be appreciated from the above-described example, the monitoring of changes in electric current or in voltage can surely detect the end point.

Though this embodiment shows the case where the controller 266 monitors the voltage applied between the processing electrode and the feeding electrode, or the electric current flowing therebetween to detect the end point of processing, it is also possible to allow the controller 266 to monitor a change in the state of the substrate being processed to detect an arbitrarily set end point of processing. In this case, "the end point of processing" refers to a point at which a desired processing amount is attained for a specified region in a surface to be processed, or a point at which an amount corresponding to a desired processing amount is attained in terms of a parameter correlated with a processing amount for a specified region in a surface to be processed. By thus arbitrarily setting and detecting the end point of processing even in the middle of processing, it becomes possible to conduct a multi-step electrolytic processing.

For example, the processing amount may be determined by detecting the change of frictional force due to a difference of friction coefficient produced when the processing surface reaches a different material, or the change of frictional force produced by removal of irregularities in the surface of the substrate. The end point of processing may be detected based on the processing amount thus determined. During electrolytic processing, heat is generated by the electric resistance of the to-be-processed surface, or by collision between water molecules and ions that migrate in the liquid (pure water) between the processing surface and the to-be-processed surface. When processing e.g. a copper film deposited on the surface of a substrate under a controlled constant voltage, with the progress of electrolytic processing and a barrier layer and an insulating film becoming exposed, the electric resistance increases and the current value decreases, and the heat value gradually decreases. Accordingly, the processing amount may be determined by detecting the change of the heat value. The end point of processing may therefore be detected. Alternatively, the film thickness of a to-be-processed film on a substrate may be determined by detecting the change in the intensity of reflected light due to a difference of reflectance produced when the processing surface reaches a different material. The end point of processing may be detected based on the film thickness thus determined. The film thickness of a to-be-processed film on a substrate may also be determined by generating an eddy current within a to-be-processed conductive film, e.g. a copper film, and monitoring the eddy current flowing within the substrate to detect change of e.g. the frequency. The end point of processing may thus be detected. Further, in electrolytic processing, the processing rate depends on the value of the electric current flowing between the processing electrode and the feeding electrode, and the processing amount is proportional to the quantity of electricity, determined as the product of the current value and the processing time. Accordingly, the processing amount may be determined by integrating the quantity of electricity, determined as the product of the current value and the processing time, and detecting that the integrated value reaches a predetermined value. The end point of processing may thus be detected.

After completion of the electrolytic processing, the power source 346 is disconnected, and the rotation of the substrate holder 342 and the scroll movement of the electrode section 344 are stopped. Thereafter, the substrate holder 342 is raised, and substrate W is transferred to the transfer robot 268a after pivoting the pivot arm 340. The transfer robot 268a takes the substrate W from the substrate holder 344 and, if necessary, transfers the substrate W to the reversing machine 264 for reversing it, and then returns the substrate W to the cassette in the loading/unloading unit 262.

Pure water, which is supplied between the substrate W and the ion exchangers 390, 392 during electrolytic processing, herein refers to a water having an electric conductivity of not more than 10 μS/cm, and ultrapure water refers to a water having an electric conductivity of not more than 0.1 μS/cm. The use of pure water or ultrapure water containing no electrolyte upon electrolytic processing can prevent impurities such as an electrolyte from adhering to and remaining on the surface of the substrate W. Further, copper ions or the like dissolved during electrolytic processing are immediately caught by the ion exchanger 390, 392 through the ion-exchange reaction. This can prevent the dissolved copper ions or the like from re-precipitating on the other portions of the substrate W, or from being oxidized to become fine particles which contaminate the surface of the substrate W.

It is possible to use, instead of pure water or ultrapure water, a liquid having an electric conductivity of not more than 500 μS/cm, for example, an electrolytic solution obtained by adding an electrolyte to pure water or ultrapure water. The use of such an electrolytic solution can further lower the electric resistance and reduce the power consumption. A solution of a neutral salt such as NaCl or $Na_2SO_4$, a solution of an acid such as HCl or $H_2SO_4$, or a solution of an alkali such as ammonia, may be used as the electrolytic solution, and these solutions may be selectively used according to the properties of the workpiece.

Further, it is also possible to use, instead of pure water or ultrapure water, a liquid obtained by adding a surfactant or the like to pure water or ultrapure water, and having an electric conductivity of not more than 500 μS/cm, preferably not more than 50 μS/cm, more preferably not more than 0.1 μS/cm (resistivity of not less than 10 MΩ·cm). Due to the presence of a surfactant in pure water or ultrapure water, the liquid can form a layer, which functions to inhibit ion migration evenly, at the interface between the substrate W and the ion exchangers 390, 392, thereby moderating concentration of ion exchange (metal dissolution) to enhance the flatness of the processed surface. The surfactant concentration is desirably not more than 100 ppm. When the value of the electric conductivity is too high, the current efficiency is lowered and the processing rate is decreased. The use of the liquid having an electric conductivity of not more than 500 μS/cm, preferably not more than 50 μS/cm, more preferably not more than 0.1 μS/cm, can attain a desired processing rate.

The ion exchangers 390, 392 of the electrode section 344 may be composed of a nonwoven fabric which has an anion-exchange group or a cation-exchange group. A cation exchanger preferably carries a strongly acidic cation-exchange group (sulfonic acid group); however, a cation exchanger carrying a weakly acidic cation-exchange group (carboxyl group) may also be used. Though an anion exchanger preferably carries a strongly basic anion-exchange group (quaternary ammonium group), an anion exchanger carrying a weakly basic anion-exchange group (tertiary or lower amino group) may also be used.

The nonwoven fabric carrying a strongly basic anion-exchange group can be prepared by, for example, the following method: A polyolefin nonwoven fabric having a fiber diameter of 20-50 μm and a porosity of about 90% is subjected to the so-called radiation graft polymerization, comprising γ-ray irradiation onto the nonwoven fabric and the subsequent graft polymerization, thereby introducing graft chains; and the graft chains thus introduced are then aminated to introduce quaternary ammonium groups thereinto. The capacity of the ion-exchange groups introduced can be determined by the amount of the graft chains introduced. The graft polymerization may be conducted by the use of a monomer such as acrylic acid, styrene, glicidyl methacrylate, sodium styrenesulfonate or chloromethylstyrene. The amount of the graft chains can be controlled by adjusting the monomer concentration, the reaction temperature and the reaction time. Thus, the degree of grafting, i.e. the ratio of the weight of the nonwoven fabric after graft polymerization to the weight of the nonwoven fabric before graft polymerization, can be made 500% at its maximum. Consequently, the capacity of the ion-exchange groups introduced after graft polymerization can be made 5 meq/g at its maximum.

The nonwoven fabric carrying a strongly acidic cation-exchange group can be prepared by the following method: As in the case of the nonwoven fabric carrying a strongly basic anion-exchange group, a polyolefin nonwoven fabric having a fiber diameter of 20-50 μm and a porosity of about 90% is subjected to the so-called radiation graft polymerization comprising γ-ray irradiation onto the nonwoven fabric and the subsequent graft polymerization, thereby introducing graft chains; and the graft chains thus introduced are then treated with a heated sulfuric acid to introduce sulfonic acid groups thereinto. If the graft chains are treated with a heated phosphoric acid, phosphate groups can be introduced. The degree of grafting can reach 500% at its maximum, and the capacity of the ion-exchange groups thus introduced after graft polymerization can reach 5 meq/g at its maximum.

The base material of the ion exchangers 390, 392 may be a polyolefin such as polyethylene or polypropylene, or any other organic polymer. Further, besides the form of a nonwoven fabric, the ion-exchanger may be in the form of a woven fabric, a sheet, a porous material, net or short fibers, etc. When polyethylene or polypropylene is used as the base material, graft polymerization can be effected by first irradiating radioactive rays (γ-rays or electron beam) onto the base material (pre-irradiation) to thereby generate a radical, and then reacting the radical with a monomer, whereby uniform graft chains with few impurities can be obtained. When an organic polymer other than polyolefin is used as the base material, on the other hand, radical polymerization can be effected by impregnating the base material with a monomer and irradiating radioactive rays (γ-rays, electron beam or UV-rays) onto the base material (simultaneous irradiation). Though this method fails to provide uniform graft chains, it is applicable to a wide variety of base materials.

By using a nonwoven fabric having an anion-exchange group or a cation-exchange group as the ion exchangers 390, 392, it becomes possible that pure water or ultrapure water, or a liquid such as an electrolytic solution can freely move within the nonwoven fabric and easily arrive at the active points in the nonwoven fabric having a catalytic activity for water dissociation, so that many water molecules are dissociated into hydrogen ions and hydroxide ions. Further, by the movement of pure water or ultrapure water, or a liquid such as an electrolytic solution, the hydroxide ions produced by the water dissociation can be efficiently carried to the surface of the processing electrodes 384, whereby a high electric current can be obtained even with a low voltage applied.

When the ion exchangers 390, 392 have only one of anion-exchange groups and cation-exchange groups, a limitation is imposed on electrolytically processible materials and, in addition, impurities are likely to form due to the polarity. In order to solve this problem, the anion exchanger and the cation exchanger may be superimposed, or the ion exchangers 390, 392 may carry both of an anion-exchange group and a cation-exchange group per se, whereby a range of materials to be processed can be broadened and the formation of impurities can be restrained.

With respect to the electrode, its oxidation or dissolution by the electrolytic reaction usually is a problem. It is therefore preferred to use as an electrode material carbon, a relatively inactive noble metal, a conductive oxide or a conductive ceramic, as in the case of the dummy member 398. An electrode, when oxidized, increases its electric resistance and incurs a rise of the applied voltage. By protecting the surface of an electrode with a hardly oxidative material, such as platinum, or with a conductive oxide, such as iridium oxide, a lowing of the conductivity due to oxidation of the electrode material can be prevented.

Though, in the above-described embodiment, the dummy member 398 is formed of an electrochemically inactive material, it is possible to form the dummy member 398 of the same material as the substrate W. When the dummy member 398 is formed of an electrochemically inactive material, depending upon the material of the dummy member 398, a reaction, which is different from the reaction at the substrate W, can occur at the dummy member 398 whereby uniformity of processing can be impaired. When the dummy member 398 is formed of the same material as the substrate W, on the other hand, the reaction at the dummy member 398 can be made the same as the reaction at the substrate W, improving uniformity of processing.

Figure 22:
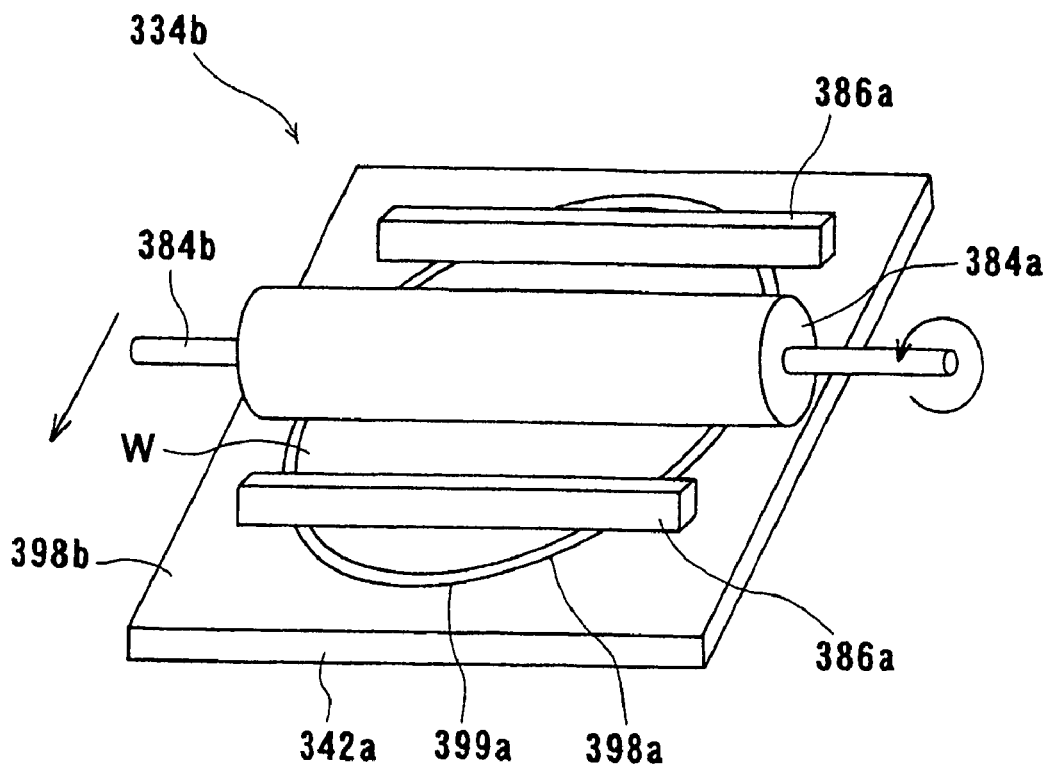
FIG. 22 is a perspective view schematically showing an electrolytic processing apparatus according to a fifth embodiment of the present invention.
Figure 23:
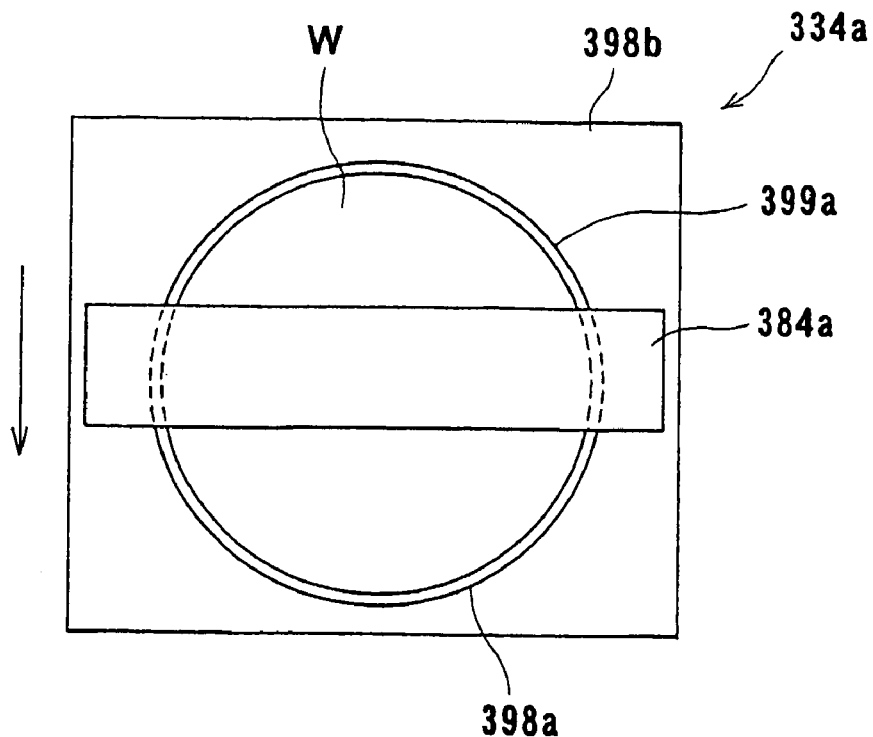
FIG. 23 is a plan view of the electrolytic processing apparatus of FIG. 22.

FIG. 22 is a perspective view schematically showing an electrolytic processing apparatus 334a according to a fifth embodiment of the present invention, and FIG. 23 is a plan view of the electrolytic processing apparatus 334a of FIG. 22. The electrolytic processing apparatus 334a of this embodiment comprises a substrate holder 342a for holding a substrate W with its front surface facing upward, a cylindrical processing electrode 384a disposed above the substrate holder 342a, and two feeding electrodes 386a (not shown in FIG. 23) disposed above the substrate holder 342a. The substrate holder 342a includes a rectangular dummy member 398b having a depression 398a for accommodating the substrate W, and a buffering member 399a disposed between the dummy member 398b and the substrate W.

Each feeding electrode 386a is disposed over the substrate W and the dummy member 398b, and is in contact with both of the substrate W and the dummy member 398b. An ion exchanger is attached to the surface of the processing electrode 384a. The processing electrode 384a can be rotated about a shaft 384b by means of a not-shown drive section. Further, the processing electrode 384a can move over the substrate W while it is close to or in contact with the substrate W.

While supplying pure water or ultrapure water from a not-shown pure water supply section to between the substrate W and the ion exchanger of the processing electrode 384a, the processing electrode 384a, close to or in contact with the substrate W, is moved in one direction by means of the drive section, thereby carrying out electrolytic processing of the surface of the substrate W.

Also in this embodiment, as shown in FIG. 23, the area of the processing electrode 384a facing the substrate W and the dummy member 398b (face-to-face area) is always constant irrespective of the relative movement of the substrate W and the processing electrode 384a. Accordingly, the current density can be made always constant even with a constant current value, making it possible to equalize the processing rate over the entire surface of the substrate W and carry out a uniform processing stably.

As described hereinabove, according to the electrolytic processing apparatuses 334, 334a of the above-described embodiments, unlike a CMP processing, electrolytic processing of a workpiece, such as a substrate, can be effected through electrochemical action without causing any physical defects in the workpiece that would impair the properties of the workpiece. Accordingly, the electrolytic processing apparatuses can omit a CMP treatment entirely or at least reduce a load upon CMP, and can effectively remove (clean) matter adhering to the surface of the workpiece such as a substrate. Furthermore, the electrolytic processing of a substrate can be effected even by solely using pure water or ultrapure water. This obviates the possibility that impurities such as an electrolyte will adhere to or remain on the surface of the substrate, can simplify a cleaning process after the removal processing, and can remarkably reduce a load upon waste liquid disposal.

FIG. 24 is a vertical sectional view schematically showing the electrolytic processing apparatus 434 according to a sixth embodiment of the present invention. As shown in FIG. 24, the electrolytic processing apparatus 434 includes a pivot arm 440 that can pivot horizontally and move vertically, a substrate holder 442, supported at the free end of the pivot arm 440, for attracting and holding the substrate W with its front surface facing downward (face-down), a disk-shaped electrode section 444 positioned beneath the substrate holder 442, and a power source 446 connected to the electrode section 444.

The pivot arm 440, which pivots horizontally by the actuation of a motor 448 for pivoting, is connected to the upper end of a pivot shaft 450. The pivot shaft 450, which moves up and down integrated with the pivot arm 440 via a ball screw 452 by the actuation of a motor 454 for vertical movement, is engaged with the ball screw 452 that extends vertically.

The substrate holder 442 is connected to a rotating motor 456 as a first drive element that is allowed to move the substrate W held by a substrate holder 442 and the electrode section 444 relatively to each other. The substrate holder 442 is rotated by the actuation of the motor 456. The pivot arm 440 can swing horizontally and move vertically, as described above, the substrate holder 442 can pivot horizontally and move vertically integrated with the pivot arm 440.

A hollow motor 460 as a second drive element that is allowed to move the substrate W and the electrode section 444 relatively to each other is disposed below the electrode section 444. A drive end 464 is formed at the upper end portion of the main shaft 462 and arranged eccentrically position to the center of the main shaft 462. The electrode section 444 is rotatably coupled to the drive end 464 via a bearing (not shown) at the center portion thereof. Three or more of rotation-prevention mechanisms are provided in the circumferential direction between the electrode section 444 and the hollow motor 460. Accordingly, the electrode section 444 is allowed to make a revolutionary movement with the distance between the center of the main shaft 462 and the center of the drive end 464 as radius "e" (see FIG. 26), without rotation about its own axis, i.e. the so-called scroll movement (translational rotation movement) by the actuation of the hollow motor 460, as with the electrolytic processing apparatus of the above-described fifth embodiment.

Figure 25:
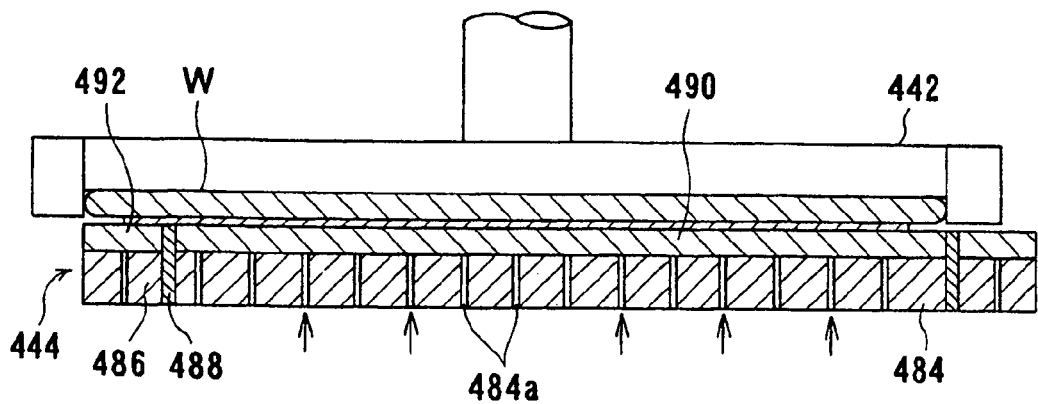
FIG. 25 is a cross-sectional view schematically showing the substrate holder and the electrode section of the electrolytic processing apparatus of FIG. 24.
Figure 26:
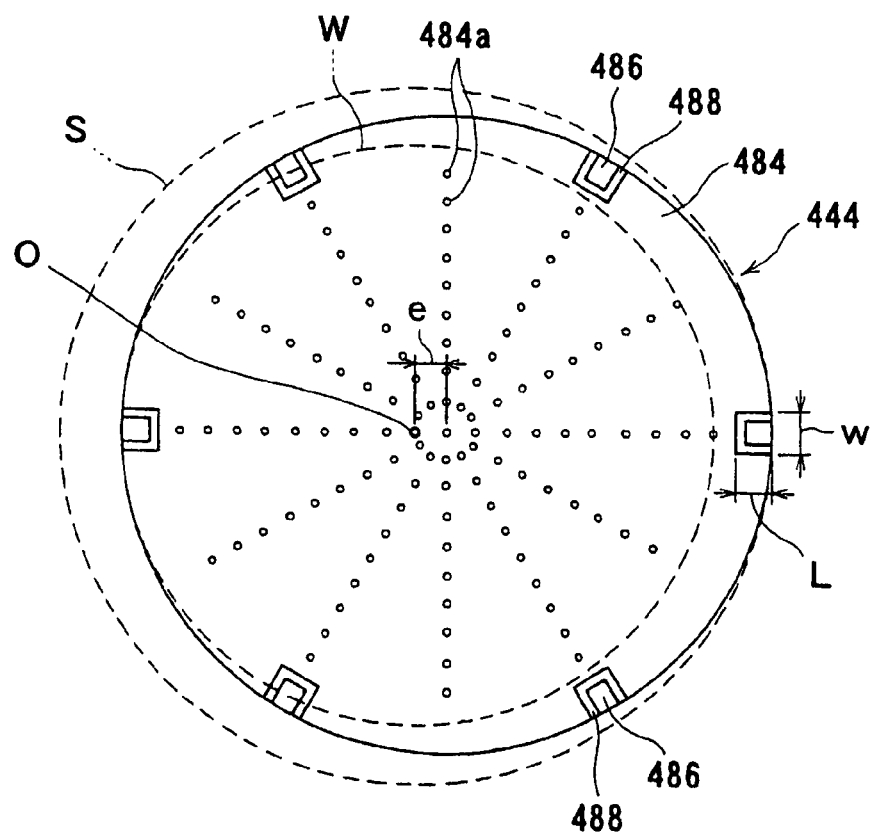
FIG. 26 is a plan view showing the relationship between the electrode section and the substrate of FIG. 25.

FIG. 25 is a schematic sectional view of the substrate holder 442 and the electrode section 444, and FIG. 26 is a plan view showing the relationship between the substrate W and the electrode section 444. In FIG. 26, the substrate W is shown with a broken line. As shown in FIGS. 25 and 26, the electrode section 444 includes a substantially disk-shaped processing electrode 484 having a diameter larger than that of the substrate W, a plurality of feeding electrodes 486 disposed in a peripheral portion of the processing electrode 484, and insulators 488 that separate the processing electrode 484 and the feeding electrodes 486. As shown in FIG. 25, the upper surface of the processing electrode 484 is covered with an ion exchanger 490, and the upper surfaces of the feeding electrodes 486 are covered with ion exchangers 492. The ion exchangers 490 and 492 may be formed integrally. The ion exchangers 490, 492 are not shown in FIG. 26.

According to this embodiment, it is not possible to supply pure water or ultrapure water to the upper surface of the electrode section 444 from above the electrode section 444 during electrolytic processing due to the relationship of the size between the electrode section 444 and the substrate holder 442. Thus, as shown in FIGS. 25 and 26, liquid supply holes 484a, for supplying pure water or ultrapure water to the upper surface of the processing electrode 484, are formed in the processing electrode 484. According to this embodiment, a number of fluid supply holes 484a are disposed radially from the center of the processing electrode 484. The fluid supply holes 484a are connected to a pure water supply pipe 482 (see FIG. 24) that extends through the hollow portion of the hollow motor 460, so that pure water or ultrapure water is supplied through the fluid supply holes 484a to the upper surface of the electrode section 444.

In this embodiment, the processing electrode 484 is connected to the cathode of the power source 446, and the feeding electrodes 486 are connected to the anode of the power source 446. In the case where the to-be-processed material is a conductive oxide such as tin oxide or indium tin oxide (ITO), electrolytic processing is carried out after reducing the to-be-processed material. More specifically, with reference to FIG. 24, the electrode connected to the anode of the power source 446 serve as a reduction electrode and the electrode connected to the cathode serve as a feeding electrode to effect reduction of the conductive oxide. Subsequently, processing of the reduced conductive material is carried out by making the previous feeding electrode serve as the processing electrode. Alternatively, the polarity of the reduction electrode at the time of reduction of the conductive oxide may be reversed so that the reduction electrode can serve as the processing electrode. Removal processing of the conductive oxide may also be effected by making the to-be-processed material serve as a cathode and allowing it to face an anode electrode.

According to the above-described embodiment, though a copper film 6 (see FIG. 1B) as a conductor film formed in the surface of the substrate is processed by electrolytic processing, an unnecessary ruthenium (Ru) film formed on or adhering to the surface of a substrate may be processed (etched and removed) by electrolytic processing in the same manner by making the ruthenium film serve as a anode and the electrode connected to the cathode serve as a feeding electrode.

During electrolytic processing, the rotating motor 456 (first drive element) is driven to rotate the substrate W and, at the same, the hollow motor 460 (second drive element) is driven to allow the electrode section 444 to make a scroll movement about a scroll center "O" (see FIG. 26). By thus allowing the substrate W held by the substrate holder 442 and the processing electrode 484 to make a relative movement within a scroll region S, processing of the whole surface of the substrate W (copper film 6) is effected. The electrolytic processing apparatus 434 of this embodiment is so designed that during the relative movement, the center of movement (center "O" of scroll movement according to this embodiment) always lies within the range of substrate W. By thus making the diameter of the processing electrode 484 larger than the diameter of the substrate W and making the center of movement of the processing electrode 484 always lie within the range of the substrate W, it becomes possible to best equalize the presence frequency of the processing electrode 484 over the surface of the substrate W. It also becomes possible to considerably reduce the size of the electrode section 444, leading to a remarkable downsizing and weight saving of the whole apparatus. It is preferred that the diameter of the processing electrode 484 be larger than the sum of the distance of relative movement of the substrate W and the processing electrode 484 (scroll radius "e" according to this embodiment) and the diameter of the substrate W, and be smaller than twice the diameter of the substrate W.

Since the substrate W cannot be processed with the region where the feeding electrodes 486 are present, the processing rate is low with the peripheral portion in which the feeding electrodes 486 are disposed, compared to the other region. It is therefore preferable to make the area (region) occupied by the feeding electrodes 486 smaller in order to reduce the influence of the feeding electrodes 486 upon the processing rate. From this viewpoint, according to this embodiment, a plurality of feeding electrodes 486 having a small area are disposed in a peripheral portion of the processing electrode 484, and at least one of the feeding electrodes 484 is allowed to come close to or into contact with the substrate W during the relative movement. This makes it possible to reduce an unprocessible region as compared to the case of disposing a ring-shaped feeding electrode in the peripheral portion of the processing electrode 484, thereby preventing a peripheral portion of the substrate W from remaining unprocessed.

In operation of the electrolytic processing apparatus 434, the motor 454 for vertical movement is driven to lower the substrate 442 so as to bring the substrate W held by the substrate holder 442 close to or into contact with the ion exchangers 490, 492 of the electrode section 444. Thereafter, the rotating motor 456 (first drive element) is driven to rotate the substrate W and, at the same time, the hollow motor 460 (second drive element) is driven to allow the electrode section 444 to make a scroll movement about the scroll center "O", while pure water or ultrapure water is supplied from the fluid supply holes 484a of the processing electrode 484 to between the substrate W and the ion exchangers 490, 492.

A given voltage is applied from the power source 446 to between the processing electrode 484 and the feeding electrodes 486 to carry out electrolytic processing of the conductive film (copper film 6) in the surface of the substrate W at the processing electrode (cathode) 484 through the action of hydrogen ions or hydroxide ions generated with the aid of the ion exchangers 490, 492. The processing progresses at the portion of the substrate W facing the processing electrode 484. As described above, by allowing the substrate W and the processing electrode 484 to make the relative movement, the entire surface of the substrate W can be processed. Also as described above, by making the diameter of the processing electrode 484 larger than the diameter of the substrate W and making the center "O" of movement of the processing electrode 484 always lie within the range of the substrate W, it becomes possible to best equalize the presence frequency of the processing electrode 484 over the surface of the substrate W. It also becomes possible to considerably reduce the size of the electrode section 444, leading to a remarkable downsizing and weight saving of the whole apparatus.

As with the above-described fourth embodiment, during the electrolytic processing, the voltage applied between the processing electrode and the feeding electrodes, or the electric current flowing therebetween is monitored by the controller 266 (see FIG. 16) to detect the end point of processing.

Figure 27:
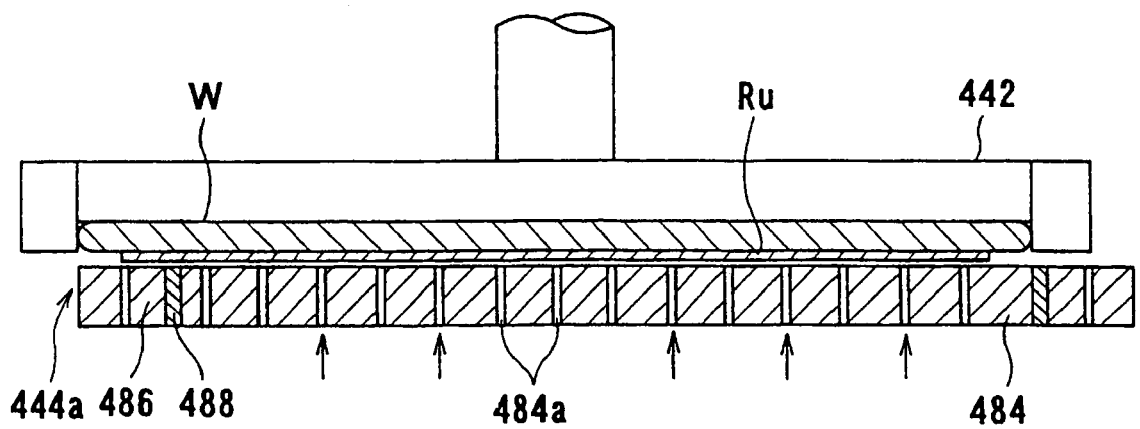
FIG. 27 is a cross-sectional view schematically showing a substrate holder and an electrode according to another embodiment of the present invention.

FIG. 27 is cross-sectional view (corresponding to FIG. 25) schematically showing the substrate holder 442 and an electrode section 444a according to another embodiment of the present invention. As with the above-described embodiment, the electrode section 444a includes a substantially disk-shaped processing electrode 484 having a larger diameter than the diameter of the substrate W, a plurality of feeding electrodes 486 disposed in a peripheral portion of the processing electrode 484, and insulators 488 that separate the feeding electrodes 486 from the processing electrode 484. According to this embodiment, however, the electrodes do not have an ion exchanger on their surfaces. The other construction is the same as the preceding embodiment. Thus, for example, a plurality of fluid supply holes 484a, as a fluid supply section for supplying a processing liquid, such as pure, more preferably ultrapure water or an electrolytic solution, to the processing electrode 484, are disposed radially in the processing electrode 484.

Though, in this embodiment, an ion exchanger is not mounted on the surface of the electrodes, a member other than an ion exchanger may be interposed between the electrodes and a workpiece. For example, a liquid-permeable member, such as a sponge, may be used so that ions can move through a liquid between the electrodes and the workpiece.

When a member is not interposed between the electrodes and a workpiece, it is necessary to predetermine the distance between the workpiece and each electrode and the distance between the processing electrode 484 and each feeding electrode 486, adjacent to each other with the insulator 488 interposed, so that the resistance between the workpiece and each electrode may be smaller than the resistance between the processing electrode 484 and each feeding electrode 486. This allows ions to move preferentially between the electrodes and the workpiece rather than between the adjacent electrodes, so that the electric current flows preferentially as follows:

feeding electrode→workpiece→processing electrode

When etching and removing an unnecessary ruthenium (Ru) film formed on or adhering to the surface of a substrate W by the electrolytic processing apparatus of this embodiment, an electrolytic solution containing a halide, for example, is supplied between the processing electrode 484, feeding electrodes 486 and the ruthenium (Ru) film as the to-be-processed portion of the substrate W. The feeding electrodes 486 are connected to the anode of a power source and the processing electrode 484 is connected to the cathode so that the ruthenium (Ru) film on the surface of the substrate W becomes an anode and the processing electrode 484 becomes a cathode, and the electrolytic solution is supplied between the substrate W and the processing electrode 484, feeding electrodes 486 to etch and remove the to-be-processed portion facing the processing electrode 484.

With regard to the electrolytic solution, water or an organic solvent such as an alcohol, acetonitrile, dimethylformamide, dimethyl sulfoxide, etc. may be used as a solvent for a halide. An appropriate solvent may be selected depending on the intended usage of the ruthenium film to be processed, the cleaning step necessary after processing, the surface condition of the ruthenium film, etc. For a substrate for use in semiconductor manufacturing, it is preferred to use pure water, more preferably ultrapure water, in order to best avoid impurity contamination of the substrate.

An electrolytic solution of any halide may be employed insofar as etching processing of the ruthenium film can progress through an electrochemical interaction, and a compound generated during electrolytic reacts with ruthenium and the reaction product can be dissolved in the electrolytic solution or volatilized and removed. Specific examples of usable electrolytic solutions may include an aqueous solution of a hydrohalogenic acid such as HCl, HBr or HI, an aqueous solution of a halogen oxo acid such as $HClO_3$, $HBrO_3$, $HIO_3$, HClO, HBrO or HIO, an aqueous solution of a halogen oxo acid salt such as $NaClO_3$, $KClO_3$, NaClO or KClO, and an aqueous solution of a neutral salt such as NaCl or KCl. An appropriate electrolytic solution may be selected depending on the intended usage of the ruthenium film after processing and the influence of remaining material upon the usage, the thickness of the ruthenium film, the properties of a film underlying the ruthenium film, etc.

As with the above-described embodiment, in operation of the electrolytic processing apparatus, the substrate W is rotated via the substrate holder 442 in such a state that the substrate W is closed to or contact with the processing electrode 484 and the feeding electrodes 486, and the electrode section 444 is made the scroll movement, whereby the ruthenium film is etched away by electrochemical action. Further, a halide generated by electrolysis reacts with the ruthenium, whereby etching and removal of the ruthenium film progresses. The substrate surface after processing is cleaned by ultrapure water supplied from the ultrapure water supply nozzle (not shown).

The halide concentration of the halide-containing electrolytic solution is generally 1 mg/l to 10 g/l, preferably 100 mg/l to 1 g/l. The type of halide, the processing time, the processing area, the distance between the ruthenium film as an anode and the processing electrode as a cathode, the electrolytic voltage, etc. may appropriately be determined depending upon the surface condition of the substrate after electrolytic processing, the capacity for waste liquid treatment, etc. For example, the amount of chemical can be reduced by using an electrolytic solution with a dilute halide concentration and increasing the electrolysis voltage. The processing rate can be increased by increasing the halide concentration of the electrolytic solution.

Figure 28:
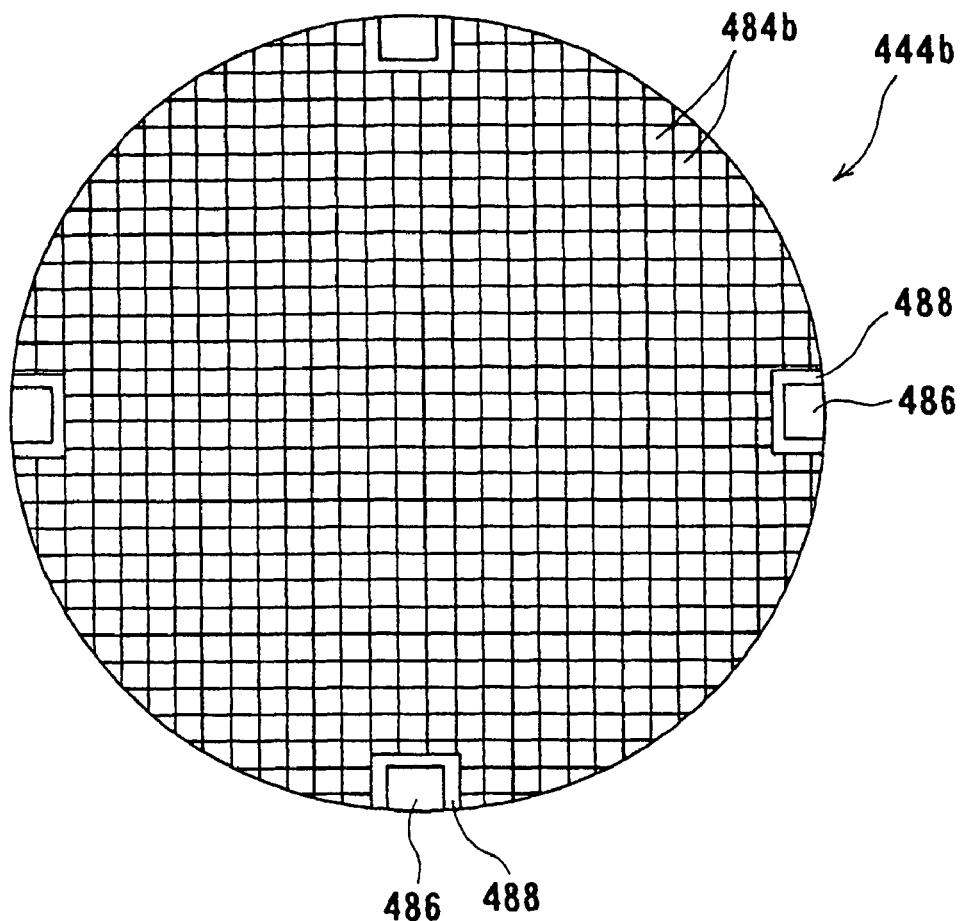
FIG. 28 is a plan view of an electrode section according to still another embodiment of the present invention.
Figure 29:
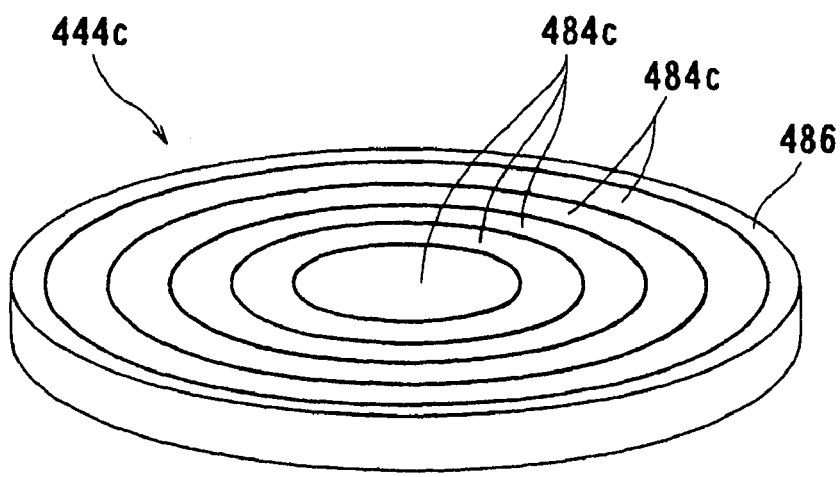
FIG. 29 is a perspective view of an electrode section according to still another embodiment of the present invention.

Though the preceding embodiments employ the electrode sections 444, 444a which include the processing electrode 484 composed of a single member, usable electrode sections are not limited to such an electrode section. For examples, it is possible to use an electrode section 444b as shown in FIG. 28, which includes processing electrodes 484b that is divided into a plurality of parts in a lattice form. It is also possible to use an electrode section 444c as shown in FIG. 29, which includes processing electrodes 484c that is divided into a plurality of ring-shaped parts. In these cases, the divided processing electrode parts may either be electrically integrated, or electrically separated by insulators. In the case where the processing electrode is electrically separated, it is not easy to equalize the processing rates at the respective divided parts. When the variation of processing rate between the divided parts is taken into consideration, it is preferred to use a processing electrode composed of a single member.

Figure 30:
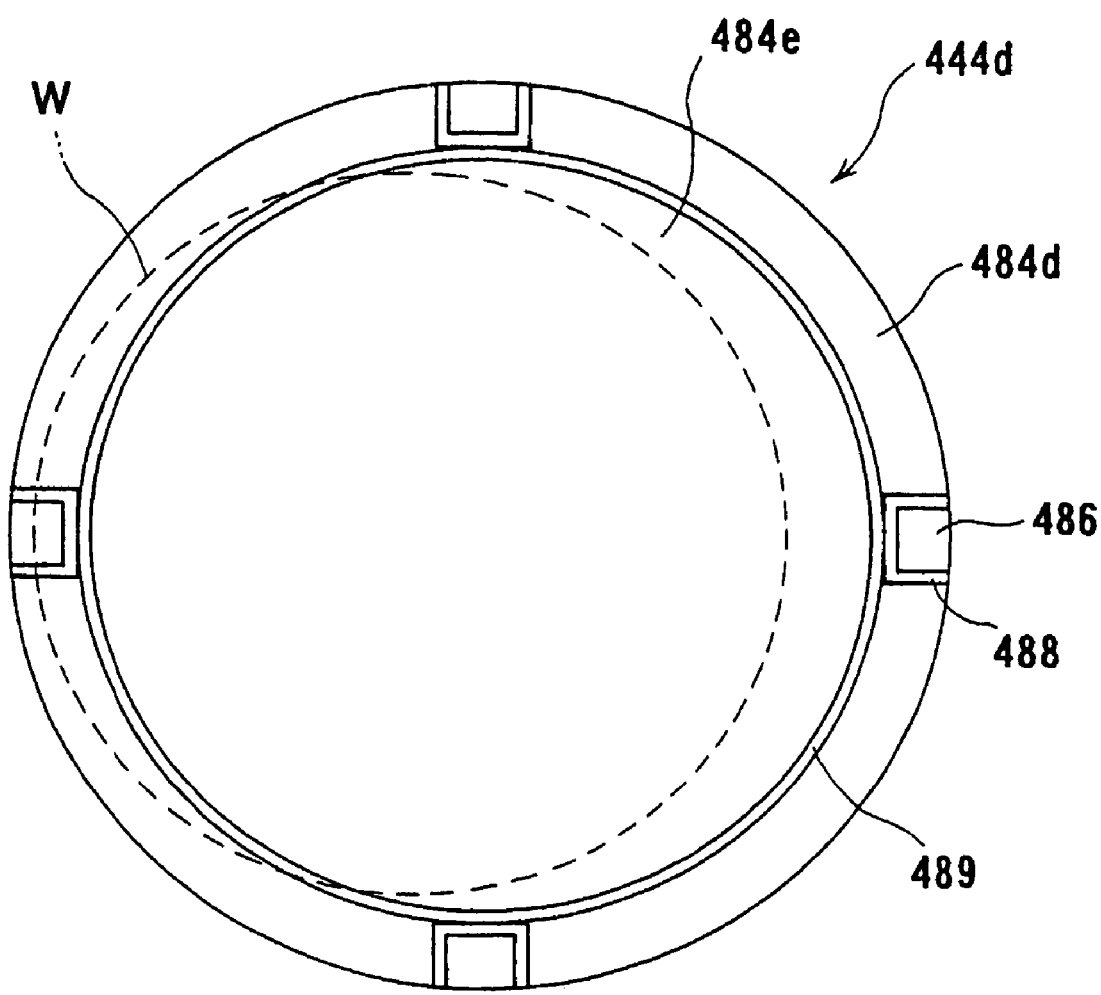
FIG. 30 is a plan view showing an electrode section according to still another embodiment of the present invention together with a substrate.

As described above, in the electrode sections 444, 444a having the processing electrode 484 composed of a single member, since the substrate W cannot be processed with the region where the feeding electrodes 486 are present, the processing rate is low with the peripheral portion in which the feeding electrodes 486 are disposed, compared to the other region. The processing rate of a peripheral portion of the substrate W can be controlled by adjusting a cut-off width w and a cut-off length L (see FIG. 26) in the peripheral portion of the processing electrode 484. Further, the use of an electrode section 444d as shown in FIG. 30, in which the processing electrode is divided by insulators 489 into an outer processing electrode 484d defined by the region where the feeding electrodes 486 have an influence on the processing rate, i.e. the peripheral portion in which the feeding electrodes 486 are disposed, and an inner processing electrode 484e defined by the region where the feeding electrodes have no influence on the processing rate, i.e. the region on the inner side of the outer processing electrode 484d, can realize a uniform processing rate over the entire surface of the processing electrode. Thus, in view of the influence of the presence of feeding electrodes 486, the voltage or electric current applied from the power source 446 to each processing electrode 484d, 484e may be adjusted so as to make the processing rate at the outer processing electrode 484d higher than the processing rate at the inner processing electrode 484e, thereby realizing a uniform processing rate over the entire surface of the processing electrode.

Though, in the above-described embodiment, the electrode section 444 is allowed to make a scroll movement while the substrate W is rotated, any other manner of relative movement may be employed insofar as it can move the processing electrode 484 and the substrate W relatively. For example, it is possible to rotate the electrode section 444 and the substrate W in the opposite directions. In this case, the center of rotation corresponds to the center of movement of the processing electrode. Further, though in the above-described embodiment the substrate W is attracted and held with its surface facing downward by the substrate holder 442, the substrate W may be held in other manner, e.g. with its surface facing upward.

As described hereinabove, electrolytic processing apparatus 434 according to this embodiment, a workpiece, such as a substrate, can be effected through electrochemical action, in the place of CMP treatment, for example, without causing any physical defects in the workpiece that would impair the properties of the workpiece. Accordingly, the present invention can omit a CMP treatment entirely or at least reduce a load upon CMP, and can effectively remove (clean) matter adhering to the surface of the workpiece such as a substrate. Furthermore, the electrolytic processing of a substrate can be effected even by solely using pure water or ultrapure water. This obviates the possibility that impurities such as an electrolyte will adhere to or remain on the surface of the substrate, can simplify a cleaning process after the removal processing, and can remarkably reduce a load upon waste liquid disposal.

FIG. 31 is a vertical sectional view schematically showing an electrolytic processing apparatus 534 according to a seventh embodiment of the present invention, and FIG. 32 is a plan view of the electrolytic processing apparatus 534 of FIG. 31. As shown in FIG. 31, the electrolytic processing apparatus 534 includes a pivot arm 540 that can pivot horizontally and move vertically, a substrate holder 542, supported at the free end of the pivot arm 540, for attracting and holding the substrate W with its front surface facing downward (face-down), a disk-shaped electrode section 544 positioned beneath the substrate holder 542, and a power source 546 connected to the electrode section 544. A film-like ion exchanger 547 is mounted on the upper surface of the electrode section 544.

The pivot arm 540, which pivots horizontally by the actuation of a motor 548 for pivoting, is connected to the upper end of a pivot shaft 550. The pivot shaft 550, which moves up and down integrated with the pivot arm 540 via a ball screw 552 by the actuation of a motor 554 for vertical movement, is engaged with the ball screw 552 that extends vertically.

The substrate holder 542 is connected to a rotating motor 556 as a first drive element that is allowed to move the substrate W held by a substrate holder 542 and the electrode section 544 relatively to each other. The substrate holder 542 is rotated by the actuation of the motor 556. The pivot arm 540 can swing horizontally and move vertically, as described above, the substrate holder 542 can pivot horizontally and move vertically integrated with the pivot arm 540. The electrode section 544 is directly connected to a hollow motor 560 as a second drive element that is allowed to move the substrate W and the electrode section 544 relatively to each other. The electrode section 544 is rotated by the actuation of the hollow motor 560.

A pure water nozzle 562 as a pure water supply section is disposed above the electrode section 544 and extends in the radial direction of the electrode section 544. The pure water nozzle 562 has a plurality of supply ports for supplying pure water or ultrapure water to the upper surface of the electrode section 544. Pure water herein refers to a water having an electric conductivity of not more than 10 μS/cm, and ultrapure water refers to a water having an electric conductivity of not more than 0.1 μS/cm. The use of pure water or ultrapure water containing no electrolyte upon electrolytic processing can prevent impurities such as an electrolyte from adhering to and remaining on the surface of the substrate W. Further, copper ions or the like dissolved during electrolytic processing are immediately caught by the ion exchanger 547 through the ion-exchange reaction. This can prevent the dissolved copper ions or the like from re-precipitating on the other portions of the substrate W, or from being oxidized to become fine particles which contaminate the surface of the substrate W.

Instead of pure water or ultrapure water, as described above, a liquid having an electric conductivity of not more than 500 μS/cm or any electrolytic solution, for example, an electrolytic solution obtained by adding an electrolyte to pure water or ultrapure water may be used.

Figure 34:
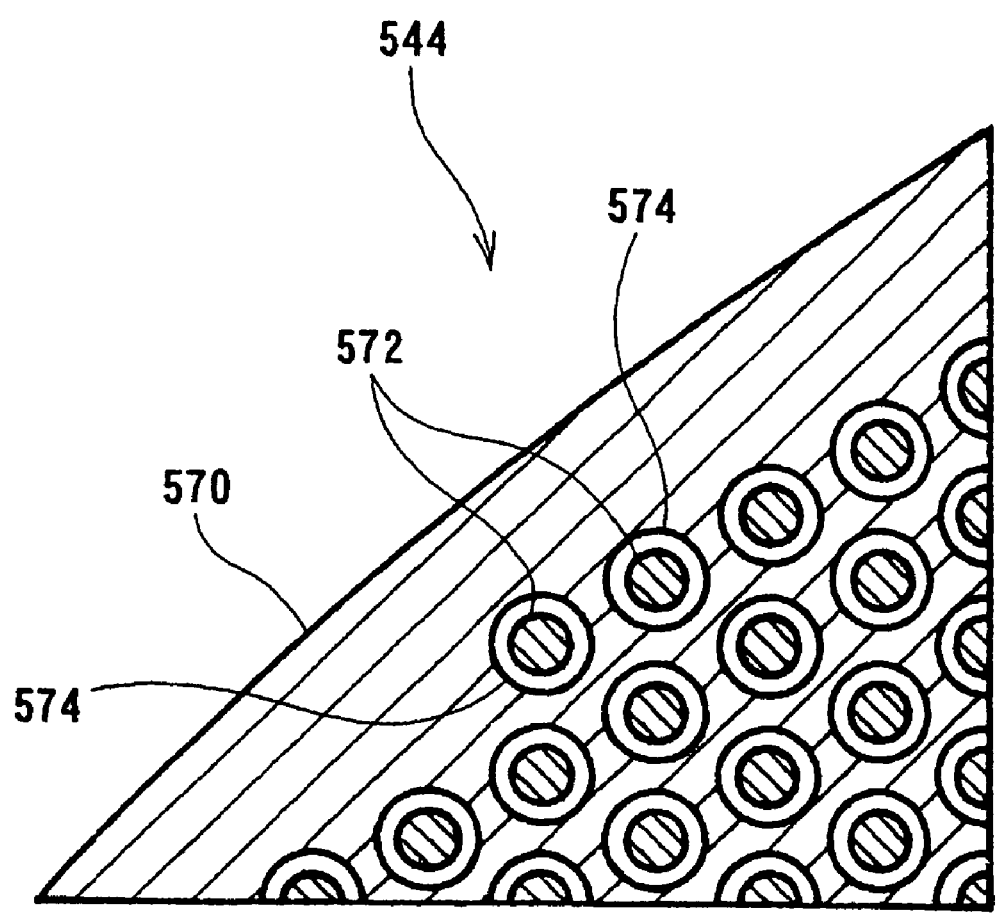
FIG. 34 is an enlarged view of a portion of the electrode section of FIG. 33.

FIG. 33 is a plan view showing the electrode section 544, and FIG. 34 is an enlarged view of a portion of the electrode section 544 of FIG. 33. As shown in FIGS. 33 and 34, the electrode section 544 includes a disk-shaped feeding electrode 570 and a large number of processing electrodes 572 disposed in almost the whole surface of the feeding electrode 570. Each processing electrode 572 is separated from the feeding electrode 570 by an insulator 574. The upper surfaces of the feeding electrode 570 and the processing electrodes 572 are covered integrally with the above-described ion exchanger 547. The processing electrodes 572 are of the same shape, and are disposed in almost the entire surface of the feeding electrode 570 such that when the substrate W and the electrode section 544 are moved relatively, the presence frequencies of processing electrodes 570 at every points in the to-be-processed surface of the substrate W become substantially equal.

According to this embodiment, the feeding electrode 570 is connected via a slip ring 564 (see FIG. 31) to the anode of the power source 546, and the processing electrodes 572 are connected via the slip ring 564 to the cathode of the power source 546. In processing of copper, for example, electrolytic processing action occurs on the cathode side. Accordingly, the electrode connected to the cathode becomes a processing electrode and the electrode connected to the anode becomes a feeding electrode.

According to the electrolytic processing apparatus 534 of this embodiment, a substrate W, having a copper film 6 (see FIG. 1B) as a conductive film (to-be-processed portion) formed in the surface, is placed on a pusher 566 (see FIG. 32) of the electrolytic processing apparatus 534.

The substrate W on the pusher 566 is attracted and held by the substrate holder 542, and the arm 540 is moved to move the substrate holder 542 holding the substrate W to a processing position right above the electrode section 544. Next, the vertical movement motor 554 is driven to lower the substrate holder 542 so as to bring the substrate W, held by the substrate holder 542, close to or into contact with the surface of the ion exchanger 547 of the electrode section 544. Thereafter, the hollow motor 560 is driven to rotate the electrode section 544 and the rotating motor 556 is driven to rotate the substrate holder 542 and the substrate W, thereby allowing the substrate W and the electrode section 544 to make a relative movement (eccentric rotational movement). While allowing the substrate W and the electrode section 544 to make the relative movement, pure water or ultrapure water is supplied from the supply ports of the pure water nozzle 562 to between the substrate W and the electrode section 544, and a given voltage is applied from the power source 546 to between the processing electrodes 572 and the feeding electrode 570, thereby carrying out electrolytic processing of the conductive film (copper film 6) in the surface of the substrate W at the processing electrodes (cathode) 572 through the action of the hydrogen ions and hydroxide ions generated with the aid of the ion exchanger 547.

When a large number of electrodes are provided as in the case of this embodiment, even with the use of the same shape of electrodes, there may be a slight difference in contact area or in height between the respective electrodes. Further, the thickness of an ion exchanger mounted on the electrodes may be slightly different and fixing of the ion exchanger may be uneven between the respective electrodes. Accordingly, the processing amount per unit time will practically differ between the respective electrodes. According to this embodiment, when the electrode section 544 and the substrate W are allowed to make a relative movement during electrolytic processing, a plurality of processing electrodes 572, which are uneven in the processing rate per unit time, can pass every point in the to-be-processed surface of the substrate W. The processing electrodes 572 and the workpiece W are allowed to make a relative movement so that the largest possible number of processing electrodes 572, which are uneven in the processing amount per unit time, can pass every point in the to-be-processed surface of the substrate W. Accordingly, even when the processing rate varies between the respective processing electrodes 572, the variation of processing rate can be equated, enabling equalization of the processing rate on a nm/min order over the entire surface of the substrate W.

It is desired that the processing electrodes 572, having equal height, be embedded in the feeding electrode 570 such that their surfaces (upper surfaces) are flush with the surface of the feeding electrode 570. This ensures an even distance between the surface of each electrode and a workpiece, preventing different distances between electrodes and a workpiece causing a variation of the resistances therebetween, leading to a variation of electric currents.

It is possible to group some of the processing electrodes 572, and control voltage or electric current for each group independently.

It is to be noted here that when a liquid like ultrapure water which itself has a large resistivity is used, the electric resistance can be lowered by bringing the ion exchanger 547 into contact with the substrate W, whereby the requisite voltage can also be lowered and hence the power consumption can be reduced. The "contact" does not imply "press" for giving a physical energy (stress) to a workpiece as in CMP. Accordingly, the electrolytic processing apparatus 534 of this embodiment employs the vertical-movement motor 554 for bringing the substrate W into contact with or close to the electrode section 544, and does not have such a press mechanism as usually employed in a CMP apparatus that presses a substrate against a polishing member. This holds also for the below-described embodiments. In this regard, according to a CMP apparatus, a substrate is pressed against a polishing surface generally at a pressure of about 20-50 kPa, whereas in the electrolytic processing apparatus 534 of this embodiment, the substrate W may be contacted with the ion exchanger 547 at a pressure of less than 20 kPa. Even at a pressure less than 10 kPa, a sufficient removal processing effect can be achieved.

Though in this embodiment the electrode section 544 and the substrate W are both rotated such that they make an eccentric rotational movement, any relative movement may be employed insofar as to it allows a plurality of processing electrodes to pass every point in the to-be-processed surface of a workpiece. Such a relative movement may include a rotational movement, a reciprocating movement, an eccentric rotational movement, a scroll movement, and any combination of these movements.

Figure 36:
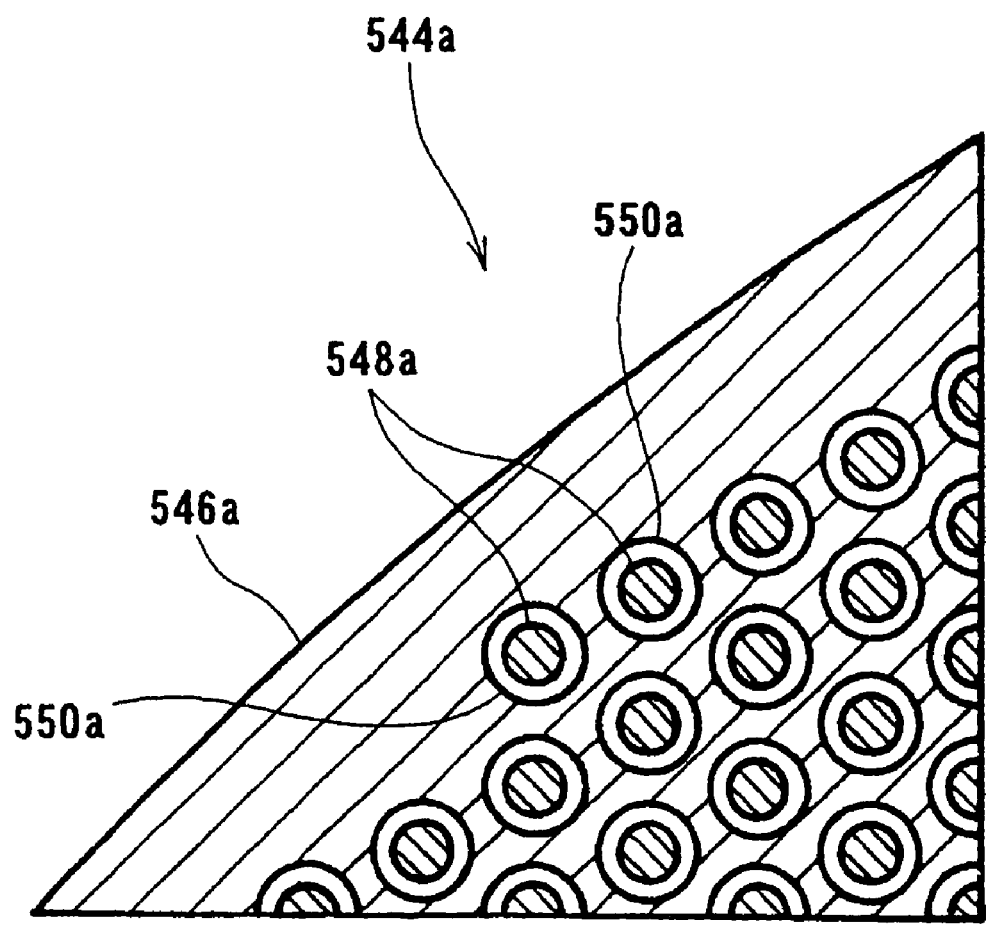
FIG. 36 is an enlarged view of a portion of the electrode section of FIG. 35.

Further, in the preceding embodiment, the processing electrodes and the feeding electrode may be replaced with each other. FIGS. 35 and 36 show an electrode section according to an eighth embodiment of the present invention, in which the processing electrodes and the feeding electrode of the electrode section of the seventh embodiment are replaced with each other. As shown in FIGS. 35 and 36, an electrode section 544a of this embodiment includes a disk-shaped processing electrode 546a and a large number of feeding electrodes 548a disposed in almost the whole surface of the processing electrode 546a. Each feeding electrode 548a is separated from the processing electrode 546a by an insulator 550a. The upper surfaces of the processing electrode 546a and the feeding electrodes 548a are covered integrally with the above-described ion exchanger 547 (see FIG. 31). The feeding electrodes 548a are of the same shape, and are disposed in almost the entire surface of the processing electrode 546a such that when the substrate W and the electrode section 544a are moved relatively, the presence frequencies of feeding electrodes 548a at every points in the to-be-processed surface of the substrate W become substantially equal.

This embodiment employs the single processing electrode 546a. Even with the single processing electrode, however, the processing amount per unit time may vary at some points. According to this embodiment, when the electrode section 544a and the substrate W are allowed to make a relative movement during electrolytic processing, a plurality of points in the processing electrode 546a, which are uneven in the processing rate per unit time, can pass every point in the to-be-processed surface of the substrate W. The electrode section 544a and the substrate W are allowed to make a relative movement so that the largest possible number of points in the processing electrode 546a which are uneven in the processing amount per unit time, can pass every point in the to-be-processed surface of the substrate W. Accordingly, even when the processing rate varies in the processing electrode 546a, the variation of processing rate can be equated, enabling equalization of the processing rate on a nm/min order over the entire surface of the substrate W.

As with the preceding embodiment, it is desired that the feeding electrodes 548a, having equal height, be embedded in the processing electrode 546a such that their surfaces (upper surfaces) are flush with the surface of the processing electrode 546a. Further, it is possible to group some of the feeding electrodes 548a, and control voltage or electric current for each group independently.

FIG. 37 is a plan view showing an electrode section 544b of an electrolytic processing apparatus according to a ninth embodiment of the present invention, and FIG. 38 is an enlarged view of a portion of the electrode section 544b of FIG. 37. As shown in FIGS. 37 and 38, the electrode section 544b includes a disk-shaped electrode plate 546b formed of an insulating material, such as a resin, and a large number of electrodes 548b, having the same shape, disposed in almost the whole surface of the electrode plate 546b. Each electrode 548b, with its periphery covered with an insulator 550b, is embedded in the electrode plate 546b. The upper surfaces of the electrodes 548b are covered integrally with the above-described ion exchanger 547 (see FIG. 31).

Of the electrodes 548b which are disposed in lines in a lattice form according to this embodiment, electrodes 548c positioned in every other longitudinal line are connected via the slip ring 564 (see FIG. 31) to the anode of the power source 546, and electrodes 548d positioned in the other lines are connected via the slip ring 564 to the cathode of the power source 546. The electrodes 548c connected to the anode of the power source 546 serve as feeding electrodes, and the electrodes 548d connected to the cathode of the power source 546 serve as processing electrodes. The feeding electrodes 548c and the processing electrodes 548 are thus disposed in almost the entire surface of the electrode section 544b such that when the electrode section 544b and a substrate W are moved relatively, the presence frequencies of feeding electrodes 548c and processing electrodes 548d at every points in the to-be-processed surface of the substrate W become substantial equal. As described hereinabove, depending upon the material to be processed, the electrodes connected to the cathode of the power source may serve as feeding electrodes, and the electrodes connected to anode may serve as processing electrodes.

As with the preceding embodiments, in light of the overall flatness of the electrode section, it is desired that the electrodes 548b, having equal height, be embedded in the electrode plate 546b such that their surfaces (upper surfaces) are flush with the surface of the electrode plate 546b. Depending upon the processibility of the electrode section 544b, however, the electrodes 548b may protrude of the order of several μm from the electrode plate 546b. Further, it is possible to group some of the feeding electrodes 548c and the processing electrodes 548d, and control voltage or electric current for each group independently.

According to this embodiment, the number of the feeding electrodes 548c is made substantially the same as the number of the processing electrodes 548d. Depending upon the processing conditions, however, the respective numbers of the feeding electrodes 548c and of the processing electrodes 548d may arbitrarily be changed. For example, the number of processing electrodes may be increased in order to increase the processing rate. Further according to this embodiment, the entire surface of the electrode plate 546b is covered with the ion exchanger so that electrolytic processing can be carried out with the use of ultrapure water. When using an electrolytic solution, however, it is possible to cover the entire surface of the electrode plate with a scrub member (liquid-permeable one such as a porous material).

As described hereinabove, the electrolytic processing apparatus 534 according to this embodiment, a workpiece, such as a substrate, can be effected through electrochemical action, in the place of CMP treatment, for example, without causing any physical defects in the workpiece that would impair the properties of the workpiece. Accordingly, the present invention can omit a CMP treatment entirely or at least reduce a load upon CMP, and can effectively remove (clean) matter adhering to the surface of the workpiece such as a substrate. Furthermore, the electrolytic processing of a substrate can be effected even by solely using pure water or ultrapure water. This obviates the possibility that impurities such as an electrolyte will adhere to or remain on the surface of the substrate, can simplify a cleaning process after the removal processing, and can remarkably reduce a load upon waste liquid disposal.

Figure 39:
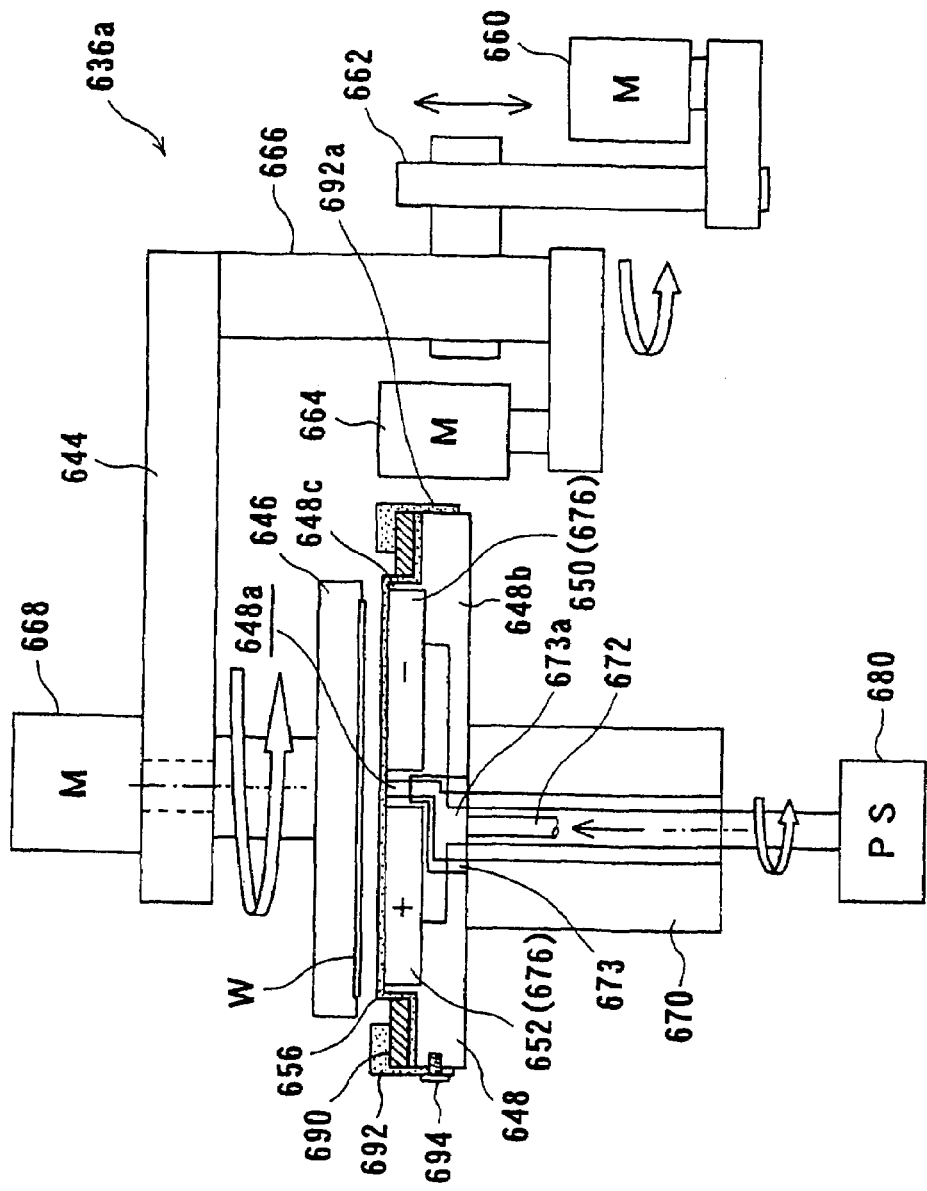
FIG. 39 is a cross-sectional view schematically showing an electrolytic processing apparatus according to a tenth embodiment of the present invention, which is provided with a fixing structure for ion exchanger.
Figure 40:
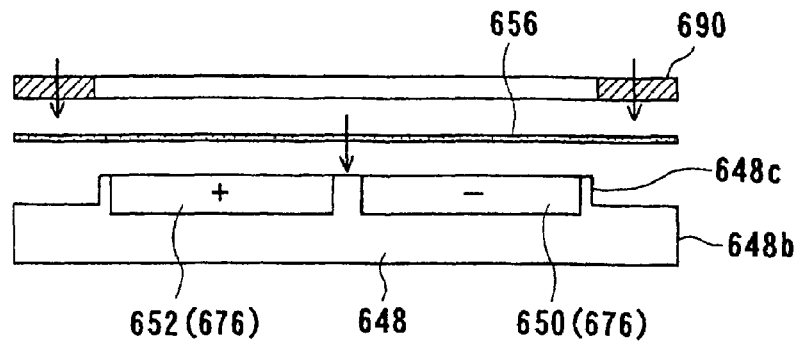
FIG. 40 is a cross-sectional view showing the state of the fixing structure before fixing an ion exchanger to the electrode support.

FIGS. 39 and 40 show a electrolytic processing apparatus 636a provided with a fixing structure for fixing an ion exchanger according to a tenth embodiment of the present invention. As shown in FIGS. 39 and 40, the electrolytic processing apparatus 636a includes a substrate holder 646, supported at the free end of a pivot arm 644 that can pivot horizontally, for attracting and holding the substrate W with its front surface facing downward (face down), and, positioned beneath the substrate holder 646, a disk-shaped electrode section 648 made of an insulating material. The electrode section 648 has, embedded therein, fan-shaped processing electrodes 650 and feeding electrodes 652 that are disposed alternately with their surfaces (upper faces) exposed. A film-like ion exchanger 656 is mounted on the upper surface of the electrode section 648 so as to cover the surfaces of the processing electrodes 650 and the feeding electrodes 652.

In this embodiment, as an example of the electrode section 648 having the processing electrodes 650 and the feeding electrodes 652, such one that has a slight larger diameter than that of the substrate W is employed so that the entire surface of the substrate W may undergo electrolytic processing at the same time by the relative movement (scroll movement) of the electrode section 648.

The pivot arm 644, which moves up and down via a ball screw 662 by the actuation of a motor 660 for vertical movement, is connected to the upper end of a shaft 666 that rotates by the actuation of a motor 664 for swinging. The substrate holder 646 is connected to a motor 668 for rotation that is mounted on the free end of the pivot arm 644, and is allowed to rotate by the actuation of the motor 668 for rotation.

The electrode section 648 is connected directly to a hollow motor 670, and is allowed to make the scroll movement (translational rotation movement) by the actuation of the hollow motor 670. A through-hole 648a as a pure water supply section for supplying pure water, preferably ultrapure water, is formed in the central portion of the electrode section 648. The through-hole 648a is connected to a pure water supply pipe 672 that vertically extends inside the hollow motor 670 via a through-hole 673a formed inside the crank shaft 673 connected directly to the drive shaft of the hollow motor 670 for scroll movement. Pure water or ultrapure water is supplied through the through-hole 648a, and via the ion exchanger 656, is supplied to the entire processing surface of the substrate W.

According to this embodiment, a plurality of fan-shaped electrode plates 676 are disposed in the upper surface of the electrode section 648 in the circumferential direction of the electrode section 648 so that the surfaces of the electrode plates 676 lie substantially on the same plane, and cathode and anode of a power source 680 are alternately connected to the electrode plates 676. The electrode plates 676 connected to the cathode of the power source 680 become the processing electrodes 650 and the electrode plates 676 connected to the anode become the feeding electrodes 652.

By thus disposing the processing electrodes 650 and the feeding electrodes 652 separately and alternately in the circumferential direction of the electrode section 648, fixed feeding portions to supply electricity to a conductive film (portion to be processed) of the substrate is not needed, and processing can be effected to the entire surface of the substrate. Further, be changing the positive and negative in a pulse manner or alternately, an electrolysis product can be dissolved and the flatness of the processed surface can be enhanced by the multiplex repetition of processing.

The ion exchanger 656 is fixed in the electrode section 648 tightly on the upper surfaces of the processing electrodes 650 and the feeding electrodes 652 which are embedded in the electrode section 648 formed of an insulating material. More specifically, the electrode section 648 includes a large-diameter base 648b and a small-diameter columnar electrode support 648c formed integrally to the upper portion of the base 648b. In fixing the ion exchanger 656, the ion exchanger 656 is allowed to cover the whole surface of the electrode support 648c and the electrode plates 676, while a peripheral portion of the ion exchanger 656 is positioned between the electrode support 648c and a fixing jig 690 which is engageable with the electrode support 648c and formed of an insulating material. The fixing jig 690 is pressed into engagement with the electrode support 648c to fix the fixing jig 690 to the electrode support 648c, thereby sandwiching the peripheral portion of the ion exchanger 656 between the inner circumferential surface of the fixing jig 690 and the outer circumferential surface of the electrode support 648c and thus fixing the ion exchanger 656 to the electrode support 648c, whereby the ion exchanger 656 is fixed tightly on the exposed surfaces of the processing electrodes 650 and the feeding electrodes 652 in an evenly stretched (tense) state.

Thus, as shown in FIG. 40, the ion exchanger 656 is evenly stretched outwardly due to frictional force between the fixing jig 690, the ion exchanger 656 and the electrode support 648c produced when pressing the fixing jig 690 into engagement with the columnar electrode support 648c, and the ion exchanger 656 is thus evenly stretched into a tense state, whereby the ion exchanger is automatically fixed tightly on the surface of the electrode support 648c.

The fixing jig 690 is pressed into contact with the base 648b. Further, the peripheral portion of the fixing jig 690 is pressed against the base 648b by a holding jig 692 having a hook shape in cross-section, and the skirt portion 692a of the holding jig 692 is fixed to the electrode section 648 by bolts 694, thereby preventing disengagement of the holding jig 690. The holding jig 692 may be fixed to the electrode section 648 by other fixing means, such as a pin or a crank.

Figure 41:
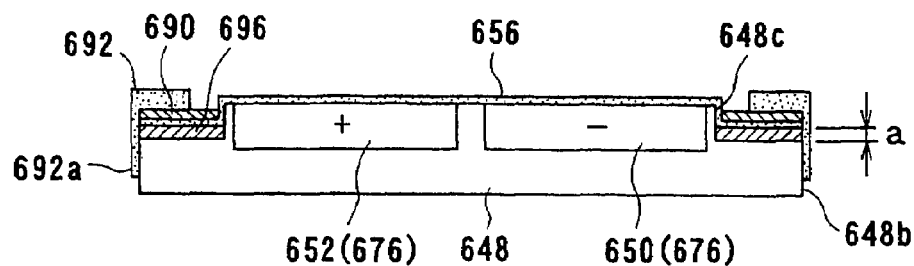
FIG. 41 is a cross-sectional view showing the main portion of a fixing structure for ion exchanger according to another embodiment.

The tension applied to the ion exchanger 656 can be adjusted by changing the height of protrusion of the electrode support 648c. Alternatively, as shown in FIG. 41, a ring-shaped spacer 696 may be interposed between the base 648b of the electrode section 648 and the fixing jig 690. The tension applied to the ion exchanger 656 may be adjusted by adjusting the thickness "a" of the spacer 696.

Figure 42A:
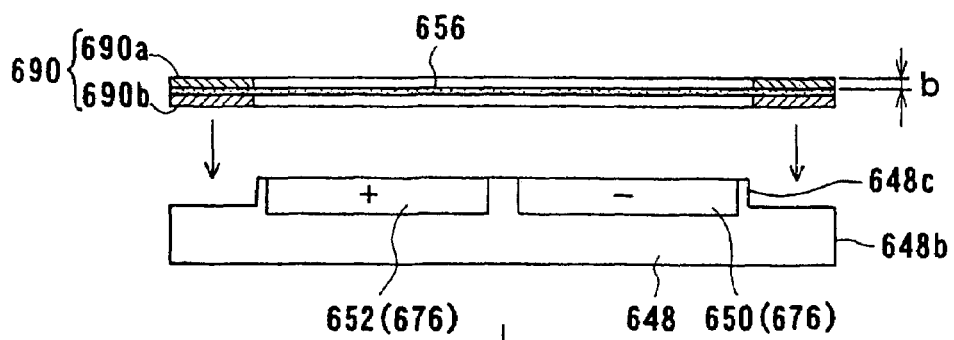
FIGS. 42A and 42B are cross-sectional views showing the main portion of a fixing structure for ion exchanger according to still another embodiment.
Figure 42B:
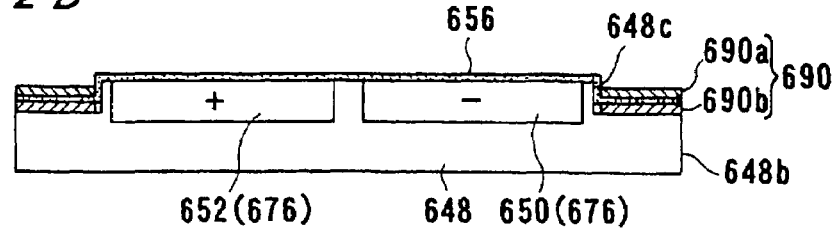

As shown in FIG. 42A, the fixing jig 690 may be composed of a pair of divided jigs 690a, 690b, and the pair of divided jigs 690a, 690b, with the ion exchanger 656 at its peripheral portion sandwiched in therebetween and provisionally fixed by means of a bolt, etc., may be pressed into engagement with the electrode support 648c of the electrode section 648, as shown in FIG. 42B. This can prevent slipping between the ion exchanger 656 and the fixing jig 690 upon the press-in of the fixing jig 690, enabling the ion exchanger 656 to be fixed always in a tense state. Further, the tension applied to the ion exchanger 656 can be adjusted by adjusting the thickness "b" of the upper divided jig 690a.

The operation of the electrolytic processing apparatus 636a in electrolytic processing (electrolytic polishing) is substantially the same as that of the above-described electrolytic processing apparatus 334 shown in FIG. 17, hence a description thereof is omitted.

Figure 44:
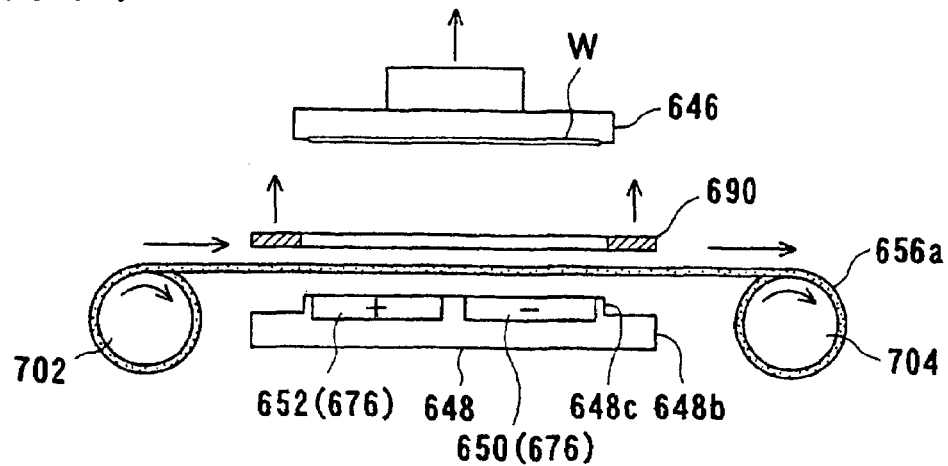
FIG. 44 is a cross-sectional view of the main portion of the ion exchanger-fixing device provided in the electrolytic processing apparatus of FIG. 43, showing the state of the device before fixing of an ion exchanger.

FIGS. 43 and 44 show an electrolytic processing apparatus 636b according to an eleventh embodiment of the present invention. According to the electrolytic processing apparatus 636b, a long ion exchanger 656a is stretched between a supply shaft 702 and a take-up shaft 704, provided at the both ends of a support 700, and the take-up shaft 704 is rotated by means of a take-up motor to take up the ion exchanger 656a sequentially. Further, electrolytic processing apparatus 636b is provided with an ion exchanger-fixing device 706 for fixing the ion exchanger 656a. The other construction is the same as the apparatus shown in FIGS. 39 and 40.

The ion exchanger-fixing device 706 includes an electrode section-elevating mechanism 708 for vertically moving the electrode section 648, and a fixing jig-elevating mechanism 710 for vertically moving the fixing jig 690 disposed above the electrode section 648. The ion exchanger 656a is allowed to travel between the electrode section 648 and the fixing jig 690. While the ion exchanger 656a is stopped, the electrode section 648 is raised and the fixing jig 690 is lowered so as to sandwich the ion exchanger 656a therebetween. The fixing jig 690 is then pressed into engagement with the electrode support 648c of the electrode section 648 to thereby fix the fixing jig 690, whereby the ion exchanger 656a is fixed to the electrode support 648c in an evenly stretched state.

According to this embodiment, the electrode section 648 is provided on the support 700 that is allowed to rotate by the actuation of the hollow motor 670. The electrode section 648 is thus allowed to make a rotational movement, not a scroll movement. Accordingly, the electrode plates 676 are connected alternately to the cathode and to the anode of the power source 680 via the slip ring 678.

According to this embodiment, when part of the ion exchanger 656a, which has been fixed by the ion exchanger-fixing device 706 and is in use for processing, is stained for example, the electrode section 648 is lowered while the fixing jig 690 is raised to release the fixing of the ion exchanger 656a and, after allowing the ion exchanger 656a to travel a necessary distance, the electrode section 648 is raised while the fixing jig 690 is lowered to fix the ion exchanger 656a. In such a manner, exchanges of the ion exchanger 656a can be carried out in a successive manner. Further, the ion exchanger 656a can be used in electrolytic processing while it is kept fixed tightly on the surface of the processing electrodes 650 and the feeding electrodes 652.

Figure 45:
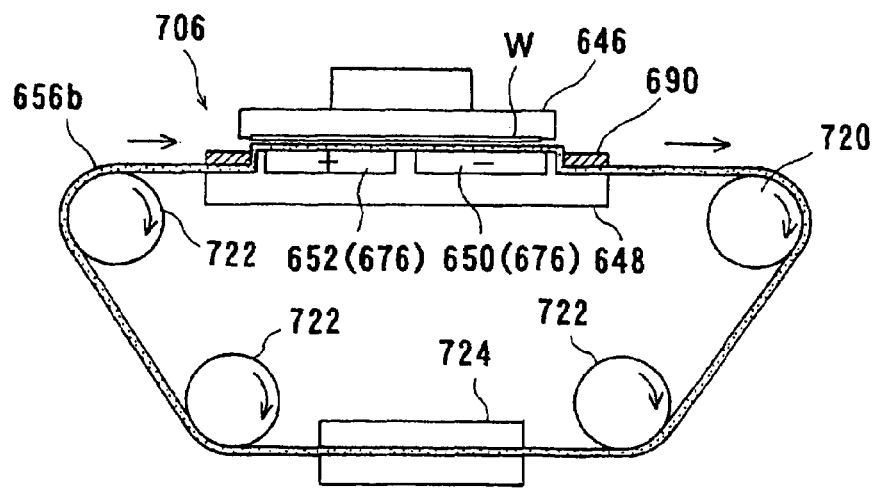
FIG. 45 is a cross-sectional view showing the main portion of an electrolytic processing apparatus according to a twelfth embodiment of the present invention.

FIG. 45 shows an electrolytic processing apparatus according to a twelfth embodiment of the present invention. According to this embodiment, one drive shaft 720 and three driven shafts 722 are disposed in a trapezoidal arrangement, and an endless form of ion exchanger 656b is stretched on the shafts 720, 722, so that it can travel in one direction and circulate. Part of the ion exchanger 656b traveling on the upper side is to be fixed by the ion exchanger-fixing device 706 and used in processing, and part of the ion exchanger 656b traveling on the lower side is to be regenerated in a regeneration section 724 provided in the traveling route.

This embodiment makes it possible to fix part of the endless ion exchanger 656b and use that part for processing while regenerating other part of the ion exchanger 656b, not in use for processing, in the regeneration section 724, and after allowing the ion exchanger 656b to travel in one direction, fix the regenerated part of ion exchanger 656b for use in processing. A repetition of this operation enables circulation and repeated uses of the endless ion exchanger 656b.

Regeneration of an ion exchanger is effected by exchange of an ion captured by the ion exchanger for hydrogen ion in the case of a cation exchanger, and for hydroxide ion in the case of an anion exchanger. When carrying out electrolytic processing of e.g. copper by using as an ion exchanger a cation exchanger having the cation-exchanger group, copper is captured by the cation-exchange group. Progress of the consumption of the cation-exchange group by copper makes it impossible to continue the electrolytic processing. When electrolytic processing of copper is carried out by using as an ion exchanger an anion exchanger having the anion-exchange group, on the other hand, fine particles of a copper oxide are produced and the particles adhere to the surface of the ion exchanger (anion exchanger). Such particles on the ion exchanger can contaminate the surface of a next substrate to be processed. Regeneration of such a consumed or stained ion exchanger can prevent the problems.

Figure 47:
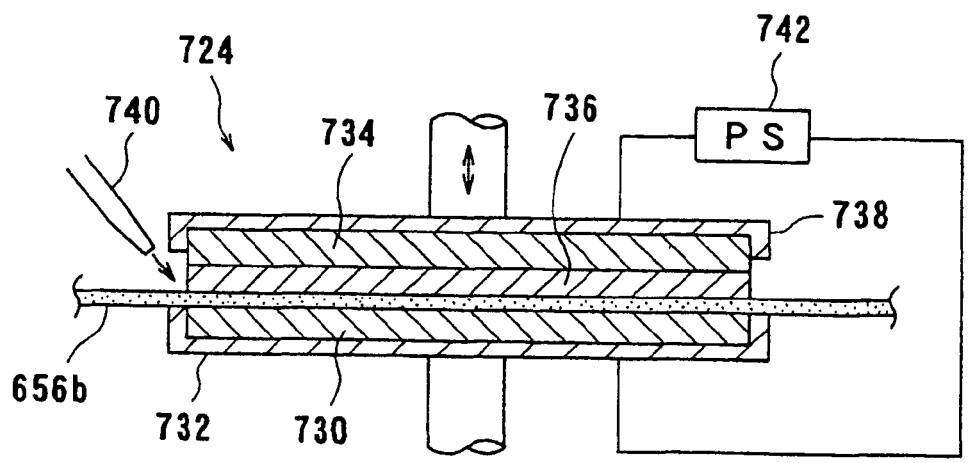
FIG. 47 is a cross-sectional view showing an example of a regeneration section.

FIG. 47 shows an example of the regeneration section 724. The regeneration section 724 comprises a fixed regeneration electrode portion 732 in which one electrode 730 for regeneration, of a pair, is embedded with its surface exposed, a movable regeneration electrode portion 738 which is vertically movable and holds the other electrode 734 for regeneration, of a pair, whose surface is covered with an ion exchanger 736 for regeneration, a liquid supply nozzle 740 for supplying a liquid for regeneration between the electrode portions 732, 738, and a regeneration power source 742 for applying a regeneration voltage between the pair of electrodes 730, 734 for regeneration.

The ion exchanger 736 for regeneration has the same type of the ion-exchange group as the ion exchanger 656b to be regenerated. That is, when a cation exchanger having a cation-exchange group is used as the ion exchanger 656b, a cation exchanger is used also as the ion exchanger 736 for regeneration. When an anion exchanger having an anion-exchange group is used as the ion exchanger 656b to be regenerated, an anion exchanger is used also as the ion exchanger 736 for regeneration.

In operation, the surface of the electrode 730 of the fixed regeneration electrode portion 732 is covered with the ion exchanger 656b to be regenerated. The movable regeneration electrode portion 738 is lowered so that the ion exchanger 736 for regeneration is brought close to or into contact with the surface (upper surface) of the ion exchanger 656b to be regenerated. Thereafter, a regeneration voltage is applied between the electrodes 730, 734 such that the electrode on the side of the ion exchanger 736 for regeneration, i.e. the electrode 734, has the opposite polarity to the polarity of the ion exchanger 656b to be regenerated. Thus, when a cation exchanger having a cation-exchange group is used as the ion exchanger 656b, the electrode 734 is made a cathode and the electrode 730 is made an anode. Conversely, when an anion exchanger is used as the ion exchanger 656b, the electrode 734 is made an anode and the electrode 730 is made a cathode. At the same time, pure water or ultrapure water is supplied from the liquid supply nozzle 740 to the space between the electrode portions 732, 738 so as to fill the space with pure water or ultrapure water, thereby immersing the ion exchanger 656b to be regenerated and the ion exchanger 736 for regeneration in pure water or ultrapure water.

By the above operation, through an ion-exchange reaction utilizing the ion exchanger 656b as a solid electrolyte, ions in the ion exchanger 656b to be regenerated are moved into the ion exchanger 736 for regeneration. Regeneration of the ion exchanger 656b is thus effected. When a cation exchanger is used as the ion exchanger 656b, cations taken in the ion exchanger 656b move into the ion exchanger 736 for regeneration; and when an anion exchanger is used as the ion exchanger 656b, anions taken in the ion exchanger 656b move into the ion exchanger 736 for regeneration, whereby the ion exchanger 656b is regenerated.

As described above, instead of pure water or ultrapure water, it is also possible to use a liquid having an electric conductivity of not more than 500 μS/cm or an electrolytic solution.

Figure 48:
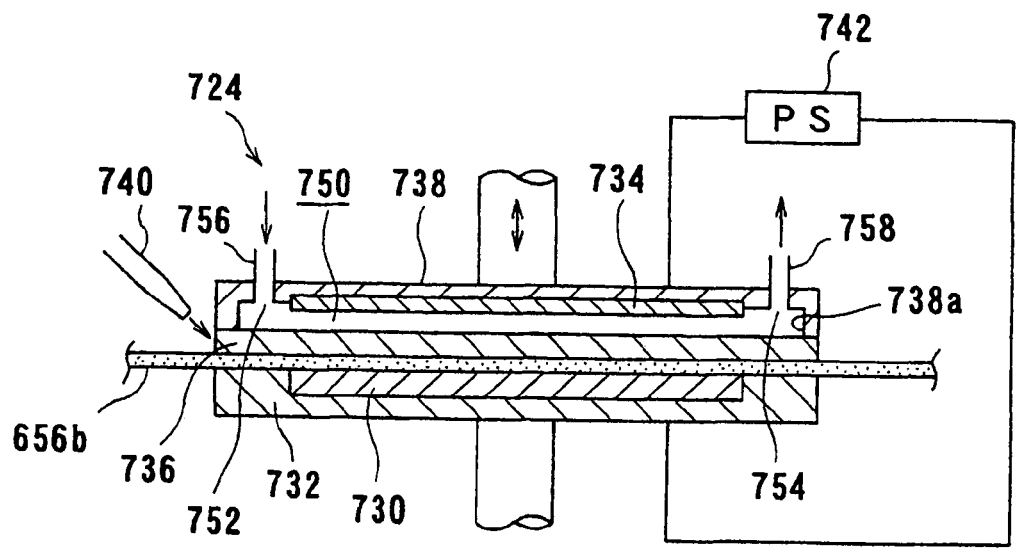
FIG. 48 is a cross-sectional view showing another example of a regeneration section.

FIG. 48 shows another example of the regeneration section 724. The movable regeneration electrode portion 738 of this example has a downwardly-open circular depression 738a. The lower opening of the depression 738a is closed with the ion exchanger 736 for regeneration, whereby a discharge portion 750, defined by the depression 738a and the ion exchanger 736 for regeneration, is formed. A disk-shaped electrode 734 is mounted in the bottom of the depression 738a. Further, a liquid inlet 752 and a liquid outlet 754, communicating with peripheral portions of the discharge portion 750, are provided at the both ends in the diametrical direction of the movable regeneration electrode portion 738. The liquid inlet 752 and the liquid outlet 754 are respectively connected to a liquid inlet pipe 756 and to a liquid outlet pipe 758. The other construction is substantially the same as the preceding example shown in FIG. 47.

According to this example, in regenerating the ion exchanger 656b, a liquid is supplied from the liquid inlet pipe 756 into the discharge portion 750 so as to create a flow of the liquid that flows in one direction in the discharge portion 750 and is discharged from the liquid outlet 758, and immerse the electrode 734 in the liquid. Ions in the ion exchanger 656b are moved toward the electrode 734, passed through the ion exchanger 736 for regeneration and introduced into the discharge portion 750. The ions, which have moved into the discharge portion 750, are discharged out of the system by the flow of the liquid supplied into the discharge portion 750. The ion exchanger 656b can thus be regenerated more efficiently.

It is desirable that the liquid to be supplied into the discharge portion 750 be a liquid that has a high electric conductivity and does not form a hardly soluble or insoluble compound by a reaction with ions removed from the ion exchanger. Examples of such a liquid may include an electrolytic solution, in particular, sulfuric acid with a concentration of 1 wt % or more, which may be employed in generating an ion exchanger that has been used in electrolytic processing of copper.

Figure 46:
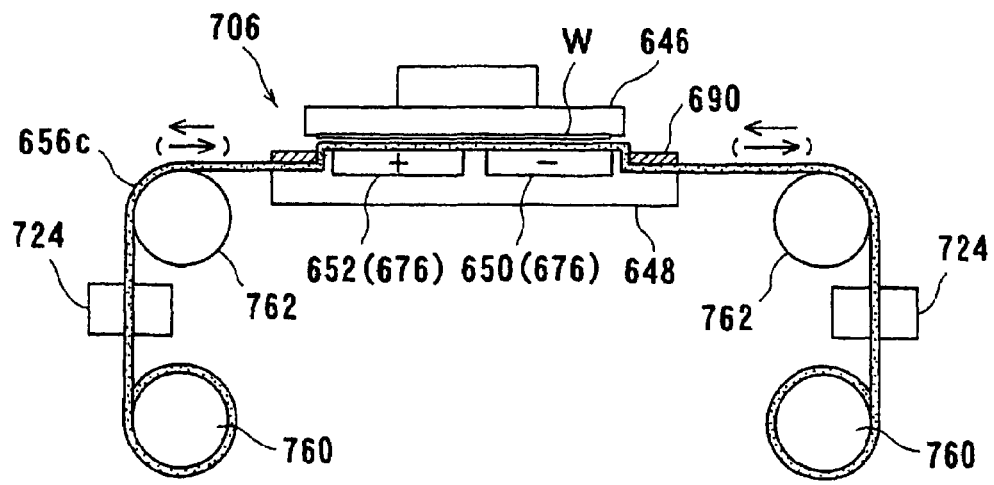
FIG. 46 is a cross-sectional view showing the main portion of an electrolytic processing apparatus according to a thirteenth embodiment of the present invention.

FIG. 46 shows the main portion of an electrolytic processing apparatus according to a thirteenth embodiment of the present invention. According to this embodiment, a pair of supply/take-up shafts 760 and a pair of intermediate shafts 762 are disposed in a gate-like arrangement on both sides of the ion exchanger-fixing device 706. An ion exchanger 656c can travel in two directions (opposite directions). Further, two regeneration sections 724 are disposed respectively between one supply/take-up shaft 760 and one intermediate shaft 762, and between the other supply/take-up shaft 760 and the other intermediate shaft 762. The other construction is the same as the embodiment shown in FIG. 45.

This embodiment makes it possible to fix part of the ion exchanger 656c by the ion exchanger-fixing device 706 and use that part for processing while regenerating other part of the ion exchanger 656c, not in use for processing, in one of the regeneration section 724, and exchange the part of ion exchanger 656c, which has been used in processing, for the regenerated part of ion exchanger 656c. Thus, referring to FIG. 46, when the ion exchanger 656c travels leftward, the portion of ion exchanger 656c regenerated in the right regeneration section 724, positioned downstream in the traveling direction, is used for processing; when the ion exchanger 656c travels rightward, the portion of ion exchanger 656c regenerated in the left regeneration section 724, positioned downstream in the traveling direction, is used for processing. A repetition of the above operation enables repeated uses of the ion exchanger 656c e.g. until its mechanical deterioration.

In the above-described embodiments, a ring-shaped fixing jig 690, which covers the whole circumferential surface of the electrode support 648c, is used so that a tension may be applied evenly over the entire surface of the ion exchanger (656a through 656c). However, it is also possible to dispose a pair of rod-like fixing jigs 690a back and forth of the ion exchanger (656a through 656c) in the traveling direction, and lower the fixing jigs 690a to fix the ion exchanger (656a through 656c). The point of the fixing jig is to be positioned outside of such region of the ion exchanger (656a through 656c) that is used for processing and it can hold the ion exchanger under tension. The shape of fixing jig also is not limited to a ring shape, and a variety of shapes may be used mainly depending upon and in conformity with the shape of the electrode.

As described hereinabove, according to the electrolytic processing apparatuses 636a, 636b of the above-described embodiments, by simply pressing the fixing jig into engagement with the electrode support of the electrode section, the ion exchanger can be evenly stretched outwardly into a tense state, and the ion exchanger can be automatically fixed tightly on the surface of the electrode. The present invention thus makes it possible to easily and quickly fix an ion exchanger tightly on the surface of an electrode.

Although certain preferred embodiments of the present invention have been shown and described in detail, it should be understood that various changes and modifications may be made therein without departing from the scope of the appended claims.

The present application is based on the U.S. Patent application filed on Jan. 7, 2003, which is a continuation-in-part of U.S. application Ser. No. 10/296,333 which was filed Nov. 22, 2002, the entire disclosure of which is hereby incorporated by reference.

INDUSTRIAL APPLICABILITY

This invention relates to an electrolytic processing apparatus and method useful for processing a conductive material formed in the surface of a substrate, especially a semiconductor wafer, or for removing impurities adhering to the surface of a substrate.

The invention claimed is:

1. An electrolytic processing apparatus, comprising:
a processing electrode to be located close to a workpiece;
a feeding electrode for feeding electricity to the workpiece;
an ion exchanger located between the workpiece and at least one of said processing electrode and said feeding electrode;
a fluid supply section for supplying a fluid to a location between the workpiece and at least one of said processing electrode and said feeding electrode, said ion exchanger being disposed at said location between the workpiece and said at least one of said processing electrode and said feeding electrode; and
a plurality of power sources, each of said power sources being operable to apply a voltage between said processing electrode and said feeding electrode;
wherein said at least one of said processing electrode and said feeding electrode is electrically divided into a plurality of divided electrode parts separated by a plurality of ring-shaped insulators, said fluid supply section comprising a plurality of through-holes in said divided electrode parts, each of said power sources being arranged to apply voltage to a respective one of said divided electrode parts and to independently control at least one of voltage and electric current for the respective one of said divided electrode parts.

2. The electrolytic processing apparatus of claim 1, wherein the fluid is one of ultrapure water, pure water, and a liquid having an electric conductivity of not more than 500 µS/cm.

3. The electrolytic processing apparatus of claim 1, wherein said plurality of power sources apply respectively different constant voltages at least one time to each of said divided electrode parts.

4. The electrolytic processing apparatus of claim 1, wherein each of said power sources applies one of an electric current or a voltage, which electric current or voltage changes over time, to the respective one of said divided electrode parts.

5. The electrolytic processing apparatus of claim 1, wherein said divided electrode parts and said ring-shaped insulators are arranged in alternating concentric rings.

6. The electrolytic processing apparatus of claim 1, wherein said processing electrode is electrically divided into said divided electrode parts, each of said plurality of power sources being electrically connected to a respective one of said divided electrode parts and to said feeding electrode so as to form a quantity of separate circuits equal to a quantity of said divided electrode parts.

7. The electrolytic processing apparatus of claim 1, wherein said feeding electrode is electrically divided into said divided electrode parts, each of said plurality of power sources being electrically connected to a respective one of said divided electrode parts and to said processing electrode so as to form a quantity of separate circuits equal to a quantity of said divided electrode parts.

8. An electrolytic processing method, comprising:
providing a processing electrode and a feeding electrode, at least one of the processing electrode and the feeding electrode being electrically divided into a plurality of divided electrode parts separated by a plurality of ring-shaped insulators, the divided electrode parts having a plurality of through-holes formed therein;
locating a workpiece close to the processing electrode;
feeding electricity from the feeding electrode to the workpiece;
arranging an ion exchanger between the workpiece and at least one of the processing electrode and the feeding electrode;
supplying a fluid to a location between the workpiece and the at least one of the processing electrode and the feeding electrode through the through-holes of the divided electrode parts; and
applying a voltage to each of the divided electrode parts from a respective one of a plurality of power sources while independently controlling at least one of voltage and electric current for the respective divided electrode parts.

9. The electrolytic processing method of claim 8, wherein said supplying the fluid comprises supplying one of ultrapure water, pure water, and a liquid having an electric conductivity of not more than 500 µS/cm.

10. The electrolytic processing method of claim 8, wherein said independently controlling at least one of the voltage and the electric current comprises applying respectively different constant voltages at least one time to each of the divided electrode portions.

11. The electrolytic processing method of claim 8, wherein said applying the voltage to each of the divided electrode parts comprises applying a voltage which changes over time to the respective one of the divided electrode parts.

12. The electrolytic processing apparatus of claim 1, wherein each of said divided electrode parts has at least one of said through-holes therein.

13. The electrolytic processing method of claim 8, wherein each of the divided electrode parts has at least one of the through-holes therein.

* * * * *